United States Patent [19]
Furutani et al.

[11] Patent Number: 5,793,686
[45] Date of Patent: Aug. 11, 1998

[54] SEMICONDUCTOR MEMORY DEVICE HAVING DATA INPUT/OUTPUT CIRCUIT OF SMALL OCCUPIED AREA CAPABLE OF HIGH-SPEED DATA INPUT/OUTPUT

[75] Inventors: Kiyohiro Furutani; Tsukasa Ooishi; Mikio Asakura; Hideto Hidaka; Kei Hamade; Yoshito Nakaoka, all of Hyogo, Japan

[73] Assignee: Mitsubishi Denki Kabushiki Kaisha, Tokyo, Japan

[21] Appl. No.: 755,930

[22] Filed: Nov. 25, 1996

[30] Foreign Application Priority Data

Nov. 28, 1995 [JP] Japan .................... 7-308866

[51] Int. Cl.$^6$ .................................. G11C 7/00
[52] U.S. Cl. .................. 365/201; 365/230.03
[58] Field of Search ..................... 365/201, 205, 365/207, 208, 230.03

[56] References Cited

U.S. PATENT DOCUMENTS

| | | | |
|---|---|---|---|
| 5,299,163 | 3/1994 | Moritgami | 365/201 |
| 5,305,267 | 4/1994 | Haraguchi | 365/201 |
| 5,355,342 | 10/1994 | Ueoka | 365/201 |
| 5,400,281 | 3/1995 | Morigami | 365/201 |
| 5,444,661 | 8/1995 | Matsui | 365/201 |
| 5,615,166 | 3/1997 | Machida | 365/201 |

OTHER PUBLICATIONS

Mori et al. "*A 45ns 64Mb DRAM with a Merged Match–line Test Architecture*" 1991 IEEE International Solid–State Circuits Conference, pp. 110–111.

*Primary Examiner*—David C. Nelms
*Assistant Examiner*—Son Mai
*Attorney, Agent, or Firm*—McDermott, Will & Emery

[57] ABSTRACT

Read drivers which are provided in correspondence to simultaneously selected plural bits of memory cells are wired-OR connected to internal read data buses which in turn are provided in correspondence to a plurality of memory cell arrays respectively. A test mode circuit is provided for the internal read data buses for detecting coincidence/incoincidence of logics of signal potentials on these internal read data bus lines. In a test operation, all read drivers are activated to read selected memory cell data on the corresponding internal read data bus lines.

11 Claims, 25 Drawing Sheets

CHANGE DETECTION  ALL CHANGE COMPLETION

FIG. 29A
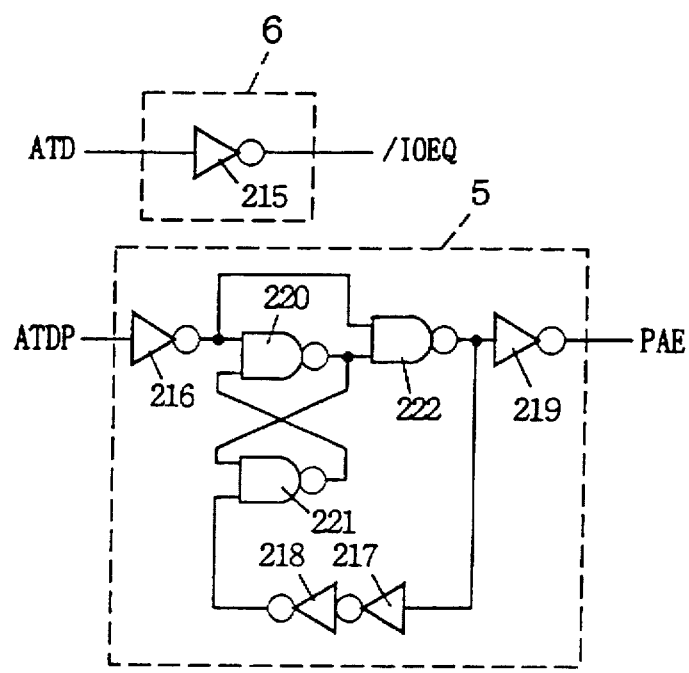
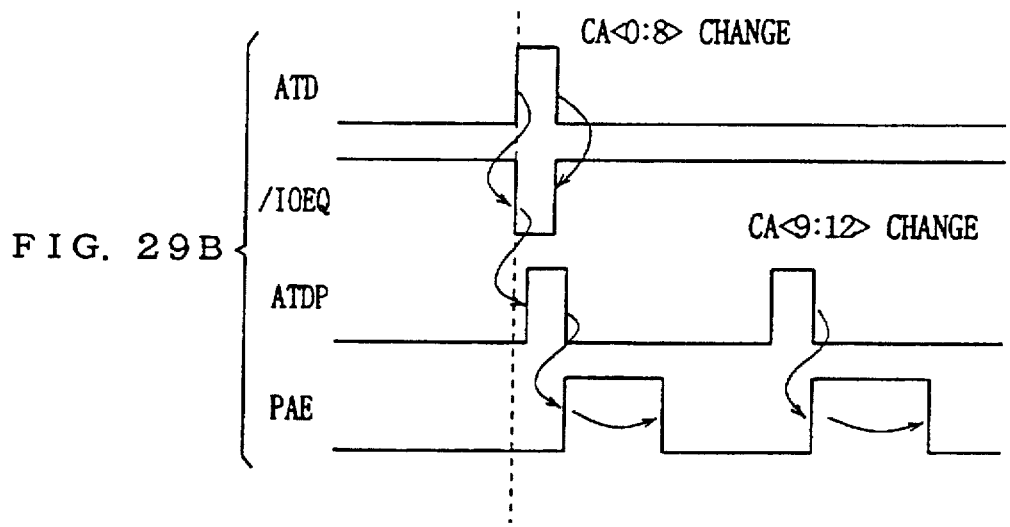
FIG. 29B

SEMICONDUCTOR MEMORY DEVICE HAVING DATA INPUT/OUTPUT CIRCUIT OF SMALL OCCUPIED AREA CAPABLE OF HIGH-SPEED DATA INPUT/OUTPUT

BACKGROUND OF THE INVENTION

1. Field of the Invention

The present invention relates to a semiconductor memory device, and more particularly, it relates to the structure of a signal and data input/output part of a dynamic semiconductor memory device.

2. Description of the Background Art

FIG. 30 schematically illustrates the overall structure of a conventional dynamic semiconductor memory device. Referring to FIG. 30, the semiconductor memory device is formed on a semiconductor chip 1 and includes four memory cell arrays 2a to 2d, each having a plurality of memory cells arranged in a matrix form. A row selection circuit (a row predecoder, a row decoder and a word line driver) and a column selection circuit (a column predecoder, a column decoder and an I/O gate) are provided in order to select memory cells in accordance with address signals, while these circuits are not shown for simplifying the figure. Each of the memory cell arrays 2a to 2d are divided into four column groups, and global I/O line pairs GIOP are arranged in correspondence to the respective column groups. In each of the memory cell arrays 2a to 2d, a 1-bit memory cell is selected in each column group, to be coupled with the global I/O line pair GIOP for the selected memory cell.

The semiconductor memory device further includes preamplifiers/write buffers 7 which are provided in correspondence to the global I/O line pairs GIOP respectively for inputting/outputting data in/from the corresponding global I/O line pairs GIOP, read drivers 8 which are provided in correspondence to the preamplifiers/write buffers 7 for amplifying internal read data received from the corresponding preamplifiers for transmission to corresponding read data buses RDAP (RDAPa to RDAPd), first test mode circuits 9 which are provided in correspondence to the memory cell arrays 2a to 2d respectively for discriminating coincidence/incoincidence of logics of data read from the preamplifiers of the corresponding memory cell arrays in a test operation mode, a second test mode circuit 10 which receives signals indicating the discrimination results from the first test mode circuits 9 provided for the memory cell arrays 2a to 2d respectively for discriminating coincidence/incoincidence of the logics of the received discrimination result signals, and a driver 11 which receives signals on the read data buses RDAPa to RDAPd and a signal from the test mode circuit 10 for selectively transmitting the received signals to an output buffer 13 through output bus RDP.

The preamplifiers/write buffers 7 select a column group in each of the memory cell arrays 2a to 2d, so that memory cell data of the selected column groups are transmitted onto the corresponding read data buses RDAPa to RDAPd through the read drivers 8. In the test operation mode, all of the four column groups are selected in each of the memory cell arrays 2a to 2d, so that output signals of the four preamplifiers 7 are transmitted to the corresponding first test mode circuit 9.

In a normal operation mode, the driver 11 selects read data from a selected memory cell array from those read on the read data buses RDAPa to RDAPd, and supplies the same to the output buffer 13. In the test operation mode, on the other hand, the driver 11 selects a signal indicating the test result from the test mode circuit 10 and transmits the same onto the output buffer 13. Write buffers of the preamplifiers/write buffers 7 are coupled to an input buffer 12 through an input data bus WD. The write buffer corresponding to a selected one of the memory cell arrays 2a to 2d is activated, so that data is written in a selected memory cells included in a selected column group through the write buffers in the selected memory cell array.

The semiconductor memory device further includes an address buffer 3 which receives an externally supplied address signal and generates an internal address signal, an ATD generation circuit 4 which detects a transition of the internal address signal (internal column address signal) received from the address buffer 3 and generates an address transition detection signal ATD, a PAE generation circuit 5 which generates a preamplifier enable signal PAE for activating preamplifiers included in the preamplifiers/write buffers 7 in response to the address transition detection signal ATD from the ATD generation circuit 4, and an IOEQ generation circuit 6 which generates an equalization instruction signal IOEQ for equalizing the global I/O line pairs GIOP in response to the address transition detection signal ATD from the ATD generation circuit 4. The global I/O line pairs GIOP, which are formed by complementary signal line pairs, transmit complementary data signals. Potentials of the global I/O lines of the global I/O line pairs GIOP are equalized to each other by the equalization signal IOEQ.

The semiconductor memory device further includes an internal voltage down converter (VDC) 29 which receives an externally supplied source potential Vcc and generates a peripheral circuit source potential Vccp and a memory cell array source potential Vccs which are lower than the external source potential Vcc. The peripheral circuit source potential Vccp is supplied to peripheral circuits such as the preamplifiers/write buffers 7 and the read drivers 8 as a first operation source potential. The memory cell array source potential Vccs is applied to circuits for driving the memory cell arrays 2a to 2d (sense amplifiers charging/discharging bit lines) and substrate regions of p-channel MOS transistors in the arrays, as described later in detail. The peripheral circuit source potential Vccp is supplied to bit line equalization circuits for equalizing bit lines and circuit parts generating cell plate potentials which are applied to cell plates of the memory cells (first source nodes of memory capacitors).

The input buffer 12 and the output buffer 13 are illustrated as inputting/outputting data from/to the exterior of the device through a common data input/output terminal DQ. This semiconductor device inputs/outputs 1-bit data. A multibit test operation which is related to the present invention is now described.

When the storage capacity of a semiconductor memory device is increased, the number of memory cells is also increased correspondingly. When defects/non defects of memory cells are decided in units of bits, the test time is extremely increased. Therefore, the test time is reduced by simultaneously deciding defects/non-defects of a plurality of memory cells. A mode of making a test in units of a plurality of memory cells is called a multibit test mode.

A test data write operation of the multibit test mode is described. A row of memory cells is selected in each of the memory cell arrays 2a to 2d. Then, 4-bit memory cells are selected in each of the memory cell arrays 2a to 2d. Test data to be written in the selected memory cells are transmitted from the input buffer 12 to the write buffers included in the preamplifiers/write buffers 7. In the multibit test mode, all write buffers are brought into operating states. Thus, the same test data are written in the 4-bit memory cells selected in each of the memory cell arrays 2a to 2d, so that the same test data are written in 16-bit memory cells in total.

A data read operation in the multibit test mode is now described. Similarly to the test data writing, 4-bit memory cells are simultaneously selected in each of the memory cells 2a to 2d. All preamplifiers included in the preamplifiers/write buffers 7 are brought into operating states. Data of the 4-bit memory cells selected in each of the memory cell arrays 2a to 2d are amplified by the preamplifiers, and transmitted to the corresponding first test mode circuits 9. The first test mode circuits 9 each discriminate coincidence/incoincidence of the logics of the supplied 4-bit memory cell data, and transmit signals indicating the results of the discrimination to the second test mode circuit 10. The second test mode circuit 10 discriminates whether or not coincidence of the logics is detected in every one of the four first test mode circuits 9, in accordance with the discrimination result indication signals received from the four first test mode circuits 9. A discrimination result indication signal of the test mode circuit 10 is supplied through the driver 11 to the output buffer 13, which in turn transmits the signal indicating the discrimination result to the data input/output terminal DQ. The second test mode circuit 10 discriminates whether or not the logics of the 4-bit memory cells selected in each of the memory cell arrays 2a to 2d, i.e., the data of 16-bit memory cells in total, coincide with each other. A determination is made as to whether or not the simultaneously selected 16-bit memory cells include a defective memory cell by observing the logic of the output signal from the second test mode circuit 10.

16-bit memory cells can be tested at the same time, whereby the test time can be remarkably reduced.

In the structure of the conventional semiconductor memory device, the first test mode circuits are provided in correspondence to the plurality of memory cell arrays respectively, while the output signals of the plurality of first test mode circuits are transmitted to the second test mode circuit so that defects/non-defects of the simultaneously selected memory cells is finally discriminated therein. In order to transmit signals from the first test mode circuits to the second test mode circuit, signal lines which are provided in paths independent of read data buses are employed. Therefore, an area occupied by interconnections for the test is disadvantageously increased.

FIG. 31 schematically illustrates the structure of a data write part. This figure typically shows a pair of bit lines BL and /BL and a sense amplifier which is formed by p-channel MOS transistors (insulated gate field-effect transistors) provided in correspondence thereto. The sense amplifier includes a p-channel MOS transistor PQa having a first conduction terminal (drain) connected to the bit line BL and a gate connected to the bit line /BL, a p-channel MOS transistor PQb having a first conduction terminal (drain) connected to the bit line /BL and a gate connected to the bit line BL, and a p-channel MOS transistor PQc which conducts in response to a sense amplifier activation signal φSP and transmits the array source potential Vccs to second conduction terminals (sources) of the MOS transistors PQa and PQb. The bit lines BL and /BL are connected with memory cells, which are omitted for simplifying the figure. With respect to the bit lines BL and /BL, selection gates TGa and TGb are provided which conduct in response to a column selection signal Y for electrically connecting the bit lines BL and /BL to internal data lines IO and /IO respectively. The internal data lines IO and /IO are connected to a write buffer WB.

The write buffer WB, which is included in the preamplifier/write buffer, operates with the peripheral circuit source potential Vccp serving as a first operation source potential. The source potential Vccs and the peripheral circuit source potential Vccp which are supplied to the memory cell array part are generated by the internal voltage down converter 29 shown in FIG. 30. These source potentials are so separately generated that the source potential Vccp for the write buffer or the peripheral circuit remains unchanged and can stably drive the peripheral circuit even if a sense operation for memory cell data is performed in the array and the source potential Vccs fluctuates. When the peripheral circuit source potential Vccp fluctuates upon operation of the peripheral circuit, on the other hand, this fluctuation exerts no influence on the array source potential Vccs, and hence the array part is prevented from a malfunction.

The column selection signal Y, which is outputted from a column decoder included in the peripheral circuit, is at the peripheral circuit source potential Vccp level. In data writing, the column selection signal Y goes high, the column selection gates TGa and TGb conduct, and the bit lines BL and /BL are electrically coupled to the write buffer WB. The write buffer WB generates complementary write data from internal write data WD and transmits the same onto the internal data lines IO and /IO. Thus, the write data are transmitted to the bit lines BL and /BL. A number of memory cells are arranged in the memory cell array part, and the number of sense amplifiers is also increased in response (the sense amplifiers are arranged in correspondence to the respective columns (bit line pairs)). Therefore, current consumption is increased by charging/discharging of the bit lines in sense amplifier operations. Lowering of the array source potential Vccs is considered in order to reduce this current consumption.

FIG. 32 schematically illustrates the sectional structure of the p-channel MOS transistor PQa or PQb shown in FIG. 31. The MOS transistor PQa (or PQb) is formed by high concentration p-type impurity regions IDRa and IDRb which are formed separatedly from each other on a surface of a well region WEL provided by a low concentration n-type impurity region, and a gate electrode layer GEL which is formed on the surface of the well region WEL between the impurity regions IDRa and IDRb with a gate insulating film (not shown) interposed therebetween. The well region WEL is formed on a p-type semiconductor substrate SUB. The well region WEL receives the array source potential Vccs through a high concentration n-type impurity region IDRc. The semiconductor substrate SUB receives a substrate bias potential VBB (negative potential).

Consider that a signal of the source potential Vccp level is supplied from the write buffer WB to the impurity region IDRa. This well structure contains a vertical pnp parasitic bipolar transistor having an emitter, a base region and a collector which are defined by the impurity region IDRa, the well region WEL and the semiconductor substrate SUB respectively. When the source potential Vccp is lower than the array source potential Vccs, no current flows from the impurity region IDRa to the well region WEL since the base and the emitter of the parasitic bipolar transistor are reverse-biased, and this p-channel MOS transistor stably operates.

When the array source potential Vccs is reduced below the peripheral circuit source potential Vccp in order to reduce power consumption in the array part, however, the base and the emitter of the parasitic bipolar transistor are forward-biased and this parasitic bipolar transistor is brought into an ON state so that a current flows from the impurity region IDRa to the well region WEL and then from the well region WEL to the semiconductor substrate SUB, thereby disadvantageously increasing the substrate potential VBB of the semiconductor substrate SUB. Such increase of the substrate potential VBB leads to fluctuation of the threshold voltage of an n-channel MOS transistor formed in a portion which is not shown in the figure and formation of a parasitic MOS transistor which is formed under the signal lines, resulting in an instable internal operation. Therefore, the peripheral circuit source potential Vccp cannot be reduced below the array source potential Vccs. In this peripheral circuit part, the signal amplitude is reduced and data can be transferred at a high speed when the source potential Vccp is reduced, while the operating speed is slowed down upon reduction of the source potential (the operating speed of a MOS transistor is proportionate to the gate potential). The peripheral circuit source potential Vccp may conceivably be further reduced following reduction of the array source potential Vccs. When the peripheral circuit source potential Vccp is reduced following reduction of the array source potential Vccs for high-speed operability, however, the operating speed is disadvantageously reduced since the peripheral circuit source potential is supplied not only to the write buffer but to other preamplifiers and buffer circuit parts, in particular.

Alternatively, the bias potential of the substrate region (well region) of the p-channel MOS transistor in the memory cell array may be formed by the peripheral circuit source potential Vccp. When source lines transmitting different source potentials are arranged in the memory cell array, however, the area for laying out the source lines is increased and it is extremely difficult to arrange source lines transmitting different source potentials in an array part having a limited area.

When the array source potential and the peripheral circuit source potential are generated independently of each other as in the conventional semiconductor memory device, therefore, it is difficult to implement low current consumption by reducing the array source potential Vccp without reducing the access speed.

FIG. 33 schematically illustrates the structure of the output buffer.

Referring to FIG. 33, the output buffer 13 includes an n-channel MOS transistor OQ1 which is connected between an external source potential Vcc supply node and an output node NDQ, an n-channel MOS transistor OQ2 which is connected between the output node NDQ and another power supply node (ground node), a drive circuit ODa which receives internal read data /RO, generates a drive signal and supplies the same to the gate of the MOS transistor OQ1, and a drive circuit ODb which receives read data RO, generates a drive signal and supplies the same to the gate of the MOS transistor OQ2. The read data/RO and RO have the amplitude of the peripheral circuit source potential Vccp. The drive circuit ODa converts a low-level potential (the internal source potential Vccp) of the read data /RO to a potential Vcd. This drive circuit ODa is formed by a boosting circuit employing a charge pump capacitor or a level conversion circuit. A drive signal Vcd which is at a higher voltage level than the external source potential Vcc is applied to the gate of the MOS transistor OQ1, whereby a signal of the external source potential Vcc level can be transmitted to the output node NDQ with no loss of the threshold voltage of the MOS transistor OQ1.

The drive circuit ODb inverts a low level of the read data RO to a high level and converts the high-level signal to the external source potential Vcc level. This drive circuit ODb includes an inverter IV1 which receives the read data RO, a p-channel MOS transistor PQ1 which is connected between an external source potential supply node Vcc (nodes and potentials supplied thereto are denoted by the same symbols) and a node Na and has its gate connected to a node Nb, a p-channel MOS transistor PQ2 which is connected between the external source potential supply node Vcc and the node Nb and has its gate connected to the node Na, an n-channel MOS transistor NQ1 which is connected between the node Na and a ground node and has its gate connected to receive the read data RO, an n-channel MOS transistor NQ2 which is connected between the node Nb and the ground node and has its gate connected to receive the output signal of the inverter IV1, and an inverter IV2 which inverts a signal on the node Nb and supplies the inverted signal to the gate of the MOS transistor OQ2.

The inverter IV2 operates with the external source potential Vcc of 3 V, for example, which is supplied on the external source potential supply node Vcc, serving as a first operation source potential. In this drive circuit ODb, the MOS transistors NQ2 and NQ1 enter ON and OFF states respectively when the read signal RO is at a low level, and the node Nb is discharged to the ground potential level through the MOS transistor NQ2. In response to the lowering of the potential level of the node Nb, the MOS transistor PQ1 enters an ON state, the node Na is charged to the external source potential Vcc level, and the MOS transistor PQ2 is brought into an OFF state. Thus, the potential on the node Nb is fixed at the ground potential level, and the output signal of the inverter IV2 is converted to the external source potential Vcc level. The MOS transistor OQ2 conducts in response to the high-level signal of the external source potential Vcc level from the inverter IV2, and discharges the node NDQ to the ground potential level.

The semiconductor memory device transfers data with an external device EX such as a CPU (central processing unit), for example. Elements forming the external device EX are not fined down (not highly integrated) as compared with the semiconductor memory device, and hence the external device EX cannot have the same source potential as the semiconductor memory device but a source potential of 5 V, for example, is utilized as that for the external device. A source potential of 3 V is utilized as the source potential Vcc of the semiconductor memory device, in order to maintain compatibility with an old generation semiconductor memory device having a source voltage which is not reduced.

The potential Vcd which is supplied to the gate of the MOS transistor OQ1 charging the output node NDQ is sufficiently higher than the external source potential Vcc, whereby the potential difference between the drain (node receiving the source potential) and the gate is small and hence the distance between a pinch-off point and the drain region is extremely small.

On the other hand, the potential of the gate of the MOS transistor OQ2 discharging the output node NDQ is 3 V, while the potential of its drain is 5 V. Thus, the gate potential is considerably lower than the drain potential. In this case, the discharging MOS transistor OQ2 is disadvantageously deteriorated. The mechanism of such deterioration is now described.

FIG. 34 schematically illustrates the sectional structure of the n-channel MOS transistor OQ2. Referring to FIG. 34, the MOS transistor OQ2 includes high concentration n-type impurity regions IRS and IRD which are formed on the surface of the p-type semiconductor substrate SUB, and a gate electrode layer GL which is formed on the surface of the substrate SUB between the impurity regions IRS and IRD with a gate insulating film (not shown) interposed therebetween. The impurity region IRS forms a source region, and is connected to a ground node S to receive a ground potential GND. The impurity region IRD forms a drain region, and is coupled to the output node NDQ for receiving a drain potential Vd of 5 V, for example. A gate potential Vg is applied to the gate electrode layer GL from the inverter IV2. The MOS transistor may cause such a pinch-off phenomenon that an inversion layer disappears in the channel region. This pinch-off phenomenon takes place when Vg−Vth=Vd, where Vth represents the threshold voltage of the MOS transistor. This pinch-off point (inversion layer disappearance point) moves toward the impurity region IRS forming a source. When the drain potential Vd exceeds a saturation potential (a voltage causing a pinch-off phenomenon, expressed as Vg−Vth), an inversion layer disappears in a region L, with presence of only a depletion layer. The voltage Vd which has been applied to the drain impurity region IRD is applied to this region L. When the gate potential Vg is lower than the drain potential Vd, i.e., when the gate potential Vg is 3 V and the drain potential Vd is 5 V as shown in FIG. 33, therefore, a pinch-off phenomenon is caused and the length of the region L to which a high electric field is applied is lengthened. In the region L to which a high electric field is applied, hot carriers are generated and holes are trapped in the gate insulating film, to deteriorate the characteristics of the gate insulating film and disadvantageously deteriorate dielectric breakdown immunity.

The drive circuit ODb has no function of converting the potential of its output signal to a higher level than the external source potential Vcc dissimilarly to the drive circuit ODa since the output discharging MOS transistor OQ2 is merely required to discharge the output node NDQ to the ground potential level and no problem of threshold voltage loss is caused in this case. Thus, the drive circuit ODb is simply provided with only a level conversion function, in consideration of the circuit occupied area and current consumption.

SUMMARY OF THE INVENTION

An object of the present invention is to provide a semiconductor memory device having high reliability.

Another object of the present invention is to provide a semiconductor memory device including a test circuit of a small occupying area.

Still another object of the present invention is to provide a structure of an internal circuit which is suitable for a test circuit of a small occupying area.

A further object of the present invention is to provide a semiconductor memory device which can correctly make a test at a high speed through a test circuit of a small occupying area.

A further object of the present invention is to provide a semiconductor memory device which includes an output buffer having high reliability of elements.

A specific object of the present invention is to provide a circuit generating an internal timing signal which can correctly make a test.

Another specific object of the present invention is to provide a semiconductor memory device including an address transition detection circuit which can correctly detect a transition of a column address signal at a high speed.

A semiconductor memory device according to a first aspect of the present invention includes a memory cell array which is divided into a plurality of array groups each having a plurality of memory cells, an internal data bus which is provided in correspondence to the memory cell array in common for the array groups, a plurality of read circuits which are arranged in correspondence to the plurality of array groups respectively and coupled to the internal data bus in common for transmitting data of selected memory cells of the corresponding array groups to the internal data bus upon selection, circuitry for bringing all of the plurality of read circuits into selected states in response to activation of a test mode instruction signal, and discrimination circuit which is coupled to the internal data bus for discriminating coincidence/incoincidence of logics of data read on the internal data bus from the plurality of read circuits and outputting a signal indicating the result of the discrimination.

A semiconductor memory device according to a second aspect of the present invention includes a memory cell array having a plurality of memory cells, a data write line which transmits data to be written in a selected memory cell of the memory cell array, data write circuit which receives externally supplied external write data, generates internal write data and transmits the same to the data write line, and array drive circuit which operates with a first level potential serving as an operation source potential for driving the memory cell array. The data write circuit includes amplitude control circuit which limits the amplitude of the internal write data transmitted to the data write line below the first level potential.

A semiconductor memory device according to a third aspect of the present invention includes a memory cell array having a plurality of memory cells, first amplification circuit which amplifies and outputs data of a selected memory cell of the memory cell array in response to an activation signal, delay circuits which delays activation of the activation signal, and second amplification circuit which amplifies an output signal of the first amplification circuit in response to activation of the delayed activation signal from the delay circuit and generates internal read data.

A semiconductor memory device according to a fourth aspect of the present invention includes a first output transistor which is coupled between an external source potential supply node and a data output terminal for driving the data output terminal to an external source potential level in response to a first logical level of internal read data, a second output transistor which is coupled between the data output terminal and another source node, and drive circuit which generates a signal of a higher potential level than the external source potential and applies the same to a control electrode node of the second output transistor when the internal read data is at a second logical level.

An address transition detection circuit according to a fifth aspect of the present invention includes a first delay component which delays an address signal bit, a second delay component which further delays an output signal of the first delay component, a first transistor element which receives the address signal bit at its control electrode node, a second transistor element which receives an output signal of the second delay component at its control electrode node, a third transistor element which receives the output signal of the first delay component at its control electrode node, and a fourth transistor element which receives the address signal bit at its control electrode node and conducts complementarily with the first transistor element. The first and second transistors are coupled in series between a first source node and an output node, while the third and fourth transistor elements are coupled in series between a second source node and the output node.

An address transition detection circuit according to a sixth aspect of the present invention includes a plurality of address bit transition detection circuits which are provided in correspondence to respective bits of a multi-bit address signal for detecting transitions of the corresponding address signal bits, a plurality of drive elements which are provided in correspondence to the respective ones of the plurality of address bit transition detection circuits and coupled in parallel with each other in common to a signal line for driving the signal line to a first potential in response to transition detection signals from the corresponding address bit transition detection means, a first drive circuit which has a first input logic threshold value and first current driving capability for driving the signal line to the first potential when the potential of the signal line exceeds the first input logic threshold value and approaches the first potential, signal generation circuit having a second input logic threshold value which is closer to the first potential than the first input logic threshold value and activating an address transition detection signal indicating a transition of the multi-bit address signal when the potential on the signal line exceeds the second input logic threshold value and approaches the first potential, delay component which delays the signal on the signal line, and component which has larger current driving capability than the first current driving capability and drives the signal line to a second potential level which is opposite to the potential of the first potential level with respect to the first and second input logic threshold values in response to a change of an output signal of the delay component to the first potential.

An address transition detection circuit according to a seventh aspect of the present invention comprises a plurality of address bit transition detection circuit which are provided in correspondence to respective bits of a multi-bit address signal and detects transitions of the corresponding address signal bits, and address transition detection circuit which outputs an address transition detection signal indicating a transition of the multi-bit address signal in response to activation of at least one of the transition detection signals from the plurality of address bit transition detection circuits. The plurality of address bit transition detection circuits are symmetrically arranged with respect to the address transition detection circuits.

A semiconductor memory device according to an eighth aspect of the present invention includes a memory cell array which is divided into a plurality of array groups each having a plurality of memory cells, a plurality of internal data buses which are arranged in correspondence to the plurality of array groups respectively for transferring data with selected memory cells of the corresponding array groups, a plurality of read amplifiers which are provided in correspondence to the plurality of internal data buses respectively for amplifying and transmitting data on the corresponding internal data buses to the internal data buses, potential set circuits which are provided in correspondence to the plurality of internal data buses respectively for setting the corresponding internal data buses at prescribed potentials upon activation, first address bit transition detection circuit detecting a transition of a first address signal bit which is employed for selecting one from the plurality of internal data buses in a multi-bit address signal, first control circuit which activates the potential set circuits in response to activation of transition detection signal from the first address bit transition detection circuit, second address bit transition detection circuit which detects transitions of address signal bits other than the first address bit, and second control circuit which activates the read amplifiers in response to activation of at least one of output signals from the first and second address bit transition detection means.

A semiconductor memory device according to a ninth aspect of the present invention includes a memory cell array which has a plurality of memory cells, read amplification circuit which includes a plurality of cascade-connected read amplifiers, and control circuit which successively activates the cascade-connected plurality of read amplifiers in response to an activation signal.

Output signals of a plurality of read circuits are simultaneously transmitted to an internal data bus so that coincidence/incoincidence of logics of read data are discriminated in accordance with the potential on the internal data bus, whereby coincidence/incoincidence of the logics can be discriminated simply in response to the signal potential dissimilarly to the structure of obtaining coincidence/incoincidence of logics by taking exclusive OR, whereby the device structure is simplified and the occupying area is reduced. Read data is transmitted to the internal data bus in a normal operation, whereby no dedicated interconnection for testing may be provided and the area occupied by the interconnections is reduced.

The amplitude of an output signal of data write circuit is limited so that an operation source potential of array drive circuit can be set independently of that of the write circuit, whereby the source potential of an array can be reduced with no bad influences exerted by write data on elements included in the array part, and power consumption can be reduced in response.

Further, read data can be reliably amplified by amplifying second read circuit after activation of first amplification means in memory cell data reading.

A potential which is applied to a control electrode node of an output transistor for driving an output node to another source potential level is brought into a level higher than an external source potential in an output circuit, whereby gate-to-drain potential difference of the output transistor can be reduced, generation of hot carriers can be suppressed in the output transistor, and deterioration of insulation ability of a gate insulating film can be suppressed in response.

A transition of a multi-bit address signal is detected through delay component and a transistor element, whereby a delay time for activating an address transition detection signal in address transition detection can be set at the sum of a delay time in the transistor element and that in second delay component, whereby the address transition detection signal can be activated at a high speed upon an address transition.

A transistor element is provided in parallel with a signal line for driving the signal line in response to an address transition detection signal and the potential of the signal line is driven by internal circuits having different input logical values, whereby an address transition detection signal having a prescribed width can be reliably formed at a high speed also in generation of a skew of an address signal, and generation of a whisker-like address transition detection signal caused by a noise can be reliably suppressed.

Address bit transition detection circuits are symmetrically arranged in address transition detection circuit, whereby delays in signal propagation transmitted to address transition detection circuit of address bit transition detection signals can be substantially equalized to each other, skews of address transition detection signals can be reduced and the address transition detection signals can be ascertained at quick timings.

Address transitions are detected by different address transition detection circuits, whereby loads of address bit transition detection circuits are reduced and transitions of address signals can be stably detected at a high speed.

Read timings for internal data are decided in accordance with transition detection of address signals, whereby the access time can be reduced and high speed reading is enabled. In a test operation, test data are transmitted to an internal data bus reliably at the same timing, whereby a correct test can be made.

A plurality of cascade-connected read amplifiers are activated in prescribed order, whereby the read amplifiers are activated when the internal states reach previously set operation points respectively so that the read amplifiers can be brought into operating states with prescribed operating characteristics and stable amplifying operations are implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 29A illustrates specific structures of an IOEQ generation circuit and a PAE generation circuit shown in FIG. 26, and FIG. 29B illustrates operation waveforms thereof;

DESCRIPTION OF THE PREFERRED EMBODIMENTS

[Embodiment 1]

Figure 1:
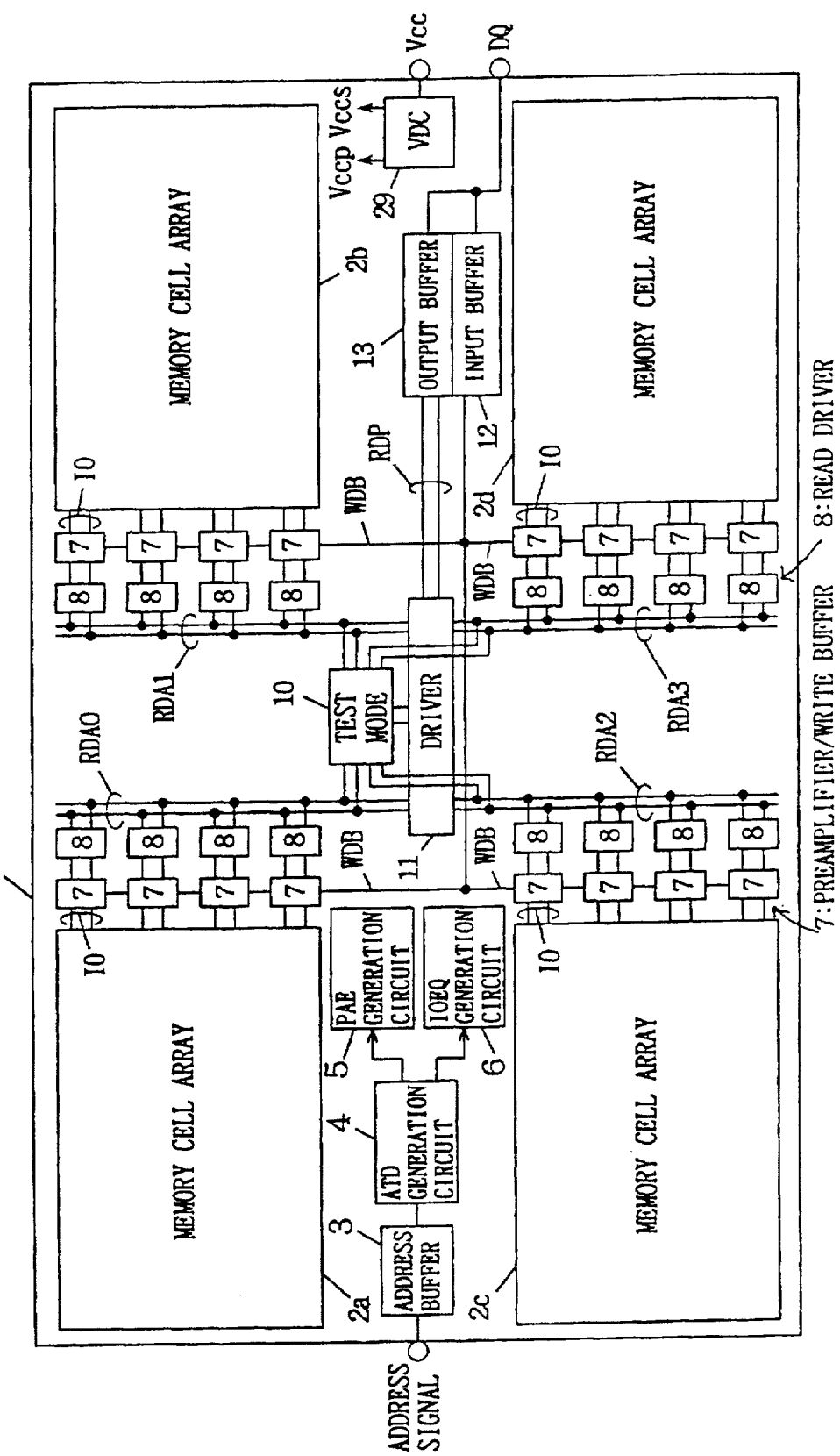
FIG. 1 schematically illustrates the overall structure of a semiconductor memory device according to the present invention.

FIG. 1 schematically illustrates the overall structure of a semiconductor memory device according to an embodiment 1 of the present invention. Referring to FIG. 1, memory cell arrays 2a to 2d, each of which includes a plurality of memory cells and divided into a plurality of column groups, are formed on a semiconductor chip 1. In each of the memory cell arrays 2a to 2d, the internal structure of which is described later in detail, 4-bit memory cells are selected (a 1-bit memory cell is selected in each column group). In a normal operation, only one array is activated.

In correspondence to the column groups of the respective ones of the memory cell arrays 2a to 2d, preamplifiers/write buffers 7 for amplifying read data while amplifying and transmitting internal write data to selected memory cells and read drivers 8 amplifying the read data from the preamplifiers/write buffers 7 are provided. Internal read data buses RDA0 to RDA3 for transmitting the read data and test data are arranged in correspondence to the respective ones of the memory cell arrays 2a to 2d. The internal read data buses RDA0 to RDA3, which transmit both of the internal read data and the test data according to this embodiment dissimilarly to the structure of the conventional semiconductor memory device, are denoted by symbols RDA0 to RDA3. The internal read data buses RDA0 to RDA3 include complementary read data line pairs transmitting complementary read data signals, as described later. In correspondence to the respective ones of these internal read data buses RDA0 to RDA3, the drivers 8 provided for the corresponding memory cell arrays 2a to 2d are wired-OR connected.

With respect to these internal read data buses RDA0 to RDA3, a test mode circuit 10 is provided for discriminating coincidence/incoincidence of logics of signal potentials on the internal read data buses RDA0 to RDA3 thereby identifying whether or not a defective memory cell is present in a plurality of memory cells (16-bit memory cells) which are simultaneously selected in the test operation. The internal read data buses RDA0 to RDA3 are utilized as test data transmission lines, whereby defects/non-defects of all of simultaneously selected plural bit memory cells can be discriminated only by the test mode circuit 10. Thus, there is no need to provide first test mode circuits 9 for the memory cell arrays 2a to 2d respectively, whereby the device occupying area is reduced. Further, no signal interconnection lines are required for transmitting test results from such first test mode circuits 9 to the test mode circuit 10, whereby the interconnection occupying area is reduced.

A driver 11 is provided between an output buffer 13 and the internal read data buses RDA0 to RDA3. This driver 11 also receives an output signal of the test mode circuit 10. In a normal operation mode, the driver 11 selects one from the read data buses RDA0 to RDA3 in accordance with a supplied address signal (not shown), and transmits a signal on the selected read data bus to the output buffer 13 through an output data bus RD. In a test operation mode, on the other hand, the driver 11 selects an output signal of the test mode circuit 10 and transmits the same onto the output data bus RD.

An input buffer 12 is coupled to write buffers which are included in the preamplifiers/write buffers 7 through input buses WDB. In the write buffers, only the one corresponding to a selected column group of a selected array is activated in accordance with a similar address signal (address signal for array selection) and a column group selection address signal which are supplied to the driver 11.

The semiconductor chip 1 is further provided thereon with an address buffer 3 which receives an externally supplied address signal and generates an internal address signal, an ATD generation circuit 4 which detects a transition of the internal address signal (internal column address signal) from the address buffer 3 and generates an address transition detection signal ATD indicating address transition detection, a PAE generation circuit 5 which generates a preamplifier enable signal PAE for activating preamplifiers included in the preamplifiers/write buffers 7 in response to the address transition detection signal ATD from the ATD generation circuit 4, and an IOEQ generation circuit 6 which generates an equalization signal IOEQ for equalizing potentials of I/O lines (more specifically, global I/O lines) provided between the memory cell arrays 2a to 2d and the preamplifiers/write buffers 7 in response to the address transition detection signal from the ATD generation circuit 4. I/O buses IO, the structures of which are described later, includes complementary signal lines transmitting complementary data signals, the potentials of which are equalized in response to the equalization signal IOEQ serving as a potential set signal.

The semiconductor chip 1 is further provided thereon with a voltage down converter (VDC) 29 which down-converts an externally supplied source potential Vcc and generates an array source potential Vccs and a peripheral circuit source potential Vccp. The array source potential Vccs, which is utilized in the array parts including the memory cells, is utilized as a first operation source potential with respect to sense amplifiers serving as driving circuitry for the arrays and a substrate bias potential for p-channel MOS transistors in the arrays. On the other hand, the peripheral circuit source potential Vccp is utilized in the peripheral circuits activating the memory cell arrays, i.e., row and column decoders, the preamplifiers/write buffers 7, the drivers 8, the test mode circuit 10 and the driver 11. The output buffer 13 utilizes the external source potential Vcc as a first operation source potential, as described later. The structures of the respective parts are now described.

[Structure of Array Part]

Figure 2:
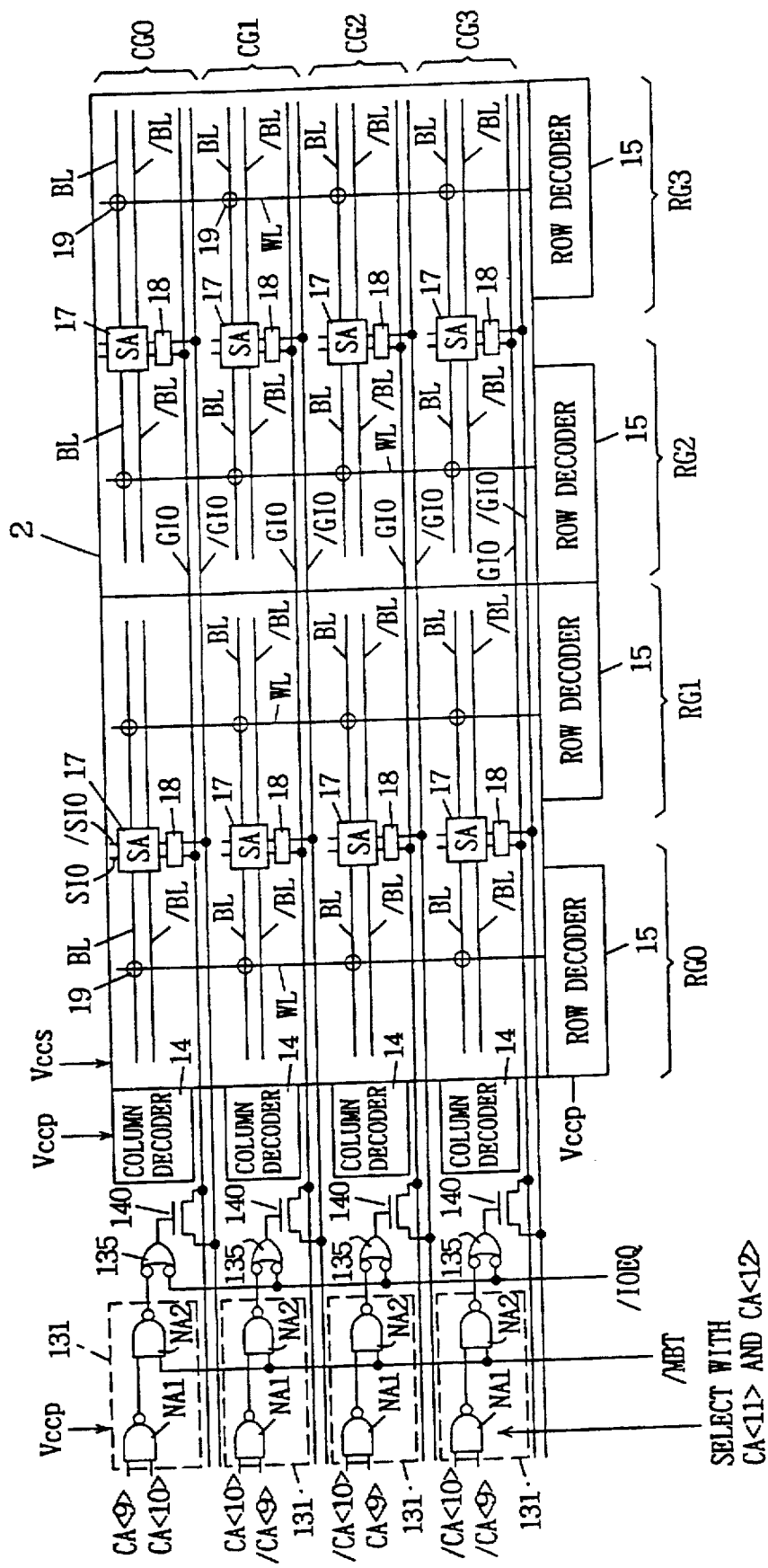
FIG. 2 illustrates the structure of a memory cell array part shown in FIG. 1 in more detail.

FIG. 2 schematically illustrates the structure of each memory cell array part of the semiconductor memory device according to the embodiment 1 of the present invention. This figure typically shows the structure of a single memory cell array part. Referring to FIG. 2, the memory cell array 2 has memory cells 19 arranged in a matrix of rows and columns, and is divided into a plurality of row groups RG and a plurality of column groups CG along the column extension direction and the row extension direction of the memory cells respectively. Referring to FIG. 2, the memory cell array 2 is divided into four row groups RG0 to RG3 and four column groups CG0 to CG3, as an example. In each of the row groups RG0 to RG3, a word line WL is arranged in correspondence to each row of the memory cells 19, and bit line pairs BL and /BL are arranged in correspondence to the respective columns of the memory cells. A row of memory cells are connected to the word line WL, while a column of memory cells are connected to each pair of the bit lines BL and /BL. FIG. 2 illustrates the memory cells 19 arranged in correspondence to intersections between the word lines WL and the bit lines BL in the respective ones of the column groups CG0 to CG3 in the row groups RG0 to RG3 respectively, as an example.

A row decoder 15 is arranged in correspondence to each of the row groups RG0 to RG3 for decoding a row address signal which is supplied from the address buffer and driving a word line to a selected state in the corresponding row group, while a column decoder 14 is arranged in correspondence to each of the column groups CG0 to CG3 for decoding a column address signal (not shown) and outputting a column selection signal. The column selection signal from the column decoder is transmitted onto a column selection line CSL described later. As described later, the column selection line transmitting the column selection signal from the column decoder 14 is arranged over all row groups RG0 to RG3 in each of the corresponding column groups CG0 to CG3. Namely, the column selection line is arranged along the column extension direction over the plurality of row groups RG0 to RG3, while the word line WL is arranged along the row extension direction over the plurality of column blocks CG0 to CG3.

Sense amplifiers (SA) 17 are arranged between the row groups RG0 and RG1 in correspondence to the respective bit line pairs BL and /BL, while sense amplifiers (SA) 17 are arranged between the row groups RG2 and RG3 in correspondence to the respective bit line pairs. This arrangement of the sense amplifiers 17 is known as "shared sense amplifier arrangement". These sense amplifiers 17 may be alternately arranged in accordance with "alternate shared sense amplifier" arrangement of arranging the sense amplifiers SA every other pair of bit lines on the same side thereof alternately. Sub I/O lines SIO and /SIO are arranged along the band of the sense amplifiers 17 with respect to the column groups CG0 to CG3 respectively. The sub I/O lines SIO and /SIO are provided in common to the row groups sharing the sense amplifiers 17, and arranged along the row extension direction only in the corresponding column groups.

The global I/O lines GIO and /GIO are arranged for the column groups CG0 to CG3 respectively. Row group selection switches 18 are arranged in correspondence to intersections between the global I/O lines GIO and /GIO and the sub I/O lines SIO and /SIO. While the structure of the row group selection switches 18 is described later in detail, a single row group selection switch 18 is brought into a conducting state in each of the column groups CG0 to CG3 in accordance with a row group selection signal (not shown), to connect selected sub I/O lines SIO and /SIO with the global I/O lines GIO and /GIO. Thus, 1-bit memory cell is selected in each of the column groups CG0 to CG3. The selected memory cell is coupled with the global I/O lines GIO and /GIO, so that data is transferred therebetween.

A column group decoder 131 is provided in correspondence to each of the column groups CG0 to CG3, in order to select one from the column groups CG0 to CG3. The column group decoder 131 includes a NAND circuit NA1 which receives 2-bit column group selection signals, and a NAND circuit NA2 which receives an output signal of the NAND circuit NA1 and a test mode indication signal /MBT. Column address signal bits CA<9> and CA<10> are employed as the column group selection signals. The column group CG0 is selected when both of the column address signal bits CA<9> and CA<10> are at high levels. The column group CG1 is selected when both of the column address signal bits CA<10> and /CA<9> are at high levels. The column group CG2 is selected when both of the column address signal bits /CA<10> and CA<9> are at high levels. The column group CG3 is selected when both of the column address signal bits /CA<10> and /CA<9> are at high levels. The column address signal bits CA<9> and /CA<9> are complementary column address signal bits. The column address signal bits CA<10> and /CA<10> are complementary column address signal bits. The memory cell array 2 is selected by a combination of column address signal bits CA<11> and CA<12>. A column selecting operation is performed in the selected memory cell array.

In order to selectively bring the global I/O lines GIO and /GIO into active states, a NAND circuit 135 receiving an output signal of the corresponding column group decoder 131 and an equalization instruction signal /IOEQ which is a potential set signal and an equalization transistor 140 formed by an n-channel MOS transistor which conducts in response to a high level of an output signal from the NAND circuit 135 for electrically short-circuiting the corresponding global I/O lines GIO and /GIO are provided for the global I/O lines GIO and /GIO of each of the column groups CG0 to CG3.

The column group decoder 131 outputs a low-level signal upon selection thereof (when both of the corresponding column address signal bits are at high levels). The equalization signal /IOEQ, which is a potential set signal, is brought into an active state of a low level for a prescribed period in response to a transition of a column address signal CA, as its generation mode is described later in detail.

In response to activation (low level) of the equalization signal /IOEQ, the output signal of the NAND circuit 135 goes high, the equalization transistor 140 is brought into a conducting state, and potential levels of the global I/O lines GIO and /GIO are equalized to each other. The output signal of the selected column group decoder 131 is at a high level, and when the equalization signal /IOEQ is returned to a high level, the equalization transistor 140 of the selected column group CGi (i=0 to 3) is brought into a non-conducting state.

The output signals of the column group decoders 131 for the non-selected column groups are at low levels, whereby the output signals of the NAND circuits 135 are brought to high levels in response, the equalization transistors 140 provided in the non-selected column groups maintain conducting states, and the global I/O lines GIO and /GIO of the non-selected column groups maintain the same potential levels. Thus, the potential levels of only the global I/O lines GIO and /GIO provided for the selected column group CGi are changed in response to write or read data, so that data is written in or read from the selected memory cell.

In a multi-bit test mode, the test mode indication signal /MBT is set to a low level, the output signal of each NAND circuit NA2 is brought to a high level, and the output signals of the column group decoders 131 for the respective column groups CG0 to CG3 are set to high levels in all memory cell arrays 2a to 2d. Thus, all column groups CG0 to CG3 are brought into selected states, and all equalization transistors 140 are brought into non-conducting states when the equalization signal /IOEQ is at a high level. Thus, data are written in or read from the global I/O lines GIO and /GIO which are provided for the column groups CG0 to CG3 respectively in parallel with each other.

The peripheral circuit source potential Vccp is applied to the column group decoders 131, the NAND circuits 135, the column decoders 14 and the row decoders 15. On the other hand, the array source potential Vccs is supplied as a first operation source potential for p-channel MOS transistors included in the sense amplifiers SA in the array part, and applied to the substrate regions of the p-channel MOS transistors provided in the memory cell arrays as a bias potential.

As hereinabove described, all column groups CG0 to CG3 can be brought into selected states in all memory cell arrays in the test operation mode while one column group can be selected from the column groups CG0 to CG3 in one memory cell array in the normal operation mode by the column group decoders 13 and the test mode indication signal /MBT.

Figure 3:
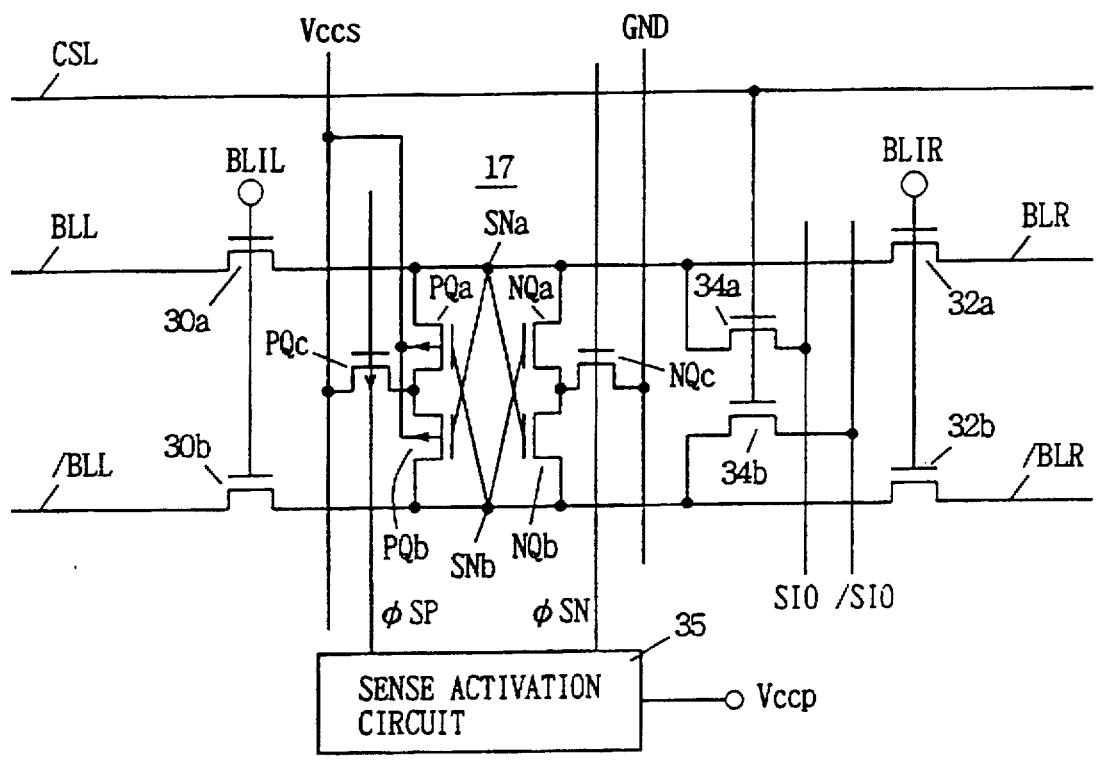
FIG. 3 illustrates the structure of a sense amplifier part shown in FIG. 2 in more detail.

FIG. 3 illustrates the structure of each sense amplifier part shown in FIG. 2. This figure typically shows a single sense amplifier and parts related thereto. The sense amplifier 17 serving as array drive circuit includes a p-channel MOS transistor PQa having a first conduction node which is coupled to a sense node SNa and a gate which is coupled to a sense node SNb, a p-channel MOS transistor PQb having a first conduction node which is coupled to the sense node SNb and a gate which is coupled to the sense node SNa, an n-channel MOS transistor NQa having a first conduction node which is connected to the sense node SNa and a gate which is connected to the sense node SNb, and an n-channel MOS transistor NQb having a first conducting node which is coupled to the sense node SNb and a gate which is coupled to the sense node SNa.

With respect to the sense amplifier 17, provided are a p-channel MOS transistor PQc which conducts in response to a sense amplifier activation signal φSP from a sense activation circuit 35 and supplies the array source potential Vccs to second conduction nodes of the p-channel MOS transistors PQa and PQb, and an n-channel MOS transistor NQc which conducts in response to a sense amplifier activation signal φSN from the sense activation circuit 35 and transmits the ground potential GND to second conduction nodes of the n-channel MOS transistors NQa and NQb respectively. Substrate region (a well region or a semiconductor layer serving as a substrate) of the p-channel MOS transistors PQa, PQb and PQc is supplied with the array source potential Vccs. The sense activation circuit 35 operates with a first operation source potential or the peripheral circuit source potential Vccp.

The sense nodes SNa and SNb are connected to bit lines BLL and /BLL and BLR and /BLR of first and second row blocks through bit line isolation transistors 30a, 30b, 32a and 32b respectively. The bit line isolation transistors 30a and 30b are supplied with a bit line isolation control signal BLIL at their gates, while gates of the bit line isolation transistors 32a and 32b are supplied with a bit line isolation control signal BLIR.

In a standby cycle or when the row blocks include no selected memory cells, the bit line isolation control signals BLIL and BLIR are maintained at high levels, and the sense nodes SNa and SNb are connected to the bit lines BLL, BLR, /BLL and /BLR respectively.

When a selected memory cell is connected to either bit line pair BLL and /BLL or BLR and /BLR, only the bit line isolation control signal for the bit line pair which is connected with the selected memory cell is set to a high level, and that for the other bit line pair is set to a low level. When a selected memory cell is connected to the bit line pair BLL and /BLL, for example, the bit line isolation control signal BLIL is maintained at a high level (a potential level higher than the array source potential Vccs in general), while the bit line isolation control signal BLIR is set to a low level. Thus, the sense nodes SNa and SNb are connected to only the bit lines BLL and /BLL, whereby the parasitic capacitances of the sense nodes SNa and SNb are reduced. The bit line isolation control signal BLIL is set at a potential level which is higher than the array source potential Vccs, in order to transmit the source potential Vccs appearing on the sense nodes SNa and SNb to the bit line BLL or /BLL with no loss of the threshold voltages of the bit line isolation transistors 30a and 30b.

I/O gate transistors 34a and 34b which conduct in response to the column selection signal CSL transmitted from the column decoder 14 shown in FIG. 2 and connect the sense nodes SNa and SNb to the sub I/O lines SIO and /SIO are provided between the sense nodes SNa and SNb and the sub I/O lines SIO and /SIO. A column selection signal line transmitting the column selection signal CSL extends over all row groups in a single column group, in parallel with the bit lines BL and /BL.

The column decoder 14 provided in correspondence to the selected column group is activated to decode a supplied column address signal, and brings one column selection signal CSL into an active state in the corresponding column group. Thus, 1-bit memory cell is selected in the selected one of the column groups CG0 to CG3, so that the bit lines connected with the selected memory cell are coupled to the corresponding sub I/O lines SIO and /SIO.

Figure 4:
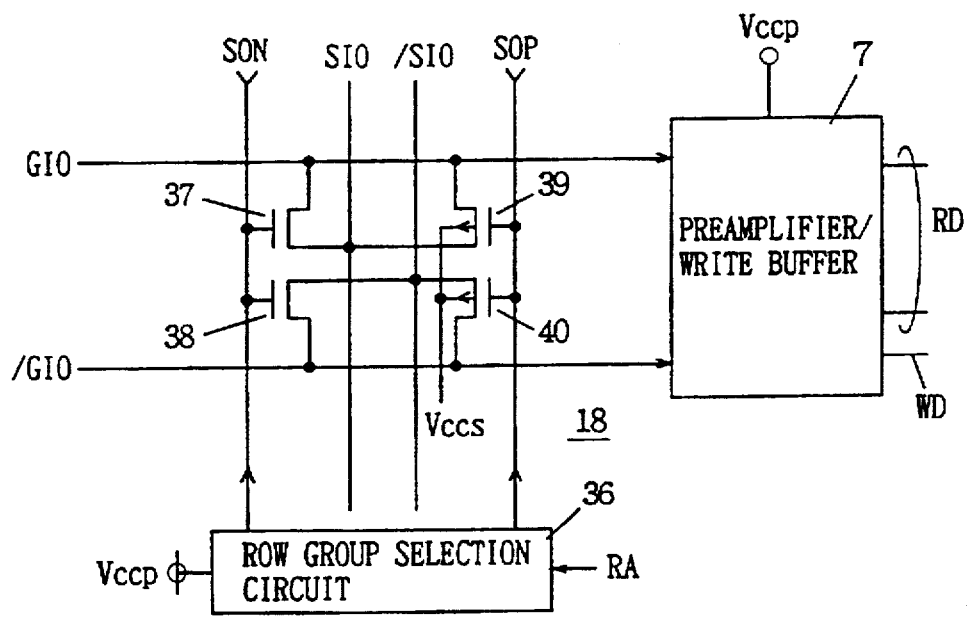
FIG. 4 illustrates the structure of switches connecting a sub I/O line and a global I/O line shown in FIG. 2 with each other in detail.

FIG. 4 illustrates the structure of each row group selection switch 18 shown in FIG. 2. Referring to FIG. 4, the row group selection switch 18 includes p-channel MOS transistors 39 and 40 which conduct in response to a row group selection signal SOP and couple the sub I/O lines SIO and /SIO to the global I/O lines GIO and /GIO respectively, and n-channel MOS transistors 37 and 38 which couple the sub I/O lines SIO and /SIO to the global I/O lines GIO and /GIO respectively in response to a row group selection signal SON. Substrate regions of the p-channel MOS transistors 39 and 40 are supplied with the array source potential Vccs.

The row group selection signals SOP and SON are outputted from a row group selection circuit 36. This row group selection circuit 36 operates with a first operation source potential or the peripheral source potential Vccs, and drives the row group selection signals SOP and SON to low and high levels of active states in accordance with a row group selection signal RA. The row group selection signal RA is formed by OR operations of row group selection signals for two groups sharing the sense amplifier 17 respectively.

The global I/O lines GIO and /GIO are coupled to the preamplifier/write buffer 7.

[Structure of Write Buffer]

As shown in FIG. 4, the write buffer included in the preamplifier/write buffer 7 operates with a first operation source potential or the peripheral circuit source potential Vccp. In data writing, therefore, a signal of the peripheral circuit source potential Vccp level is transmitted to one of the global I/O lines GIO and /GIO. The substrate regions of the MOS transistors 39 and 40 receive the array source potential Vccs, and hence first impurity regions and the substrate regions of the MOS transistors 39 and 40 are forward-biased when the source potential Vccp is higher than the array source potential Vccs as described above, and substrate currents flow. Description is now made on a structure of the write buffer for allowing normal operations of the p-channel MOS transistors 39 and 40 also when the peripheral circuit source potential Vccp is higher than the array source potential Vccs.

[Write Buffer]

Figure 5:
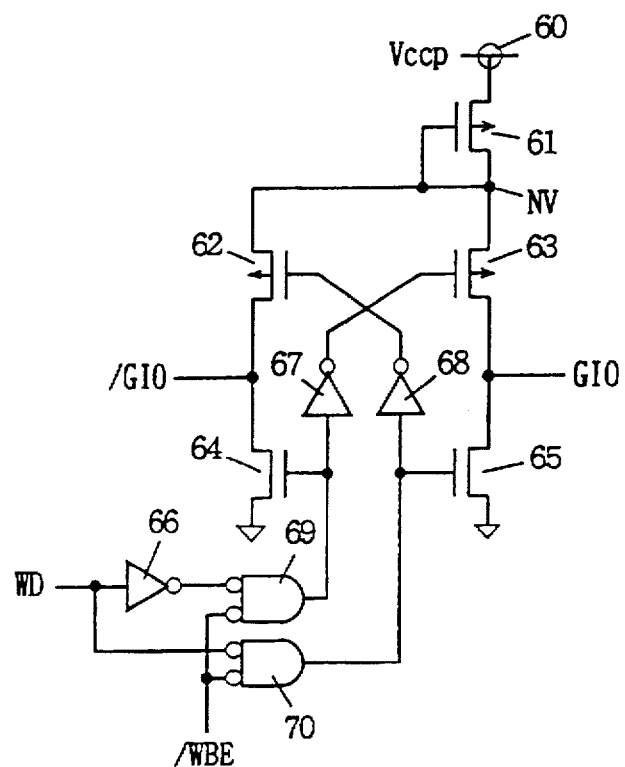
FIG. 5 illustrates the structure of a write buffer according to an embodiment 1 of the present invention.

FIG. 5 illustrates the specific structure of the write buffer according to the embodiment 1 of the present invention. Referring to FIG. 5, the write buffer includes an inverter 66 inverting internal write data WD which is supplied from the input buffer (see FIG. 1) onto an internal input bus, a NOR circuit 69 which receives an output signal of the inverter 66 and a write buffer enable signal /WBE, a NOR circuit 70 which receives the internal write data WD and the write buffer enable signal /WBE, an inverter 67 which inverts an output signal of the NOR circuit 69, and an inverter 68 which inverts an output signal of the NOR circuit 70. The write buffer enable signal /WBE brings only a write buffer which is provided in correspondence to a column group selected in a selected memory cell array, as described later. Therefore, only the write buffer for the selected column group forms complementary data in accordance with the internal write data.

The write buffer further includes a peripheral circuit source potential Vccp supply node 60, a p-channel MOS transistor 61 which is connected between the node 60 and an internal source node NV and has its gate connected to the internal source node NV, a p-channel MOS transistor 62 which is connected between the global I/O line /GIO and the internal source node NV and has its gate coupled to receive an output signal of the inverter 68, a p-channel transistor 63 which is connected between the internal source node NV and the global I/O line GIO and has its gate coupled to receive an output signal of the inverter 67, an n-channel MOS transistor 64 which is connected between the global I/O line /GIO and a ground potential supply node (second source node) and has its gate coupled to receive an output signal of the NOR circuit 69, and an n-channel MOS transistor 65 which is connected between the global I/O line GIO and the ground potential node and has its gate coupled to receive an output signal of the NOR circuit 70.

The inverters 66 and 67 and the NOR circuits 69 and 70 operate with first operation source potentials or the peripheral circuit source potential Vccp. The p-channel MOS transistor 61 which is connected between the Vccp supply node 60 and the internal source node NV operates in a source follower mode. Namely, this p-channel MOS transistor 61 holds the potential difference between its gate and source at the absolute value of its own threshold voltage Vthp. The source follower mode operation of this p-channel MOS transistor 61 is implemented by sufficiently increasing current suppliability of the MOS transistor 61 as compared with the MOS transistors 62 to 65 (since it is adapted for very small current to flow through the MOS transistor 61). Therefore, a potential of Vccp−|Vthp| is transmitted onto the internal source node NV. In inactivation of the write buffer, i.e., when the write buffer enable signal /WBE is at a high level, both of the NOR circuits 69 and 70 output low-level signals, and the inverters 67 and 68 output high-level signals in response. In this state, all MOS transistors 62 to 65 are in OFF states, and the write buffer is maintained in an output high impedance state.

When the write buffer enable signal /WBE is set to a low level of an active state, on the other hand, the NOR circuits 69 and 70 function as inverters, to output complementary signals in accordance with the internal write data WD appearing on the internal input bus. It is assumed here that the NOR circuit 69 outputs a high-level signal, and the NOR circuit 70 outputs a low-level signal. In this state, the inverter 67 outputs a low-level signal, and the inverter 68 outputs a high-level signal. The MOS transistors 63 and 64 are brought into ON states, and the MOS transistors 62 and 65 are brought into OFF states. Therefore, the global I/O line GIO is charged to the level of the potential Vccp−|Vthp| on the internal source node NV, while the global I/O line /GIO is discharged to the ground potential level through the MOS transistor 63. The potential on the global I/O line GIO is at a lower level than the peripheral circuit source potential Vccp.

Even if the write buffer transmits a high-level signal to the p-channel MOS transistors shown in FIGS. 3 and 4, therefore, junctions between the impurity regions and the substrate regions can be prevented from being forward biased in these p-channel MOS transistors when the relation of Vccp−|Vthp|≦Vccs is satisfied. Also when the peripheral circuit source potential Vccp is higher than the array source potential Vccs, therefore, the junctions of the p-channel MOS transistors can be prevented from forward biasing in the memory cell array part, by employing the p-channel MOS transistor 61 as output signal amplitude limitation element for the write buffer. Therefore, the peripheral circuits can be driven at a high speed with the high source potential Vccp while driving the memory cell array part with the low source potential Vccs, thereby reducing power consumption. Thus, power consumption in the memory cell array part can be reduced with no malfunction, whereby a highly reliable semiconductor memory device operating with low power consumption can be implemented.

Figure 6:
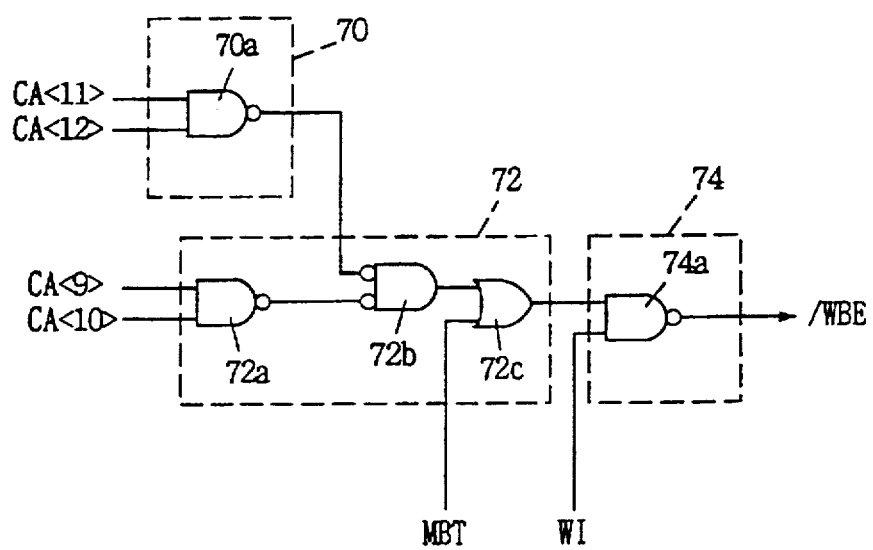
FIG. 6 illustrates the structure of a control circuit generating a write buffer enable signal shown in FIG. 5.

FIG. 6 illustrates the structure of a part generating the write buffer enable signal /WBE. This figure representatively shows only a structure for a single column block.

Referring to FIG. 6, the write buffer enable signal generation portion includes an array decoder 70 which specifies one of the four memory cell arrays 2a to 2d in accordance with the address signal bits CA<11> and CA<12>, a column group decoder 72 which is activated in response to an array selection signal from the array decoder 70 for selecting one column group in the selected memory cell array in accordance with the column group address signal bits CA<9> and CA<10>, and a buffer drive circuit 74 which generates the write buffer enable signal /WBE in accordance with an output signal from the column group decoder 72 and a write instruction signal WI.

The array decoder 70 includes a NAND circuit 70a which receives the address signal bits CA<11> and CA<12>. One of the four memory cell arrays 2a to 2d is brought into a selected state by the 2-bit address signal bits CA<11> and CA<12>. The array decoder 70 outputs a low-level array selection signal for the selected memory cell array.

The column group decoder 72 includes a NAND circuit 72a which receives the column address signal bits CA<9> and CA<10>, a NOR circuit 72b which receives an output signal of the NAND circuit 72a and the array selection signal, and an OR circuit 72c which receives an output signal of the NOR circuit 72b and a test mode indication signal MBT. The NAND circuit 72a selects one of the four column blocks CG0 to CG3 in accordance with the column address signal bits CA<9> and CA<10>. The NOR circuit 72b outputs a high-level selection signal for the selected column group in the selected memory cell array. The OR circuit 72c brings all the column groups into selected states when the test mode indication signal MBT is at a high level of an active state. Therefore, all column groups are simultaneously brought into selected states in all memory cell arrays.

The write buffer drive circuit 74 includes a NAND circuit 74a which receives an output signal of the column group decoder 72 and the write instruction signal WI. The NAND circuit 74a brings the write buffer enable signal /WBE to a low level of an active state for the selected column group of the selected memory cell array, in accordance with activation (high level) of the write instruction signal WI. Thus, only one of the four memory cell arrays is selected and only the write buffer which is provided for one column group is brought into an active state in the selected memory cell array in the normal operation mode, so that data is written in the selected memory cell of the corresponding column group.

[Modification 1]

Figure 7:
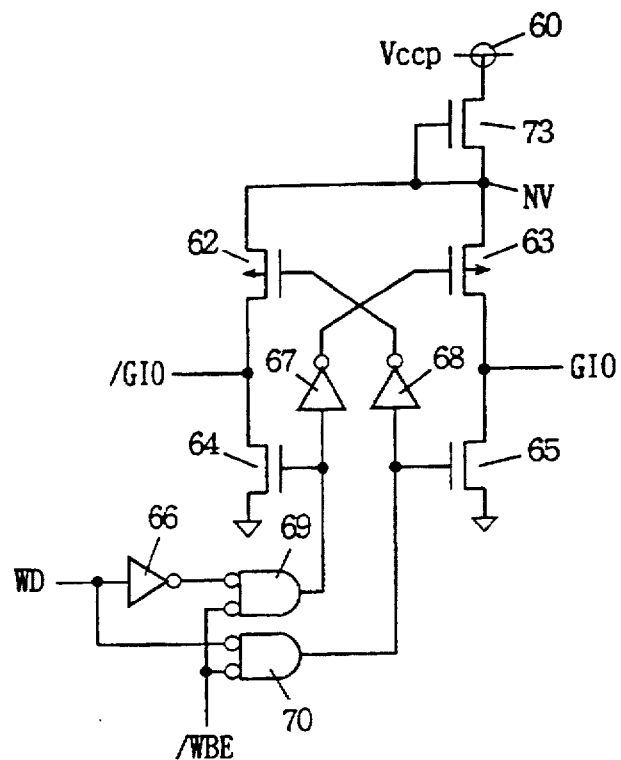
FIG. 7 illustrates the structure of a modification 1 of the embodiment 1 of the present invention.

FIG. 7 illustrates the structure of a modification 1 of the write buffer according to the present invention. Referring to FIG. 7, an n-channel MOS transistor 73 which operates in a source follower mode is provided between a peripheral circuit source potential Vccp supply node 60 and an internal source node NV. The n-channel MOS transistor 73 has a gate and a drain connected to the Vccp supply node 60, and a source connected to the internal source node NV. In the structure shown in FIG. 7, the potential of the internal source node NV is Vccp−Vthn, where Vthn represents the threshold voltage of the MOS transistor 73. Also in the structure shown in FIG. 7, therefore, the potential of the internal source node NV is lower than the peripheral circuit source potential Vccp, whereby a high level of write data transmitted to global I/O lines GIO and /GIO is at the Vccp−Vthn level, and junctions between impurity regions and substrates of p-channel MOS transistors (MOS transistors 39 and 40 shown in FIG. 4 and the p-channel MOS transistors PQa and PQb included in the sense amplifier 17) in the memory cell array part are prevented from being forward biased.

[Modification 2]

Figure 8A:
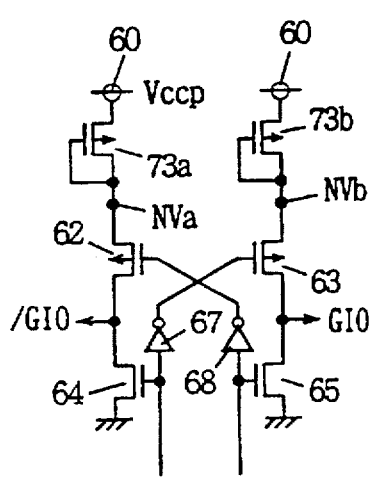
FIGS. 8A and 8B illustrate modifications of the write buffer according to the embodiment 1 of the present invention.

FIG. 8A illustrates the structure of a modification 2 of the write buffer according to the present invention. Referring to FIG. 8A, p-channel MOS transistors 73a and 73b operating in a source follower mode are provided between a p-channel MOS transistor 62 and a Vccp supply node 60 and between the Vccp supply node 60 and a p-channel MOS transistor 63 respectively. A potential of Vccp−|Vthp| is transmitted to internal source nodes NVa and NVb through the MOS transistors 73a and 73b respectively. In the structure shown in FIG. 8A, the p-channel MOS transistors 73a and 73b for amplitude limitation are simply required to supply currents to MOS transistors 62 and 63 respectively. Therefore, the potentials of the internal source nodes NVa and NVb can be further stabilized.

Also as to the arrangement of the MOS transistors, components driving global I/O lines GIO and /GIO respectively can be symmetrically arranged to simplify the layout, while characteristics of the circuit parts driving the global I/O lines GIO and /GIO can be equalized to each other by the symmetrical arrangement, data determination timings in data writing can be equalized with respect to the global I/O lines GIO and /GIO, there is no need to allow for margins with respect to the write data determination timings, and high-speed writing can be performed.

[Modification 3]

Figure 8B:
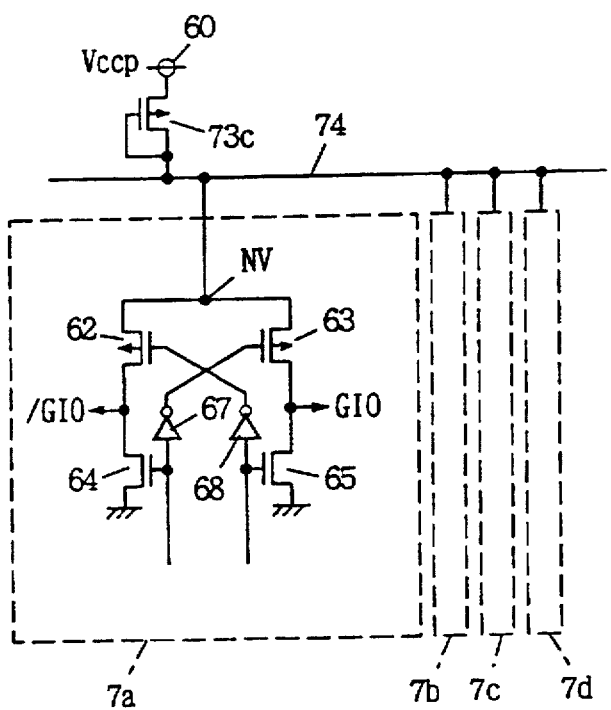

FIG. 8B illustrates the structure of a modification 3 of the write buffer according to the present invention. In the structure shown in FIG. 8B, an internal source line 74 is arranged in common for write buffers included in preamplifiers/write buffers 7a to 7d which are provided in correspondence to respective ones of column groups of memory cell arrays (2a to 2d). A p-channel MOS transistor 73c which operates in a source follower mode is provided between the internal source line 74 and a Vccp supply node 60. The source potential on the internal source line 74 is Vccp−|Vthp|. In the structure shown in FIG. 8B, only a single p-channel MOS transistor 73c operating in a source follower mode for amplitude limitation is provided in common for all write buffers as to a single memory cell array. Thus, the element occupying area can be reduced. Alternatively, the source line 74 may be arranged in common for all memory cell arrays 2a to 2d so that one MOS transistor 73c is shared by all write buffers.

In the structures shown in FIGS. 8A and 8B, the p-channel MOS transistors 73a to 73c for amplitude limitation may alternatively be replaced with n-channel MOS transistors, to attain similar effects.

[Modification 4]

Figure 9A:
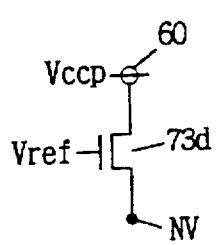
FIGS. 9A to 9J illustrate modifications of an amplitude limitation part of the write buffer according to the embodiment 1 of the present invention.

FIG. 9A illustrates the structure of a modification 4 of the write buffer. This figure shows only an amplitude limitation part of the write buffer. Referring to FIG. 9A, an n-channel MOS transistor 73d which receives a reference potential Vref at its gate is provided between a Vccp supply node 60 and an internal source node NV. This MOS transistor 73d operates in a source follower mode, and transmits a potential of Vref−Vths onto the internal source node NV. A potential of a desired level can be generated and transmitted to the internal source node NV, by appropriately setting the potential level of the reference potential Vref.

[Modification 5]

Figure 9B:
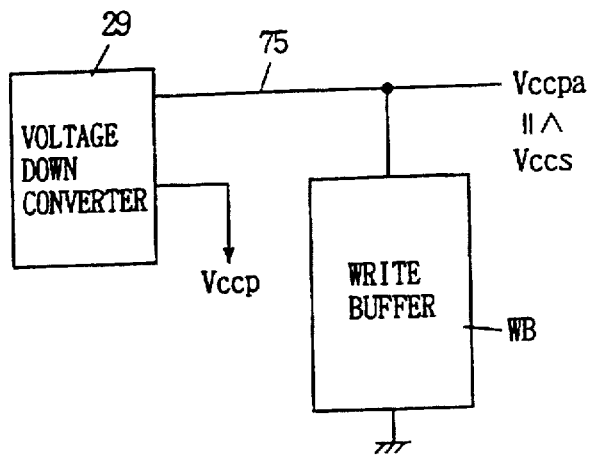

FIG. 9B illustrates the structure of a modification 5 of the write buffer. In the structure shown in FIG. 9B, a voltage down converter 29 generates a write buffer source potential Vccpa which is lower than an array source potential Vccs independently of a peripheral circuit source potential Vccp, and transmits the same onto an internal source line 75. A write buffer WB operates with a first operation source potential or the source potential Vccpa on the internal source line 75. The operation of the write buffer WB can be stabilized by generating the source potential Vccpa for driving the write buffer independently of the peripheral circuit source potential Vccp. The source potential Vccp is generated by the voltage down converter 29, whereby the source potential Vccpa for write data amplitude limitation can be generated at a desired potential level which is lower than the array source potential Vccs.

[Modification 6]

Figure 9C:
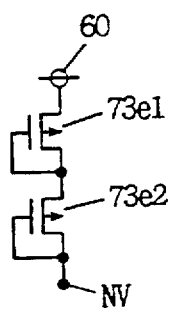

FIG. 9C illustrates the structure of a modification 6 of the write buffer. In the structure shown in FIG. 9C, a number of, n (2 in FIG. 9C), p-channel MOS transistors 73e1 and 73e2 operating in a source follower mode are provided in series between a Vccp supply node 60 and an internal source node NV. In this structure, a potential of Vccp−n|Vthp| is transmitted to the internal source node NV, where the character n represents the number (n=2 in FIG. 9C) of the p-channel MOS transistors operating in a source follower mode. Also when a peripheral circuit source potential Vccp is sufficiently higher than an array source potential Vccs, therefore, a source potential which is lower than the array source potential Vccs can be reliably supplied to the write buffer, and the amplitude of an output signal of the write buffer WB can be limited in response.

[Modification 7]

Figure 9D:
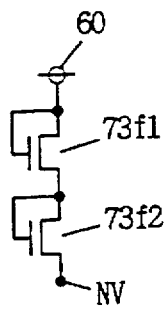

FIG. 9D illustrates the structure of a modification 7 of the write buffer. Referring to FIG. 9D, a number of, n (2 in FIG. 9D), n-channel MOS transistors 73f1 and 73f2 operating in a source follower mode are provided in series between a Vccp supply node 60 and an internal source node NV. In this structure, the potential on the internal source node NV is provided by Vccp−n·Vthn. Also when a peripheral circuit source potential Vccp is high, write data having a high level which is lower than an array source potential Vccs can be generated by reliably performing amplitude limitation, similarly to the modification 6.

[Modification 8]

Figure 9E:
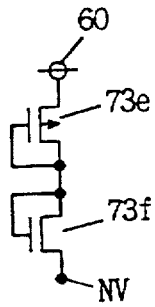

FIG. 9E illustrates the structure of a modification 8 of the write buffer. Referring to FIG. 9E, a p-channel MOS transistor 73e operating in a source follower mode is connected to a Vccp supply node 60, while an n-channel MOS transistor 73f operating in a source follower mode is provided between the p-channel MOS transistor 73e and an internal source node NV. Numbers m and n of the p-channel and n-channel MOS transistors 73e and 73f are arbitrary. In this structure, the potential supplied to the internal source node NV is Vccp−m|vthp|−n·Vthn. The p-channel MOS transistor 73e is connected to the Vccp supply node 60, whereby its substrate potential can be readily set at the peripheral circuit source potential Vccp, and interconnection lines for fixing the substrate potential can be reduced.

[Modification 9]

Figure 9F:
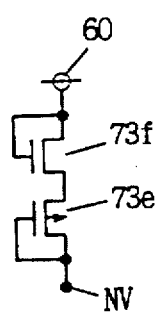

FIG. 9F illustrates the structure of a modification 9 of the write buffer. Referring to FIG. 9F, an n-channel MOS transistor 73f operating in a source follower mode is connected to a Vccp supply node 60. A p-channel MOS transistor 73e operating in a source follower mode is provided between the MOS transistor 73f and an internal source node NV. The potential on the internal source node NV is identical to that of the structure shown in FIG. 9E. In the structure shown in FIG. 9F, the p-channel MOS transistor 73e, which is connected to the internal source node NV, can be formed in the same well region as p-channel MOS transistors 62 and 63 included in the write buffer, and the element occupying area can be reduced.

[Modification 10]

Figure 9G:
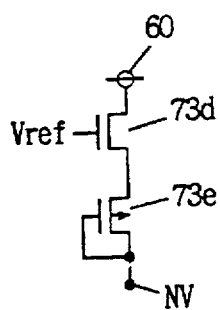

FIG. 9G illustrates the structure of a modification 10 of the write buffer. Referring to FIG. 9G, an n-channel MOS transistor 73d operating in a source follower mode which receives a reference potential Vref at its gate is connected to a Vccp supply node 60. Between the MOS transistor 73d and an internal source node NV, a number of, n, p-channel MOS transistors 73e operating in a source follower mode are provided. FIG. 9C representatively shows a single p-channel MOS transistor. In this structure, the potential supplied to the internal source node NV is Vccp−Vref−n|Vthp|. Also when the reference potential Vref which can be generated in the semiconductor memory device is high as compared with the array source potential Vccs, the necessary source potential for the write buffer can be readily formed, and amplitude limitation of the output signal of the write buffer can be reliably performed.

[Modification 11]

Figure 9H:
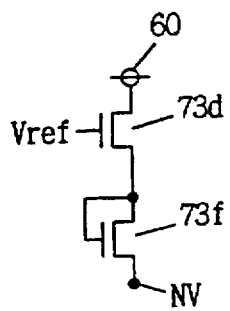

FIG. 9H illustrates the structure of a modification 11 of the write buffer. Referring to FIG. 9H, an n-channel MOS transistor 73d operating in a source follower mode which receives a reference potential Vref at its gates is connected to a Vccp supply node 60. Between the MOS transistor 73d and an internal source node NV, a number of, n, n-channel MOS transistors 73f operating in a source follower mode are provided. FIG. 9H representatively shows a single n-channel MOS transistor 73f. In this structure, the potential supplied to the internal source node NV is Vccp−Vref−n·Vthn. Also when the potential level of the available reference potential Vref is higher than the array source potential Vccs, a necessary source potential can be formed to limit the amplitude of the output signal of the write buffer WB, similarly to the aforementioned modification 10. Since this structure is formed by the n-channel MOS transistors alone, the MOS transistors for amplitude limitation can be formed in the same well region, to reduce the element occupying area.

[Modification 12]

Figure 9I:
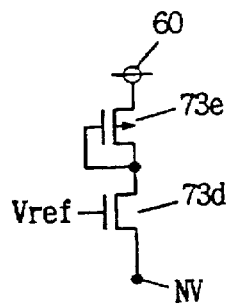

FIG. 9I illustrates the structure of a modification 12 of the write buffer. Referring to FIG. 9I, a p-channel MOS transistor 73e operating in a source follower mode is connected to a Vccp supply node 60. An n-channel MOS transistor 73d operating in a source follower mode which receives a reference potential Vref at its gate is provided between the MOS transistor 73e and an internal source node NV. In this case, only the positions of the MOS transistors are exchanged as compared with the structure shown in FIG. 9E, and hence an effect similar to the above can be attained. Further, the substrate potential of the MOS transistor 73e can be readily set at the potential level of a peripheral circuit source potential Vccp (since the substrate is coupled to the Vccp supply node 60).

[Modification 13]

Figure 9J:
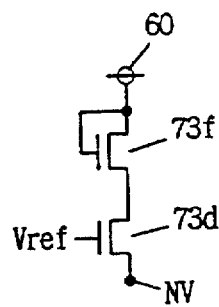

FIG. 9J illustrates the structure of a modification 13 of the write buffer. Referring to FIG. 9J, an n-channel MOS transistor 73f operating in a source follower mode is connected to a Vccp supply node 60. An n-channel MOS transistor 73d which receives a reference potential Vref at its gate and operates in a source follower mode is provided between the MOS transistor 73f and an internal source node NV. In the structure shown in FIG. 9J, only the positions of the MOS transistors are exchanged as compared with the structure shown in FIG. 9H, and hence an effect similar to the above can be attained.

The structure for amplitude limitation shown in each of FIGS. 9C to 9H can be combined with the structure shown in FIG. 8A or 8B. Namely, the structures for amplitude limitation shown in FIGS. 9C to 9H may be applied in place of the amplitude limiting MOS transistors shown in FIGS. 8A and 8B.

According to the embodiment 1, as hereinabove described, the amplitude of the output signal of the write buffer operating through the peripheral circuit source potential Vccp is limited, whereby the array source potential Vccs can be made lower than the peripheral circuit source potential Vccp, and a semiconductor memory device stably operating with low power consumption can be implemented.

[Embodiment 2]

Figure 10:
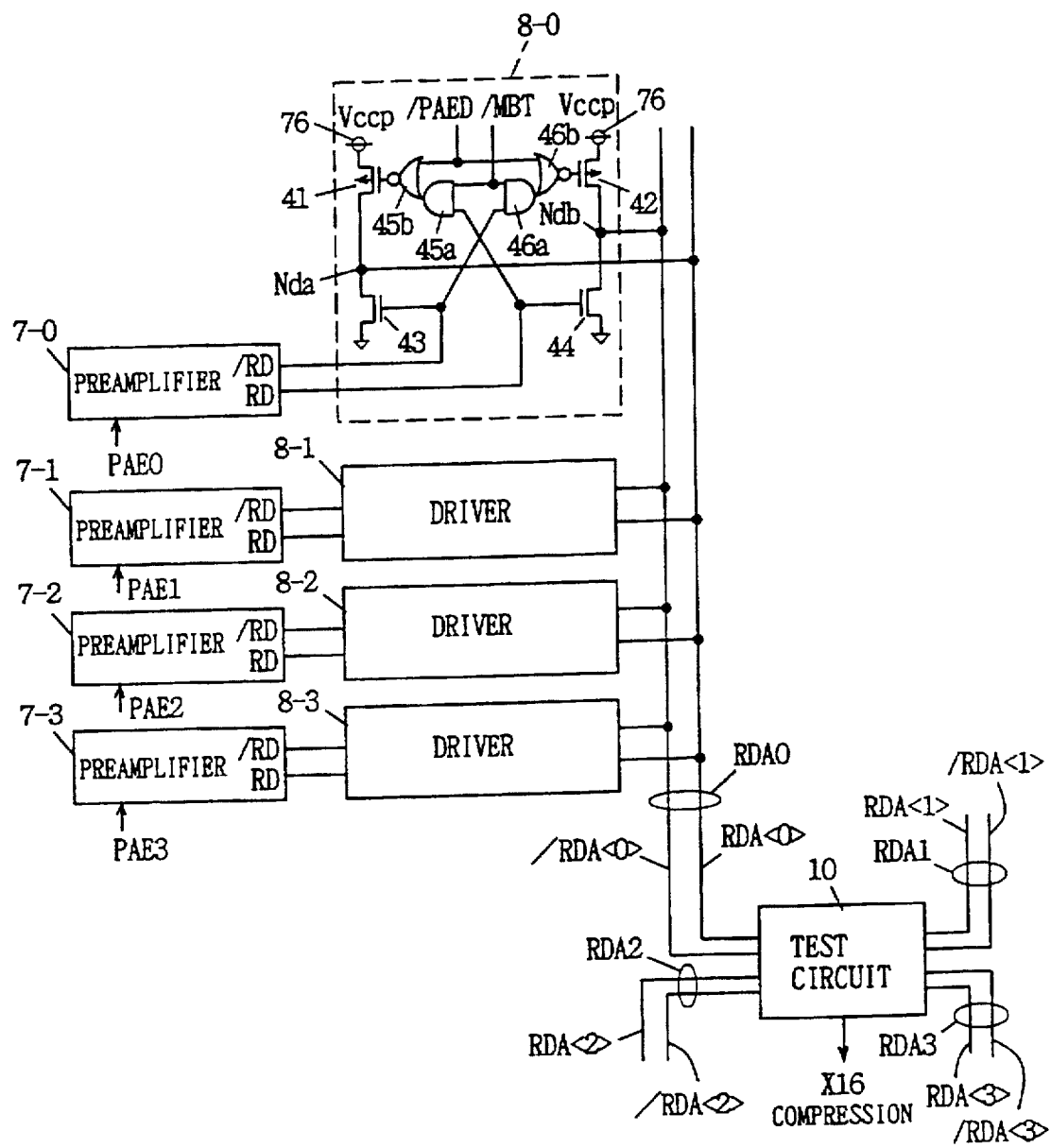
FIG. 10 illustrates the structure of a data read part according to an embodiment 2 of the present invention.

FIG. 10 illustrates the structure of an internal data read part according to an embodiment 2 of the present invention. This figure representatively shows preamplifiers 7-0 to 7-3 and drivers 8-0 to 803 which are provided for one memory cell array. The preamplifiers 7-0 to 7-3 are provided in correspondence to column groups CG0 to CG3 of a memory cell array 2a (see FIG. 1) respectively, and activated in response to preamplifier enable signals PAE0 to PAE3, respectively. The structure of the preamplifiers 7-0 to 7-3 is described later in detail.

The drivers 8-0 to 8-3 which are provided in correspondence to the preamplifiers 7-0 to 7-3 respectively are identical in structure to each other. FIG. 10 representatively shows the structure of the driver 8-0. The driver 8-0 includes an AND circuit 45a which receives an internal read data signal RD from the preamplifier 7-0 and a test mode indication signal /MBT, an AND circuit 46a which receives an internal read data signal /RD from the preamplifier 7-0 and a test mode indication signal /MBT, a NOR circuit 45b which receives an output signal of the AND circuit 45a and a driver enable signal /PAED, a NOR circuit 46b which receives an output signal of the AND circuit 46a and the driver enable signal /PAED, a p-channel MOS transistor 41 which is connected between a peripheral circuit source potential Vccp supply node 76 and a node Nda and received an output signal of the NOR circuit 45b at its gate, a p-channel MOS transistor 42 which is connected between the Vccp supply node 76 and a node Ndb and receives an output signal of the NOR circuit 46b at its gate, an n-channel MOS transistor 43 which is connected between the node Nda and a ground node and receives the internal read data signal /RD from the preamplifier 7-0 at its gate, and an n-channel MOS transistor 44 which is connected between the node Ndb and the ground node and receives the internal read signal RD at its gate.

The AND circuit 45a and the NOR circuit 45b as well as the AND circuit 46a and the NOR circuit 46b are formed by composite gates, thereby reducing the circuit occupying area. The node Nda is connected to an internal read data bus line RDA<0>, and the node Ndb is connected to an internal data bus line /RDA<0>. The internal read data bus lines RDA<0> and /RDA<0> form an internal read data bus RDA0. Namely, the drivers 8-0 to 8-3 are wired-OR connected to the data bus RDA0. The operation is now described.

In a normal operation mode, the test mode indication signal /MBT is fixed at a high level. Therefore, the AND circuits 45a and 46b serve as buffers. In a standby cycle, both of the internal read data signals RD and /RD which are outputted from the preamplifiers 7-0 to 7-3 are at low levels. In this state, both of the MOS transistors 43 and 44 are in OFF states. The driver enable signal /PAED is at a high level of an inactive state, and the output signals of the NOR circuits 45b and 46b are at low levels. Therefore, the p-channel MOS transistors 41 and 42 enter ON states, and both of the internal read data bus lines RDA<0> and /RDA<0> are precharged to the peripheral circuit source potential Vccp level through the nodes Nda and Ndb.

In data reading, any one of the preamplifier enable signals PAE0 to PAE3 for the preamplifiers 7-0 to 7-3 is set to a high level of an active state (in accordance with a selected column group). It is assumed here that the preamplifier enable signal PAE0 for the preamplifier 7-0 is set to a high level. The internal read data signals RD and /RD are complementary signals, whereby one of the MOS transistors 43 and 44 enters an ON state and the other one is brought into an OFF state. In response to the activation of the preamplifier enable signal PAE0, the driver enable signal /PAED is set to a low level of an active state. Thus, the NOR circuits 45b and 46b serve as inverters, and one of the p-channel MOS transistors 41 and 42 is brought into an OFF state and the other one maintains an ON state. Assuming that the read data signal RD is at a high level, the MOS transistors 44 and 41 enter ON states, the MOS transistors 42 and 43 enter OFF states, the internal read data bus line /RDA<0> is discharged to the ground potential level through the MOS transistor 44, and the internal read data bus line RDA<0> is maintained at the potential Vccp level by the MOS transistor 41. Thus, complementary read data signals are transmitted to the internal read data bus lines RDA<0> and /RDA<0>.

In a test operation mode, the test mode indication signal /MBT is brought into an active state of a low level. In this state, both of the AND circuits 45a and 46a output low-level signals. When the driver enable signal /PAED is set to a low level of an active state, therefore, the output signals of the NOR circuits 45b and 46b are brought to high levels, and both of the MOS transistors 41 and 42 are brought into OFF states. In the test operation mode, all preamplifier enable signals PAE0 to PAE3 are set to high levels of active states, through a structure described later. In each of the drivers 8-0 to 8-3, therefore, one of the MOS transistors 43 and 44 is brought into an ON state, and the other one is brought into an OFF state. The internal read data bus lines RDA<0> and /RDA<0> are precharged at the source potential Vccp level by the MOS transistors 41 and 42.

When data signals of the same logic are read from the preamplifiers 7-0 to 7-3 in the test operation, the output signals of the drivers 8-0 to 8-3 have the same logic. Therefore, one of the internal read data bus lines RDA<0> and /RDA<0> is discharged to the ground potential level, and the other one maintains the precharge potential. When a defective memory cell is present, the data signals read from the preamplifiers 7-0 to 7-3 are incoincident in logic to each other. In this case, therefore, in the drivers 8-0 to 8-3, at least one driver having the MOS transistor 44 brought into ON state and the remaining drivers having the MOS transistors 43 which are brought into ON states are mixedly present, and both of the internal read data bus lines RDA<0> and /RDA<0> are discharged to the ground potential level.

The driver circuits 8-0 to 8-3 are so wired-OR connected to the internal read data bus lines RDA<0> and /RDA<0> that these driver circuits 8-0 to 8-3 operate in parallel with each other to drive the read data bus lines RDA<0> and /RDA<0> to the ground potential level or maintain the same at the precharge potential Vccp in accordance with the read data signals supplied from the corresponding preamplifiers 7-0 to 7-3. Thus, coincidence/incoincidence of the logics of the data of 4-bit memory cells can be readily identified.

The driver enable signal /PAED is simultaneously supplied to the drivers 8-0 to 8-3. In a non-selected preamplifier in the normal mode operation, both of the outputted read data signals RD and /RD are at low levels, and the MOS transistors 43 and 44 maintain OFF states. As to a non-selected column group, therefore, both of the output signals of the NOR circuits 45b and 46b are set to high levels and the p-channel MOS transistors 41 and 42 are brought into OFF states when the driver enable signal /PAED is set to a low level of an active state. Therefore, a driver provided for the non-selected column group is brought into an output high impedance state in the normal mode operation mode, thereby exerting no bad influence on reading of data from a column group selected in the normal mode operation although the drivers 8-0 to 8-3 are wired-OR connected to the internal read data bus lines RDA<0> and /RDA<0>.

According to the structure shown in FIG. 10, no first test circuit is necessary for identifying coincidence/incoincidence of the logics of the data signals which are read from the preamplifiers 7-0 to 7-3 dissimilarly to the prior art, whereby the circuit occupying area is reduced as interconnection lines for transmitting signals indicating test results are unnecessary, and the interconnection occupying area is reduced.

[Structure of Test Circuit]

A test circuit 10 identifies whether or not a defective memory cell is included in 16-bit memory cells in total which are selected from four memory cell arrays, in accordance with the signal potentials of the internal read data buses RDA0 to RDA3.

Figure 11A:
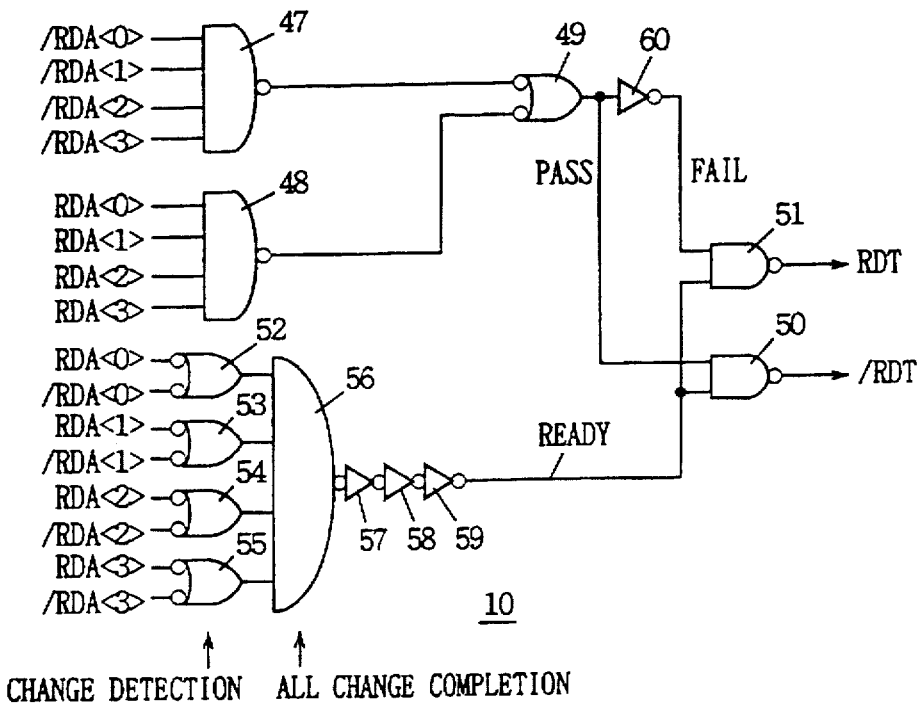
FIG. 11A illustrates a specific structure of a test circuit shown in FIG. 10.

FIG. 11A illustrates the structure of the test circuit 10. Referring to FIG. 11A, the test circuit 10 includes a NAND circuit 47 which receives signals /RDA<0> to /RDA<3> on the internal read data bus lines, a NAND circuit 48 which receives signals RDA<0> to RDA<3> on the internal read data bus lines, a NAND circuit 49 which receives output signals from the NAND circuits 47 and 48, and an inverter 60 which receives an output signal of the NAND circuit 49. The read data bus lines and the signal potentials transmitted onto the same are denoted by the same symbols. The NAND circuit 47 outputs a low-level signal when all of the read data signals /RDA<0> to /RDA<3> are at high levels. The NAND circuit 48 outputs a low-level signal when all of the signals RDA<0> to RDA<3> are at high levels. The NAND circuit 49 sets its output signal PASS to a high level when one of the NAND circuits 47 and 48 outputs a low-level signal.

The test circuit further includes a NAND circuit 52 which receives the signals RDA<0> and /RDA<0>, a NAND circuit 53 which receives the signals RDA<1> and /RDA<1>, a NAND circuit 54 which receives the signals RDA<2> and /RDA<2>, a NAND circuit 55 which receives the signals RDA<3> and /RDA<3>, a NAND circuit 56 which receives output signals from the NAND circuits 52 to 55, and three stages of cascade-connected inverters 57, 58 and 59 which receive an output signal of the NAND circuit 56. Each of the NAND circuits 52 to 55 detects a point of time when one of the corresponding data signals goes low. The NAND circuit 56 detects a point of time when all of the NAND circuits 52 to 55 output high levels, i.e., when signals to be changed are changed to the ground potential level in all of the internal read data buses RDA0 to RDA3. The inverter 59 outputs a signal READY determining an output timing of a signal indicating a result of a discrimination.

The test circuit 10 further includes a NAND circuit 50 which receives the output signal of the NAND circuit 49 and the signal READY, and a NAND circuit 51 which receives the output signal of the inverter 60 and the signal READY.

The NAND circuit 50 outputs a signal /RDT, and the NAND circuit 51 outputs a signal RDT. The operation of the test circuit 10 shown in FIG. 11A is now described with reference to FIG. 11B which is an operation waveform diagram thereof.

Figure 11B:
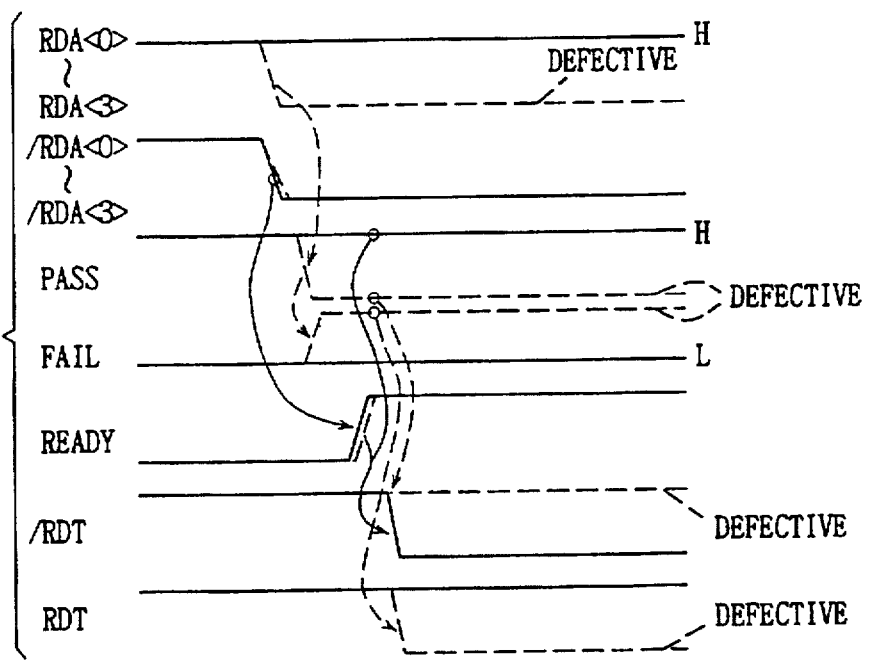
FIG. 11B is a waveform diagram representing the operation of the test circuit.

FIG. 11B shows operation waveforms in the case of reading high-level data on the read data bus lines RDA<0> to RDA<3>, for example.

In a standby state, all of the signals RDA<0> to RDA<3> and /RDA<0> to /RDA<3> are precharged at high levels (see the MOS transistors 41 and 42 in FIG. 10). Therefore, both the output signals of the NAND circuits 47 and 48 are at low levels, the signal PASS is at a high level, and a signal FAIL is at a low level. On the other hand, all output signals of the NAND circuits 52 to 55 are at low levels, the output signal of the NAND circuit 56 is at a high level, and the signal READY is at a low level. Therefore, the signals RDT and /RDT are also set at high levels.

When a test operation is started to read memory cell data, the signals RDA<0> to RDA<3> are held at high levels while the signals /RDA<0> to /RDA<3> are discharged to low levels if all selected memory cells are normal. In response to the lowering of the signals /RDA<0> to /RDA<3> to low levels, the NAND circuit 47 outputs a high-level signal. The output signal of the NAND circuit 48 is at a low level, the signal PASS from the NAND circuit 49 maintains the high level, and the signal FAIL from the inverter 60 maintains the low level.

When all of the signals /RDA<0> to /RDA<3> are discharged to low levels, all output signals of the NAND circuits 52 to 55 are brought to high levels, and the output signal of the NAND circuit 56 falls to a low level in response. After a lapse of delay times provided by the inverters 57 to 59, the signal READY rises to a high level. In response to this rise of the signal READY, the NAND circuits 50 and 51 are enabled, the signal /RDT falls to a low level, and the signal RDT maintains a high level.

When the selected memory cells include a defective memory cell, on the other hand, all signals on the internal read data bus RDA (RDA0 to RDA3) provided for the memory cell array including this defective memory cell are brought to low levels. Therefore, at least one of the signals RDA<0> to RDA<3> is lowered to a low level as shown by a broken line, and at least one of the signals /RDA<0> to /RDA<3> is also lowered to low levels. When a defective memory cell is present, the number of the MOS transistors discharging the internal read data buses is reduced as compared with that in the normal state, and hence FIG. 11B shows the discharge speed of at least one of the signals /RDA<0> to /RDA<3> as being delayed, as shown by a broken line.

Thus, both output signals of the NAND circuits 47 and 48 go high, the signal PASS is brought to a low level as shown by a broken line, and the signal FAIL rises to a high level as shown by a broken line.

The signal READY rises to a high level after all internal read data buses RDA<0> to RDA<3> are completely discharged. In response to the rise of the signal READY, the NAND circuits 50 and 51 are enabled, while the signal /RDT maintains a high level and the signal RDT is brought to a low level, as shown by broken lines.

Each of the read data buses RDA0 to RDA3 transmits data of 4-bit memory cells in a compressed manner. In this test circuit 10, therefore, defects/non-defects of 16-bit memory cells in total can be identified by identifying coincidence/incoincidence of the logics of the potentials of the respective signal lines.

[Modification of Test Circuit]

Figure 12:
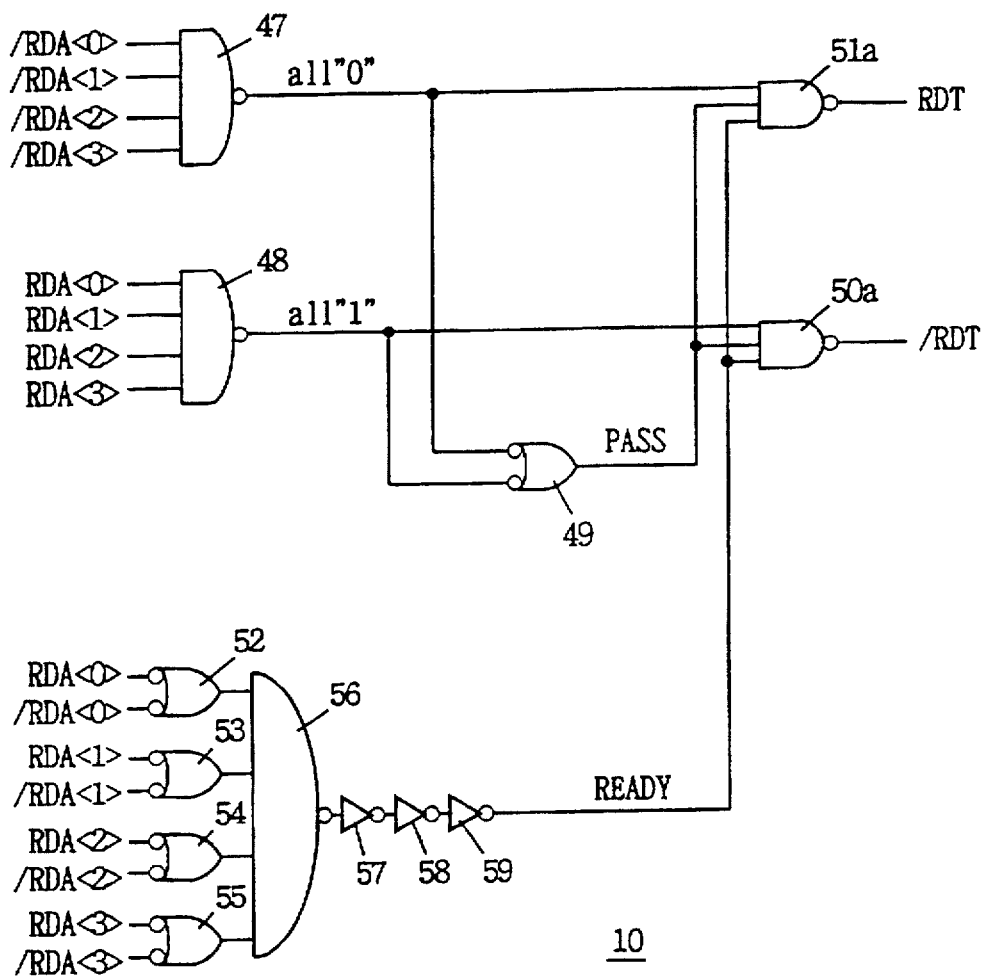
FIG. 12 illustrates a modification of the test circuit.

FIG. 12 illustrates the structure of a modification of the test circuit 10. In the test circuit 10 shown in FIG. 12, 3-input NAND circuits 51a and 50a are provided for outputting signals RDT and /RDT indicating discrimination results. The NAND circuit 50a receives output signals of NAND circuits 48 and 49 and a timing signal READY. The NAND circuit 51a receives output signals of NAND circuits 47 and 49 and the timing signal READY. Structures for discriminating coincidence/incoincidence of logics of signal potentials on internal read data bus lines RDA0 to RDA3 and discriminating data signal potential determination timings are identical to those shown in FIG. 11A, and corresponding parts are denoted by the same reference numerals. The operation is now briefly described.

The NAND circuit 47 outputs a low-level signal when all signals /RDA<0> to /RDA<3> are at high levels, i.e., memory cell data are "0". On the other hand, the NAND circuit 48 outputs a low-level signal when all signals RDA<0> to RDA<3> are at high levels, i.e., all selected memory cell data are "1". The timing signal READY which is formed by the NAND circuits 52 to 56 and inverters 57 to 59 is set to a high level when the signal potentials are lowered to low levels in the internal read data buses. When all selected memory cells are normal (non-defective), one of the output signals of the NAND circuits 47 and 48 is brought to a low level, and the other one is brought to a high level. Consider that all signals RDA<0> to RDA<3> are at high levels. In this case, the output signal of the NAND circuit 48 is brought to a low level, while that of the NAND circuit 47 is brought to a high level. A signal PASS outputted from the NAND circuit 49 is at a high level in this state. When the timing signal READY is brought to a high level, therefore, the signal RDT outputted from the NAND circuit 51a is brought to a low level, while the signal /RDT outputted from the NAND circuit 50a is brought to a high level.

When all signals RDA<0> to RDA<3> are at low levels, on the other hand, the output signal of the NAND circuit 47 is at a low level, and that of the NAND circuit 48 is at a high level. In this state, therefore, the signal /RDT outputted from the NAND circuit 50a is brought to a low level and the output signal of the NAND circuit 51a is brought to a high level when the signal PASS from the NAND circuit 49 and the timing signal READY are brought to high levels. When the selected memory cells include a defective memory cell, therefore, both output signals of the NAND circuits 47 and 48 are at high levels. In this case, the signal PASS from the NAND circuit 49 is brought to a low level, whereby both of the signals /RDT and RDT outputted from the NAND circuits 50a and 51a are brought to high levels.

When the signals RDT and /RDT are read to the exterior of the device through an output buffer in a state including defective and bon-defective memory cells, an output high impedance state is attained. When the logics of the data of the selected memory cells are identical to each other, on the other hand, a signal indicating the logic is outputted. Thus, pass/fail of the memory cells can be discriminated and the data stored in the memory cells can also be identified. When all of the selected memory cells are defective, therefore, an identification can be made as to whether all selected memory cells are defective by comparing the read data with test data (write data) in the exterior of the device, thereby correctly discriminating pass/fail of the memory cells.

Figure 13:
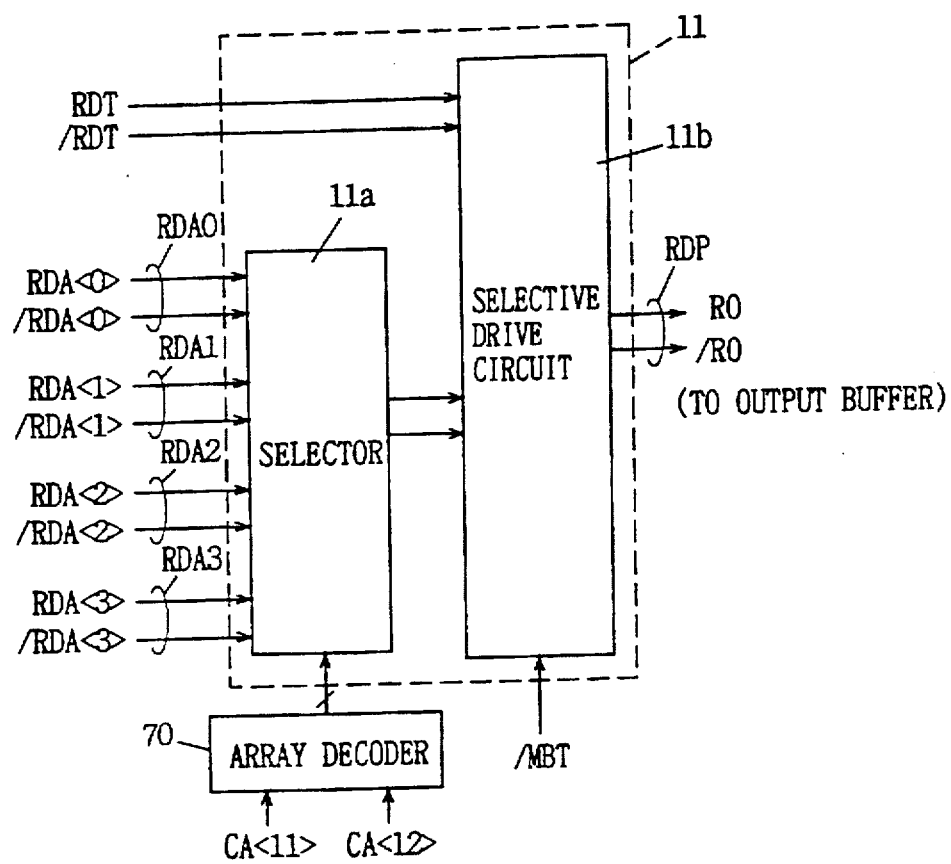
FIG. 13 illustrates the circuit structure of a driver shown in FIG. 1.

FIG. 13 schematically illustrates the structure of a driver 11 for selectively transmitting the output signals RDT and /RDT from the test circuit 10 to the output buffer. Referring to FIG. 13, the driver 11 includes a selector 11a which selects one of the internal read data buses RDA0 to RDA3 in accordance with a memory cell array selection signal from an array decoder 70, and a selective drive circuit 11b which selects either the output data RDT and /RDT from the test circuit or output signals from the selector 11a, forms internal output signals RO and /RO and transmits the same to the output buffer.

The array decoder 70, which is identical in structure to that shown in FIG. 6, decodes address signal bits CA<11> and CA<12> and forms the array selection signal designating one of four memory cell arrays 2a to 2d. The selector 11a selects an internal read data bus (read data signal thereon) which is provided in correspondence to the memory cell array designated by the array selection signal from the array decoder 70.

The selective drive circuit 11b selects data signals supplied from the selector 11a in inactivation of the test mode indication signal /MBT, and selects test result indication signals RDT and /RDT supplied from the test circuit when the test mode indication signal /MBT is at a low level of an active state. This selective drive circuit 11b includes a drive stage for driving an internal output bus RDB in its output part.

Due to the driver 11 shown in FIG. 11, the test result indication signals can be transmitted to the output buffer through the internal output data bus RDB which is employed for the normal mode operation, whereby no dedicated interconnection lines for transmitting the test result indication signals are necessary and the interconnection area is reduced.

Figure 14:
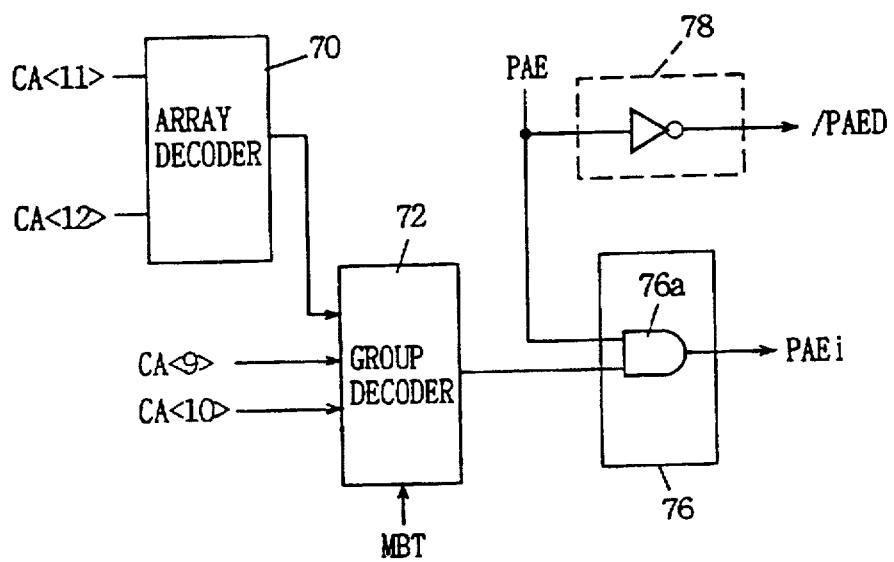
FIG. 14 schematically shows the structure of a preamplifier enable signal generation circuit.

FIG. 14 schematically illustrates the structure of a preamplifier enable signal generation part. Referring to FIG. 14, the preamplifier enable signal generation part includes the array decoder 70 which receives the address signal bits CA<11> and CA<12>, a group decoder 72 which receives the array selection signal from the array decoder 70 and address signal bits CA<9> and CA<10>, and a signal generation circuit 76 which receives an output signal of the group decoder 72 and a preamplifier activation signal PAE and generates a preamplifier enable signal PAEi. The array decoder 70 and the group decoder 72 are identical in structure to those shown in FIG. 6 respectively. The group decoder 72 brings all column groups into selected states when the test mode indication signal MBT is at a high level of an active state. Thus, all column groups are brought into selected states for all memory cell arrays. The signal generation circuit 76 is provided in correspondence to each column group, and the preamplifier enable signal PAEi for a selected column group of a selected memory cell array is brought to a high level of an active state when both of the preamplifier activation signal PAE and a column group selection signal from the group decoder 72 are brought to high levels.

A driver enable signal /PAED is outputted from an inversion circuit 78 which receives and inverts the preamplifier activation signal PAE. This driver enable signal /PAED is supplied in common to all drivers. Thus, a driver corresponding to a non-selected column group maintains a standby state, and is prevented from precharging its wired-OR connected internal read data bus to the source potential Vccp level.

When the preamplifier activation signal PAE is delayed to form the driver enable signal /PAED (through inverter delay), the driver 8 can be enabled in such a state that the output signal of the preamplifier is ascertained, whereby no data of an indeterminate state by transient response of the preamplifier is transferred to the internal read data. Thus, the potentials of the internal read data buses RDA0 to RDA3 can be prevented from being lowered by such an indeterminate state, whereby pass/fail of the memory cells can be correctly discriminated through a single test circuit which is provided in common for all memory cell arrays.

|Embodiment 3: Structure of Preamplifier|

Figure 15:
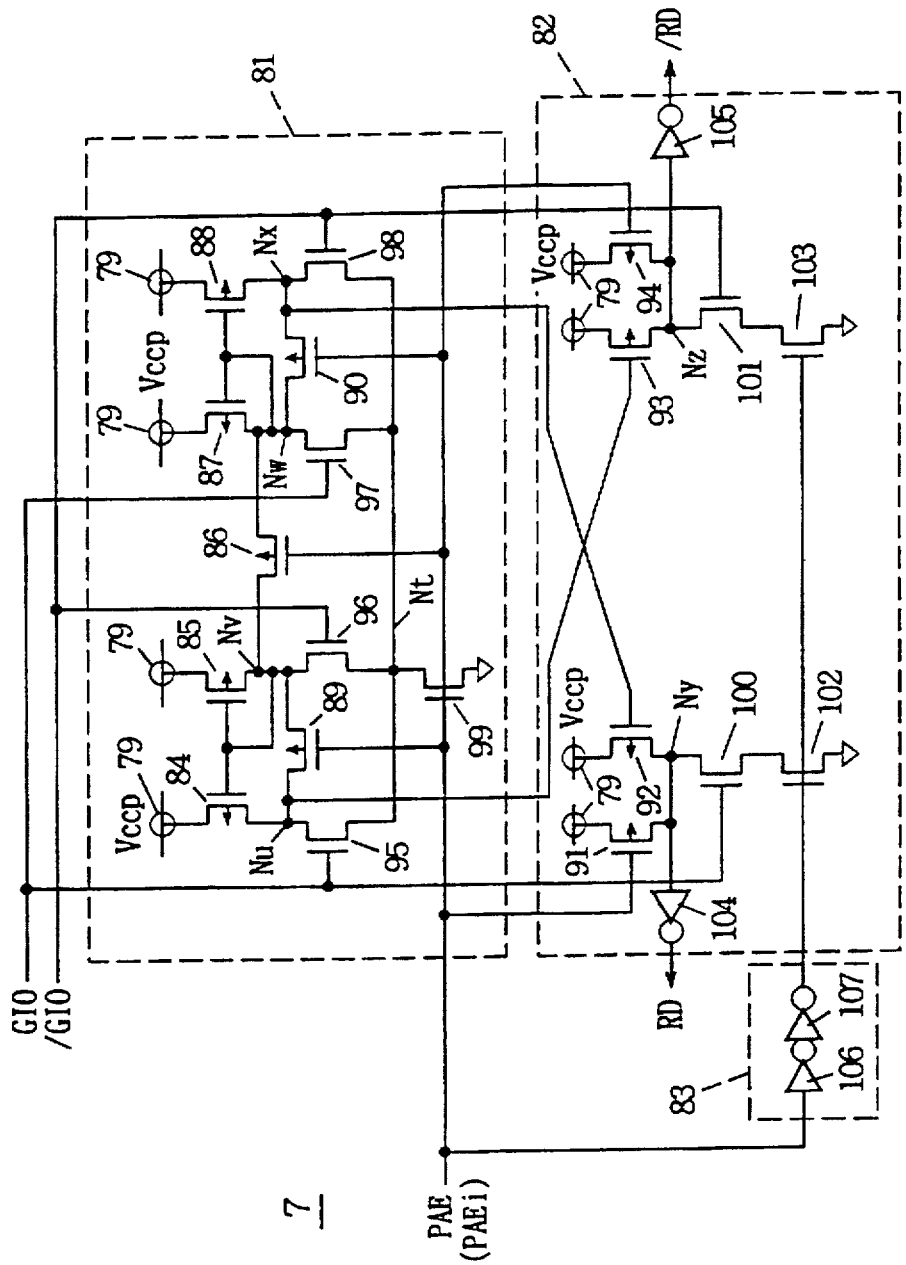
FIG. 15 illustrates the structure of a preamplifier according to an embodiment 3 of the present invention.

FIG. 15 illustrates an exemplary structure of a preamplifier 7. Referring to FIG. 15, the preamplifier 7 includes a first amplifier 81 which is activated in response to a preamplifier enable signal PAE (PAEi) and amplifies data on global I/O lines GIO and /GIO, and a second amplifier 82 which is brought into an active state in response to a delayed signal of the preamplifier enable signal PAE and further amplifies output signals of the first amplifier 81. Output signals RD and /RD of the second amplifier 82 are supplied to a corresponding driver 8. Symbol PAE is employed for indicating all operations of the preamplifier 7.

In a test operation, a corresponding read data bus RDA is precharged at a high level, and this precharged internal read data bus line is discharged, so that compressed data of memory cells are transmitted onto the read data bus RDA. When the preamplifier 7 outputs indeterminate data by transient response or both of its output signals RD and /RD go high, both of corresponding read data bus lines RDA<i> and /RDA<i> are discharged even if the preamplifier 7 outputs correct data signals after completion of the transient response, and a signal PASS indicating a test result is brought to a low level, a signal FAIL goes high, and there is such a possibility that presence of a defective memory cell is discriminated even if there is no such defective memory cell. When the second amplifier 82 is brought into an active state after the output signals from the amplifier 81 are ascertained as shown in FIG. 15, however, the driver 8 can be prevented from being driven by a false data signal resulting from transient response of the preamplifier, whereby the test operation can be correctly performed.

The preamplifier is formed by a plurality of stages of amplifiers, so that output loads of the respective amplifiers can be successively increased and small amplitude signals are successively amplified and high-speed amplification can be performed as a result, as compared with a structure of amplifying an input signal by one amplifier.

The first amplifier 81 includes a p-channel MOS transistor 84 which is connected between a peripheral circuit source potential Vccp supply node 79 and a node Nu and has its gate connected to a node Nv, a p-channel MOS transistor 85 which is connected between the Vccp supply node 79 and the node Nv and has its gate connected to the node Nv, an n-channel MOS transistor 95 which is connected between the node Nu and a node Nt and has its gate connected to the global I/O line GIO, an n-channel MOS transistor 96 which is connected between the nodes Nv and Nt and has its gate connected to the global I/O line /GIO, a p-channel MOS transistor 89 which is connected between the nodes Nu and Nv and has its gate connected to receive a preamplifier enable signal PAE (PAEi), and an n-channel MOS transistor 99 which is connected between the node Nt and a ground node and has its gate connected to receive the preamplifier enable signal PAE. The MOS transistors 84 and 85 form a current mirror circuit, and the MOS transistor 85 forms a master stage of this current mirror circuit.

The first amplifier 81 further includes a p-channel MOS transistor 87 which is connected between the Vccp supply node 79 and a node Nw and has its gate connected to the node Nw, a p-channel MOS transistor 88 which is connected between the Vccp supply node 79 and a node Nx so that its gate is connected to the node Nw, an n-channel MOS transistor 97 which is connected between the nodes Nw and Nt and has its gate connected to the global I/O line GIO, an n-channel MOS transistor 98 which is connected between the nodes Nx and Nt and has its gate connected to the global I/O line /GIO, an n-channel MOS transistor 90 which is connected between the nodes Nw and Nx and has its gate connected to receive the preamplifier enable signal PAE, and a p-channel MOS transistor 96 which is connected between the nodes Nv and Nw and has its gate connected to receive the preamplifier enable signal PAE. The MOS transistors 87 and 88 form a current mirror circuit, and the MOS transistor 87 forms a master stage of this current mirror circuit.

The MOS transistor 89 conducts in inactivation (low level) of the preamplifier enable signal PAE, electrically short-circuits the nodes Nu and Nv, and equalizes the potentials of the same. The MOS transistor 90 conducts in inactivation of the preamplifier enable signal PAE, and electrically short-circuits the nodes Nw and Nx. The MOS transistor 86 conducts in inactivation of the preamplifier enable signal PAE, and electrically short-circuits the nodes Nv and Nw. Due to the MOS transistors 86, 89 and 90, the nodes Nu, Nv, Nw and Nx can be precharged at the same potential. Thus, all potentials of the internal nodes can be equalized (Vccp potential level in this embodiment) in inactivation of the first amplifier, whereby active states can be regularly started from the same operating point to perform amplification, offset of the internal node potentials resulting from deviation of manufacturing parameters etc. can be reliably prevented, and correct amplification can be performed.

Even if differences are caused between the conductances of the MOS transistors 95, 96, 97 and 98 when the potentials of the global I/O lines GIO and /GIO are not correctly equalized, the internal nodes Nu, Nv, Nw and Nx can be reliably brought to the same potential level thereby preventing output of invalid data signals (reverse data) in transient response.

The second amplifier 82 includes a p-channel MOS transistor 91 which is connected between the Vccp supply node 79 and a node Ny and has its gate connected to receive the preamplifier enable signal PAE, a p-channel MOS transistor 92 which is connected between the Vccp and the node Ny and has its gate connected to the node Nx, and n-channel MOS transistors 100 and 102 which are connected in series between the node Ny and a ground node. The gate of the MOS transistor 100 is connected to the global I/O line GIO, while that of the MOS transistor 102 is connected to receive the preamplifier enable signal PAE through a delay circuit 83. The delay circuit 83 includes two stages of inverters 106 and 107.

The second amplifier 82 further includes a p-channel MOS transistor 93 which is connected between the Vccp supply node 79 and a node Nz and has its gate connected to the node Nu, a p-channel MOS transistor 94 which is connected between the Vccp supply node 79 and the node Nz and has its gate connected to receive the preamplifier enable signal PAE, and n-channel MOS transistors 101 and 103 which are connected in series between the node Nz and a ground node. The gate of the MOS transistor 101 is connected to the global I/O line /GIO. The gate of the MOS transistor 103 is connected to receive the preamplifier enable signal PAE through the delay circuit 83.

Inverters 104 and 105 are provided for the nodes Ny and Nz respectively, so that preamplifier output signals RD and /RD are outputted from these inverters 104 and 105 respectively. The operation is now described.

In a standby cycle and in data writing, the preamplifier enable signal PAE is at a low level of an inactive state. In this state, the MOS transistor 99 is in an OFF state, and a path for feeding a current from the Vccp supply node 79 to the ground node is cut off in the first amplifier 81. At this time, all of the MOS transistors 86, 89 and 90 are in ON states, and all nodes Nu, Nv, Nw and Nx are maintained at the same potential (Vccp level). In the first amplifier 81, therefore, the potentials of the internal nodes related to signal output are reliably held at the same potential level.

In the second amplifier 82, on the other hand, the preamplifier enable signal PAE is at a low level, the MOS transistors 91 and 94 are brought into ON states, and the gates of the MOS transistors 92 and 93 are held at the precharge (equalization) potentials on the nodes Nx and Nu, to maintain OFF states. Therefore, the nodes Ny and Nz are precharged at the source potential Vccp level through the MOS transistors 91 and 94 respectively. In response, the output signals RD and /RD are held at low levels by the inverters 104 and 105.

In data reading, the global I/O lines GIO and /GIO are temporarily equalized. Thus, the gate potentials of the MOS transistors 95, 96, 97 and 98 are equalized to each other, and they provide the same conductances. Even if the operation characteristics of the MOS transistors 95 to 98 are varied, the nodes Nu, Nv, Nw and Nx are held at the gate potentials thereof, i.e., the peripheral circuit source potential Vccp level. Then, read data are transmitted onto the global I/O lines GIO and /GIO, and the preamplifier enable signal PAE is brought to a high level of an active state. At this time, the output signal from the delay circuit 83 still maintains a low level. Therefore, even if the read data are not correctly transmitted onto the global I/O lines GIO and /GIO when the preamplifier enable signal PAE is set to a high level, the MOS transistors 102 and 103 maintain OFF states and no discharge path is present in the second amplifier 82, whereby the nodes Ny and Nz maintain the precharge potential Vccp and the output data signals RD and /RD maintain low levels. Thus, output of invalid data is prevented in transient response of the preamplifier. Further, the output signals RD and /RD can be prevented from being brought to high levels by the amplification of the first amplifier 81, whereby the potential of the internal read data bus RDA can be prevented from lowering in the test operation.

When the preamplifier enable signal PAE is brought to a high level, the MOS transistor 99 is brought into an ON state in the first amplifier 81, for differentially amplifying data signals appearing on the global I/O lines GIO and /GIO. At this time, the amplifier 81 operates with the present potentials at the internal nodes Nu, Nv, Nw and Nx as operation starting potentials, whereby the amplifying operation can be regularly stably and correctly performed at a high speed with desired operation characteristics. It is assumed here that the potentials on the global I/O lines GIO and /GIO are at high and low levels respectively. In this state, the potentials of the nodes Nv and Nu are moved to high and low levels respectively, while those of the nodes Nw and Nx are moved to low and high levels respectively.

In the second amplifier 82, the MOS transistors 102 and 103 conduct when the output signal from the delay circuit 83 rises to a high level, to start an amplifying operation of the second amplifier 82. The MOS transistor 92 receives a high-level signal potential on the node Nx at its gate, while the MOS transistor 93 receives a signal potential on the node Nu at its gate. The MOS transistors 100 and 101 receive the signal potentials on the global I/O lines GIO and /GIO at the gates thereof respectively. The conductance of the MOS transistor 92 is smaller than that of the MOS transistor 93, while the conductance of the MOS transistor 100 is made larger than that of the MOS transistor 101. Therefore, the potential of the node Ny is lowered, and the output signal RD of the inverter 104 is brought to a high level. The potential of the node Nz is maintained at the source potential Vccp level by the MOS transistor 93. The signals RD and /RD having amplitudes of the source potential Vccp level are obtained by further amplifying the amplification signal of the first amplifier 81 by the second amplification circuit 82. A small amplitude output signal of the first amplification circuit 81 is amplified at a high speed.

In the structure of the preamplifier according to the embodiment 3, as hereinabove described, an electrically floating state of internal nodes can be prevented, offset of the internal potentials caused by variation in manufacturing parameters of the circuit components can be prevented, the operating points of the first and second amplifiers 81 and 82 can be made regularly constant for stably performing amplifying operations, and output of erroneous data caused by transient response such as invalid data can be prevented by equalizing all internal nodes in inactivation of the preamplifier. Further, the signal lines RDA<i> and /RDA<i> of the internal read data bus RDA can be prevented from reduction in potential in the test operation, thereby correctly discriminating pass/fail of the memory cells.

[Modification 1]

Figure 16A:
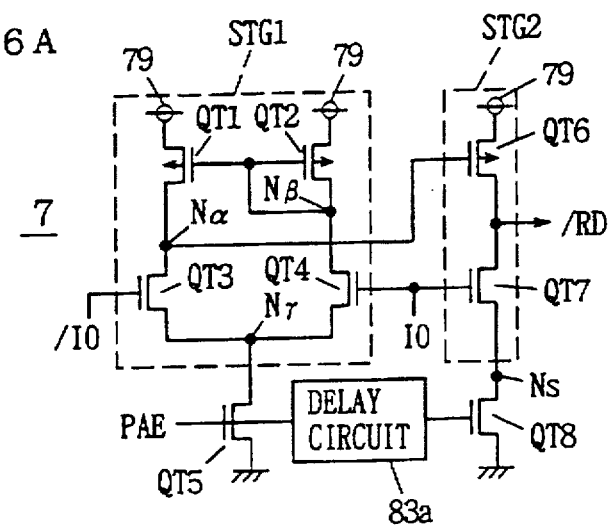
FIGS. 16A to 16C illustrate modifications of the preamplifier respectively.
Figure 30:
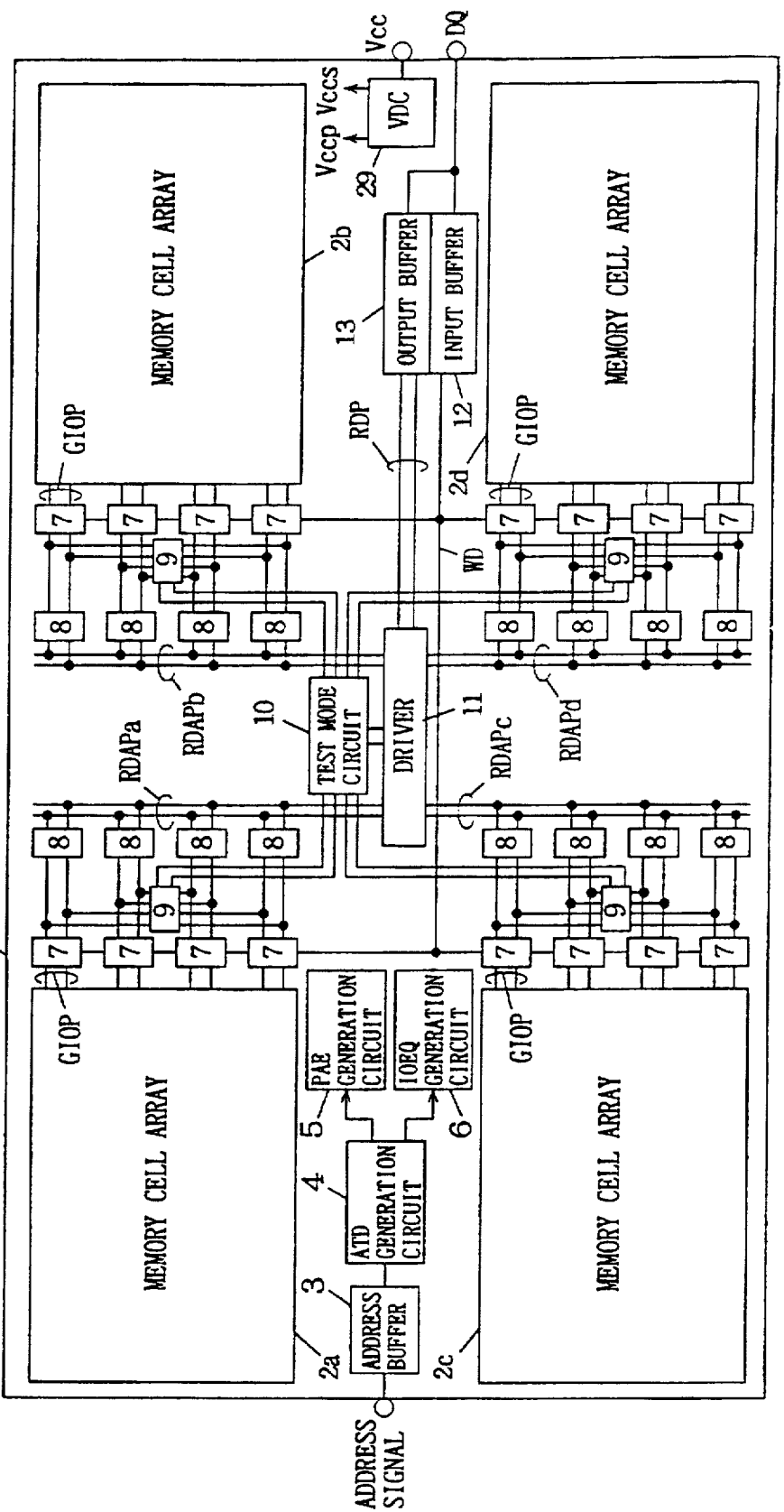
FIG. 30 schematically illustrates the overall structure of a conventional semiconductor memory device.
Figure 31:
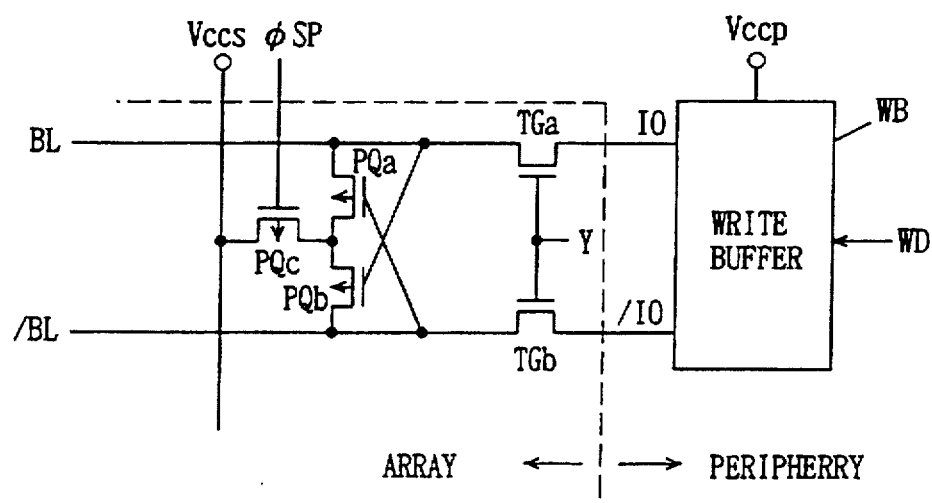
FIG. 31 schematically illustrates the structure of a data write part of the conventional semiconductor memory device.
Figure 32:
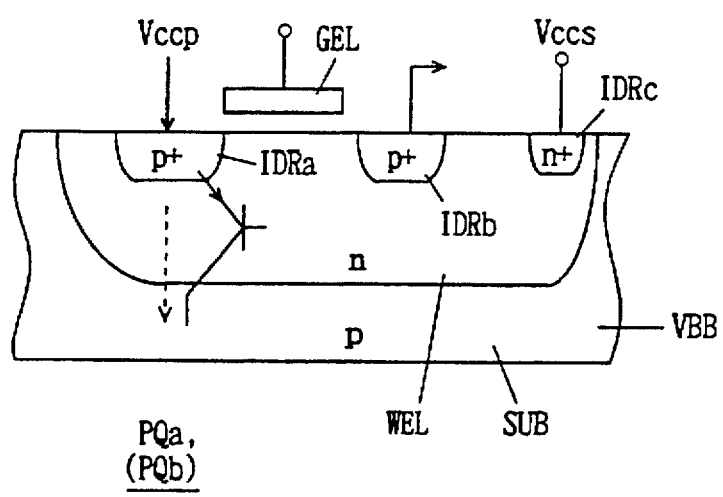
FIG. 32 illustrates a problem of the structure shown in FIG. 31.
Figure 33:
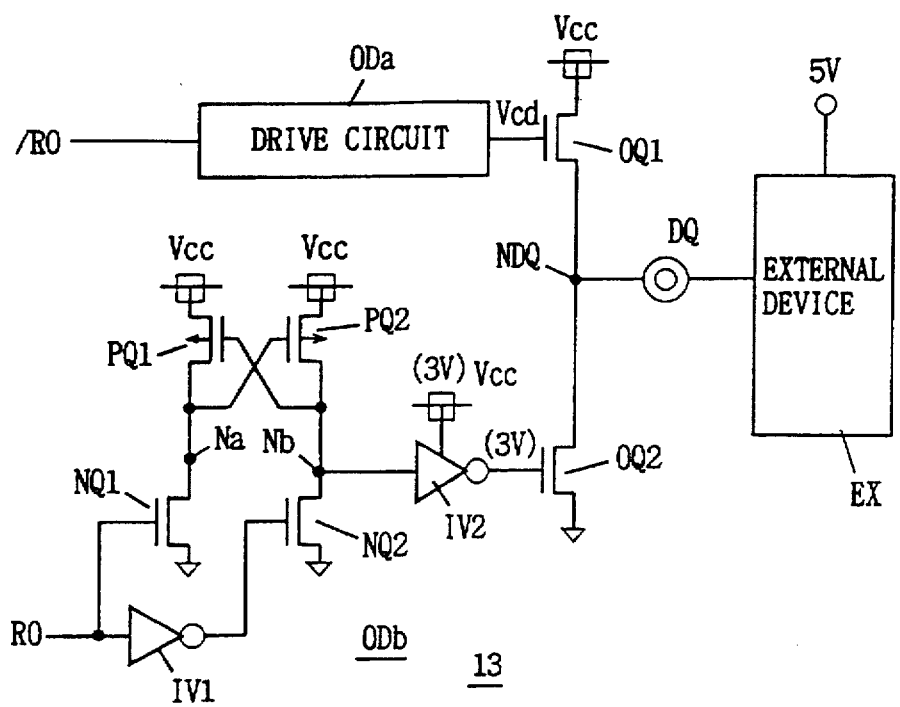
FIG. 33 illustrates the structure of an output buffer of the conventional semiconductor memory device.
Figure 34:
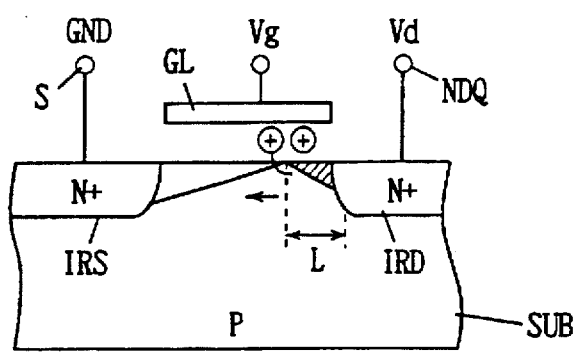
FIG. 34 illustrates a problem of the output buffer shown in FIG. 33.

FIG. 16A illustrates the structure of a modification 1 of the preamplifier according to the embodiment 3 of the present invention. FIG. 16A shows only the structure of a part generating a signal /RD. A part generating a signal RD is also readily implemented by a similar structure. In the following description, I/O bus lines IO and /IO are generically indicated since application to a general DRAM having no hierarchical I/O bus structure of global I/O buses and sub I/O buses is also intended. The structure of the following modification is also applicable to a DRAM having a structure such as that shown in FIG. 30. When the preamplifier shown in FIG. 16A is employed in place of the structure shown in FIG. 15, a reset transistor for fixing the signal /RD at a low level is provided, or an inverter which receives the signal /RD and a precharge transistor for precharging an input part of this inverter to a source potential Vccp level in inactivation of a preamplifier enable signal PAE are provided. In the modification shown in FIG. 16A, only an activation sequence for this preamplifier is considered and hence only a conceptual structure of the preamplifier is illustrated.

Referring to FIG. 16A, a preamplifier 7 includes a first amplification stage STG1 which is activated in response to a delayed preamplifier enable signal PAE, and a second amplification stage STG2 which is activated in response to the preamplifier enable signal PAE from a delay circuit 83a for amplifying an output signal of the first amplification stage STG1. The first amplification stage STG1 includes a p-channel MOS transistor QT1 which is connected between a Vccp supply node 79 and a node Nα so that its gate is connected to a node Nβ, a p-channel MOS transistor QT2 which is connected between the Vccp supply node 79 and the node Nβ and has its gate connected to the node Nβ, an n-channel MOS transistor QT3 which is connected between the node Nα and a node Nγ and has its gate connected to an I/O line /IO, and an n-channel MOS transistor QT4 which is connected between the nodes Nβ and Nγ and has its gate connected to an I/O line IO. The node Nγ is coupled to a ground node through an n-channel MOS transistor QT5 which receives the preamplifier enable signal PAE at its gate.

The second amplification stage STG2 includes a p-channel MOS transistor QT6 which is connected between the Vccp supply node 79 and an output node and has its gate connected to the node Nα, and an n-channel MOS transistor QT7 which is connected between a connection node and a node Ns and has its gate connected to the I/O line IO. An n-channel MOS transistor QT8 which receives the output signal of the delay circuit 83a delaying the preamplifier enable signal PAE at its gate is provided between the node Ns and the ground node.

In the structure of the preamplifier 7 shown in FIG. 16A, the first amplification stage STG1 is activated by the preamplifier enable signal PAE to amplify signal potentials on the I/O lines IO and /IO, and the second amplification stage STG2 is thereafter activated in accordance with the output signal of the delay circuit 83a to perform an amplifying operation. Also in indeterminate states of the signal potentials on the I/O lines IO and /IO, therefore, output of invalid data is prevented and correct internal read data can be reliably formed.

In inactivation of the preamplifier enable signal PAE, the nodes Nα and Nβ are precharged at the source potential Vccp level, and the MOS transistor QT6 of the second amplification stage STG2 is brought into an OFF state.

[Modification 2]

Figure 16B:
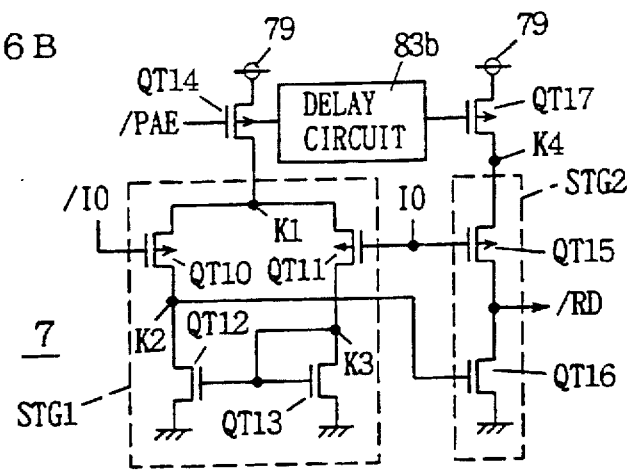

FIG. 16B illustrates the structure of a modification 2 of the preamplifier according to the embodiment 3 of the present invention. Also in FIG. 16B, a preamplifier 7 includes two amplification stages STG1 and STG2. The first amplification stage STG1 includes a p-channel MOS transistor QT10 which is connected between nodes K1 and K2 and has its gate connected to an I/O line /IO, a p-channel MOS transistor QT11 which is connected between nodes K1 and K3 and has its gate connected to an I/O line IO, an n-channel MOS transistor QT12 which is connected between a node KQ2 and a ground node and has its gate connected to a node K3, and an n-channel MOS transistor QT13 which is connected between the node K3 and the ground node its gate connected to the node K3. The node K1 is coupled to a Vccp supply node 79 through a p-channel MOS transistor QT14 which receives an inverted preamplifier enable signal /PAE at its gate.

The second amplification stage STG2 includes a p-channel MOS transistor QT15 which is connected between a node K4 and an output node and its gate connected to the I/O line IO, and an n-channel MOS transistor QT16 which is connected between the output node and the ground node and has its gate connected to the node K2. The node K4 is coupled to the Vccp supply node 79 through a p-channel MOS transistor QT17 which receives the inverted preamplifier enable signal /PAE at its gate through a delay circuit 83b.

When the preamplifier enable signal /PAE is at a high level of an inactive state, both of the MOS transistors QT14 and QT17 are brought into OFF states. The node K2 is maintained at the ground potential level, and the MOS transistor QT16 is brought into an OFF state. The MOS transistor QT17 enters an OFF state in accordance with an output signal of the delay circuit 83b.

When the preamplifier enable signal /PAE is brought to a low level of an active state in data reading, the MOS transistor QT14 conducts and the node K1 is charged to source potential Vccp level. The potential of the node K2 is changed in accordance with signal potentials on the I/O lines IO and /IO. After this potential change of the node K2, the output signal of the delay circuit 83b is brought to a low level, the MOS transistor QT17 enters an ON state, and the second amplification stage STG2 is brought into an active state. In accordance with the potential of the node K2, the MOS transistor QT16 discharges the output node at a high speed, or the MOS transistor QT15 charges the output node. Thus, correct data are outputted with no output of invalid or indeterminate data.

[Modification 3]

Figure 16C:
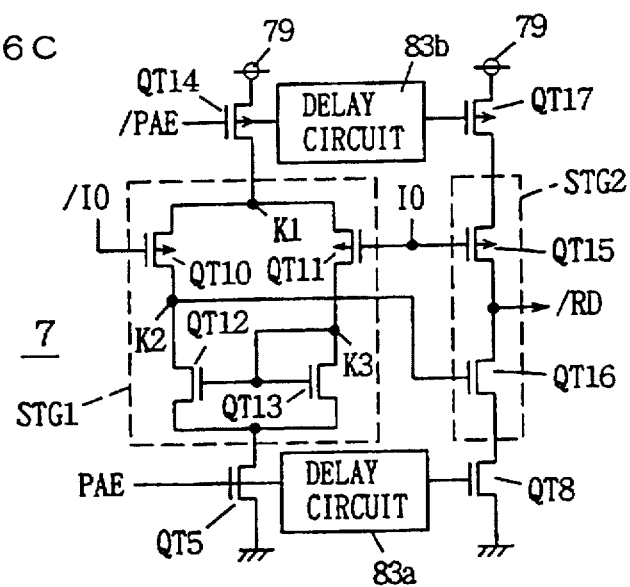

FIG. 16C illustrates the structure of a modification 3 of the preamplifier according to the present invention. The structure shown in FIG. 16C is different from that of FIG. 16B in a point that a MOS transistor QT5 which conducts in response to a preamplifier enable signal PAE is provided in a first amplification stage STG1 and a second amplification stage STG2 is provided with an n-channel MOS transistor QT8 which conducts in response to an output signal of a delay circuit 83a. The first and second amplification stages STG1 and STG2 are separated from a Vccp supply node 79 and a ground node in inactivation of preamplifier enable signals PAE and /PAE. Also in the structure shown in FIG. 16C, the second amplification stage STG2 is activated with a delay to the first amplification stage STG1 by the delay circuits 83a and 83b. Therefore, the second amplification stage STG2 performs an amplifying operation after an output signal of the first amplification stage STG1 is ascertained, whereby output of indeterminate data is prevented.

[Modification 4]

Figure 17A:
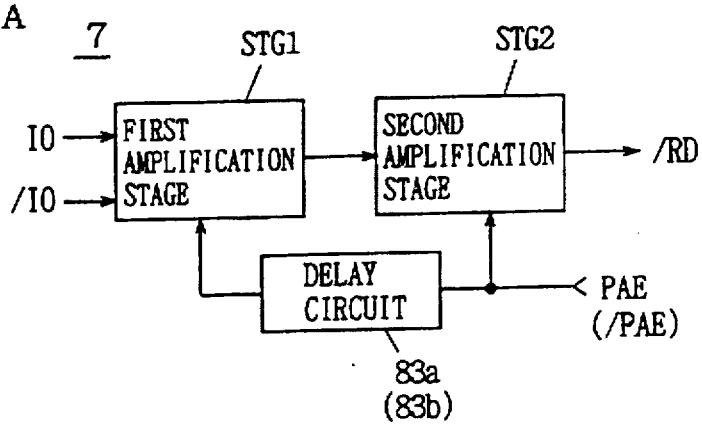
FIGS. 17A to 17C illustrate modifications of the preamplifier according to the embodiment 3 of the present invention respectively.

FIG. 17A illustrates the structure of a modification 4 of the preamplifier according to the embodiment 3 of the present invention. Referring to FIG. 17A, a preamplifier 7 includes two amplification stages STG1 and STG2. A delay circuit 83a (or 83b) delays a preamplifier enable signal PAE (or /PAE) and supplies the same to the first amplification stage STG1. In the structure shown in FIG. 17A, therefore, the second amplification stage STG2 is activated in advance, and then the first amplification stage STG1 is activated. These first and second amplification stages STG1 and STG2 may be in any of the structures shown in FIGS. 16A to 16C.

When the second amplification stage STG2 is activated in advance, the potential of an internal node of this second amplification stage STG2 is released from an electrically floating state, and then the first amplification stage STG1 is activated in accordance with the output signal of the delay circuit 83a (or 83b) to amplify signals on I/O lines IO and /IO. When the first amplification stage STG1 is activated, the signal potentials on the I/O lines IO and /IO are in ascertained states and no invalid data signal is outputted. Therefore, the second amplification stage STG2 performs an amplifying operation in accordance with the output signal of the first amplification stage STG1 and forms internal read data /RD at a high-speed. Thus, defined data is outputted from the first amplification stage STG1 after the potential of the internal node is ascertained, whereby the second amplification stage STG2 can be prevented from outputting an invalid data signal while an effective data signal can be outputted at a high speed.

[Modification 5]

Figure 17B:
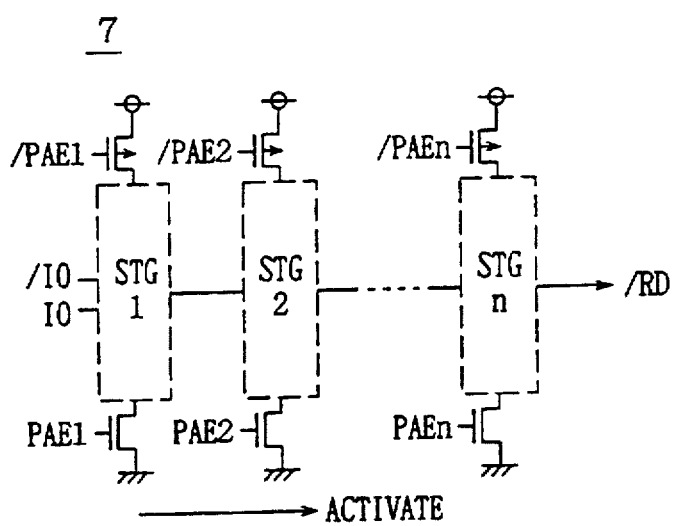

FIG. 17B illustrates the structure of a modification 5 of the preamplifier according to the embodiment 3 of the present invention. Referring to FIG. 17B, a number of, n, amplification stages STG1 to STGn are cascade-connected with each other. The amplification stages STGL to STGn are activated in response to preamplifier enable signals PAE1 and /PAE1 to PAEn and /PAEn. These amplification stages are successively activated starting from the initial amplification stage STG1. Also when a number of, n, amplification stages are provided, every subsequent amplification stage is activated after valid data is outputted, whereby the amplifying operation can be performed in accordance with the effective data, and output of invalid (undefined) data is prevented.

In the structure shown in FIG. 17B, each of the amplification stages STG1 to STGn may alternately be activated only by one of the activation signals PAE (PAE1 to PAEn) and /PAE (/PAE1 to /PAEn). Also in the preamplifier employing a number of, n, amplification stages, output of invalid (undefined) data can be prevented by successively activating the amplification stages.

[Modification 6]

Figure 17C:
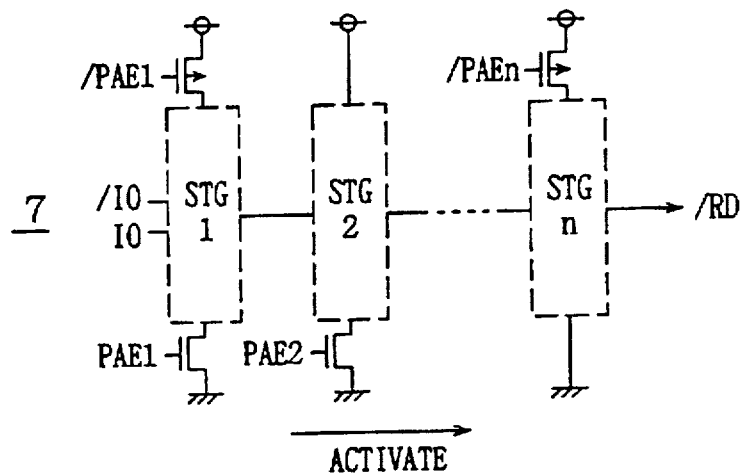

FIG. 17C illustrates the structure of a modification 6 of the preamplifier according to the embodiment 3 of the present invention. Referring to FIGS. 17C, a preamplifier 7 includes a number of, n, cascade-connected amplification stages STG1 to STGn. The initial amplification stage STG1 is activated by preamplifier enable signals PAE1 and /PAE, while the second amplification stage STG2 is activated by a preamplifier enable signal PAE2. The final amplification stage STGn is activated by a preamplifier enable signal /PAEn. Also when the amplification stages STG1 to STGn are different in structure from each other, output of invalid (indeterminate) data signals can be prevented by successively activating the stages starting from the initial amplification stage STG1, similarly to the above modification.

In each of the structures shown in FIGS. 17B and 17C, only the final amplification stage STGn may have a structure of a clocked inverter and the remaining amplification stages have structures of current mirror circuits. Alternatively, only the initial amplification stage STG1 may have a structure of a current mirror circuit, and all of the remaining amplification stages STG2 to STGn have structures of clocked inverters. Further alternatively, a plurality of current mirror type differential amplification circuits and a plurality of clocked inverters may be employed.

Each of the amplification stages of the structures shown in FIGS. 16A to 16C may be provided with an equalization transistor for equalizing in potential the internal nodes.

[Modification 7]

Figure 18A:
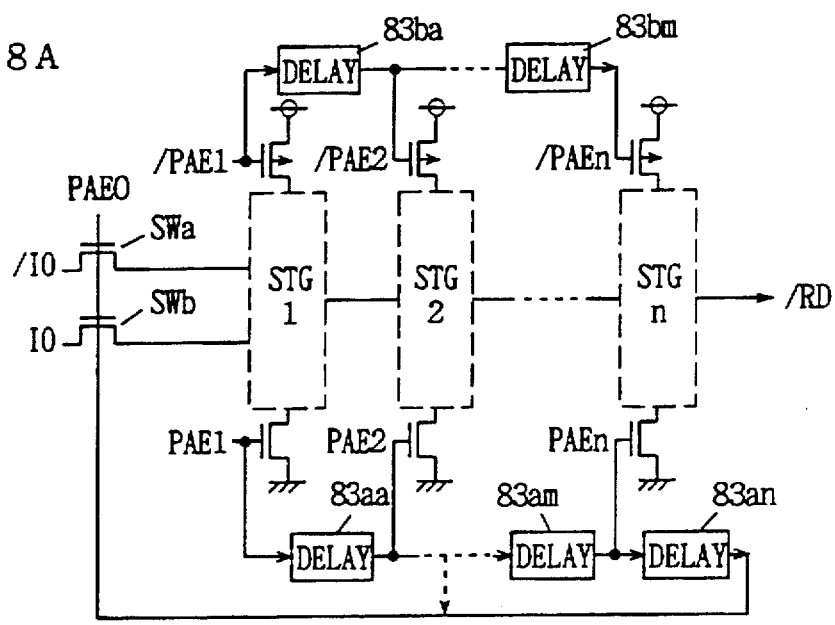
FIGS. 18A to 18C illustrate modifications of the preamplifier according to the embodiment 3 of the present invention respectively.

FIG. 18A illustrates the structure of a modification 7 of the preamplifier according to the embodiment 3 of the present invention. Referring to FIG. 18A, a number of, n, amplification stages STG1 to STGn are cascade-connected with each other. These amplification stages STG1 to STGn are activated in response to preamplifier enable signals PAE1 and /PAE1 to PAEn and /PAEn respectively. The preamplifier enable signals PAE2 to PAEn are generated by delaying the preamplifier enable signal PAE1 by delay circuits 83aa to 83am respectively as is done in the arrangements of FIGS. 17B and 17C. The preamplifier enable signals /PAE2 to /PAEn are generated by delaying the preamplifier enable signal /PAE1 by the delay circuits 83aa to 83am respectively. The amplification stages are identical in structure to those shown in FIGS. 17B and 17C.

In the structure shown in FIG. 18A, switching elements SWa and SWb which conduct in response to a preamplifier enable signal PAE0 are provided between I/O lines IO and /IO and the first amplification stage STG1. This preamplifier enable signal PAE0 is activated at a timing later than activation of the first amplification stage STG1. In FIG. 18A the preamplifier enable signal PAE0 is illustrated as being generated from a delay circuit 83an which receives the preamplifier enable signal PAEn. Alternatively, the preamplifier enable signal PAE0 may be activated at an appropriate timing as shown in a broken line in FIG. 18A, in consideration of the time period required for activating all amplification stages STG1 to STGn.

In the structure shown in FIG. 18A, the I/O lines IO and /IO are electrically connected to the first amplification stage STG1 after the initial amplification stage STG1 is activated and its internal node potential is ascertained. Therefore, the first amplification stage STG1, which performs its amplifying operation from the state where the internal potential is ascertained, can stably perform the amplifying operation. This operation mode also applies to the remaining amplification stages STG2 to STGn. Thus, internal read data /RD can be stably outputted at a high speed, with no generation of invalid data. In particular, the switching elements SWa and SWb are brought into conducting states after the potential levels on the I/O lines IO and /IO are ascertained, whereby transmission of invalid data to the first amplification stage STG1 as well as formation of invalid data output can be prevented.

[Modification 8]

Figure 18B:
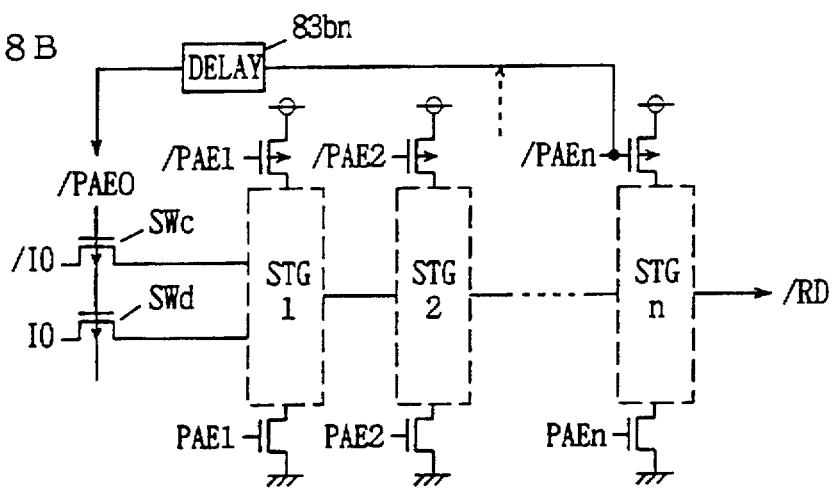

FIG. 18B illustrates the structure of a modification 8 of the preamplifier. The structure shown in FIG. 18B is identical to that of FIG. 18A in a point that a number of, n, amplification stages STG1 to STGn are cascade-connected with each other. Switching elements SWc and SWd formed by p-channel MOS transistors which conduct in response to a preamplifier enable signal /PAE0 are provided between I/O lines IO and /IO and a first amplification stage STG1. This preamplifier enable signal /PAE0 is outputted from a delay circuit 83bn which receives a preamplifier enable signal /PAEn. However, the preamplifier enable signal /PAE0 may be activated at any timing later than activation of the first amplification stage STG1. Also in the structure shown in FIG. 18B, valid data signals are outputted from the I/O lines IO and /IO after internal potentials of amplification stages STG1 to STGn are set at prescribed levels. Therefore, the amplification stages operate in desired operation characteristics, whereby output of invalid data signals is prevented.

[Modification 9]

Figure 18C:
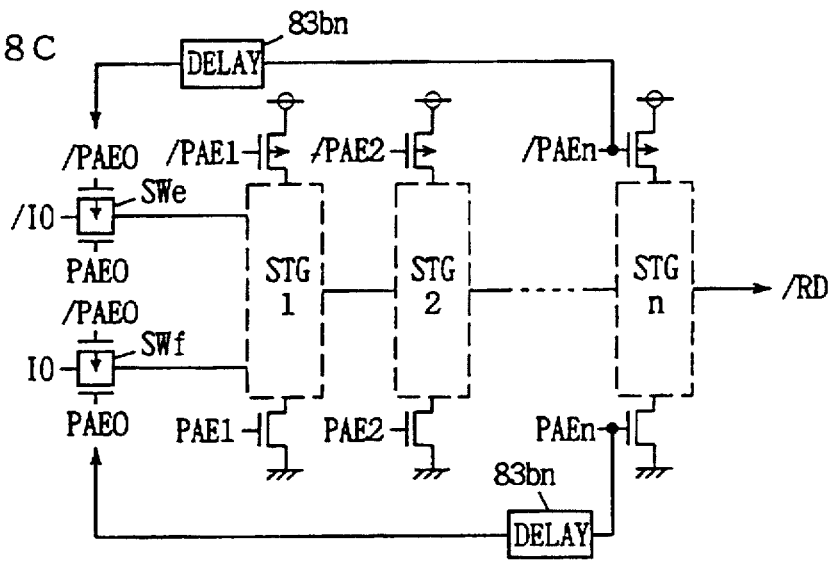

FIG. 18C illustrates the structure of a modification 9 of the preamplifier. The structure shown in FIG. 18C is identical to those of the modifications 7 and 8 in a point that amplification stages STG1 to STGn are cascade-connected with each other. Switching elements SWe and SWf formed by CMOS transmission gates which conduct in response to preamplifier enable signals PAE0 and /PAE0 are provided between the first amplification stage STG1 and I/O lines IO and /IO. Since the switching elements SWe and SWf are formed by CMOS transmission gates, signal potentials on the I/O lines IO and /IO can be transmitted to the first amplification stage STG1 with no signal propagation loss. The structure shown in FIG. 18C, which is a combination of the structures shown in FIGS. 18A and 18B, can attain an effect similar to those of these modifications.

Each of the amplification stages STG1 to STGn shown in FIGS. 18A to 18C may also be provided with an equalization transistor for equalizing the potentials of its internal nodes.

According to the embodiment 3 of the present invention, as hereinabove described, the amplifiers of the preamplifiers which are formed by a plurality of stages of amplifiers are successively activated, whereby output of invalid data signals can be prevented. Further, amplifying operations are performed after the internal node potentials are ascertained, whereby stable amplifying operations can be carried out and output of invalid data is prevented. In particular, output of invalid data and discharge of internal read data buses RDA0 to RDA3 caused by changes of data signals resulting from transient response of the preamplifiers can be prevented and data of plural bit memory cells can be correctly tested when the amplifiers are successively activated from the initial stage also in the case of utilizing a test circuit which is provided in common for a plurality of memory cell arrays.

[Embodiment 4: Output Buffer]

Figure 19:
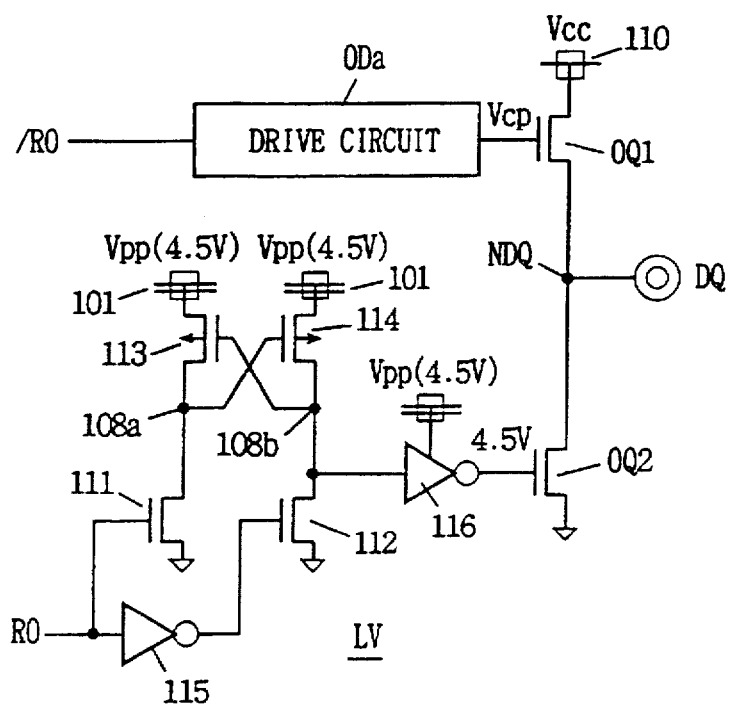
FIG. 19 illustrates the structure of an output buffer according to an embodiment 4 of the present invention.

FIG. 19 illustrates the structure of an output buffer according to an embodiment 4 of the present invention. Referring to FIG. 19, the output buffer includes a drive circuit ODa which receives an internal read signal /RO having an amplitude of a peripheral circuit source potential Vccp level and forms a signal having a larger amplitude than an external source potential Vcc, an n-channel MOS transistor OQ1 which is connected between an external source node 110 and a data output node NDQ for receiving an output signal of the drive circuit ODa at its gate, a level conversion circuit LV which receives an internal output data signal RO having an amplitude of the peripheral circuit source potential Vccp level for converting the same to a signal of an amplitude of a high voltage Vpp level higher than the external source potential Vcc, and an n-channel MOS transistor OQ2 which is connected between the data output node NDQ and a ground node for receiving an output signal of the level conversion circuit LV at its gate. The internal high voltage Vpp, which is employed for driving word lines, for example, is set at about 4.5 V when the external source potential Vcc is about 3.3 V, for example (when an operation source potential of an external device is about 5 V).

The level conversion circuit LV includes a p-channel MOS transistor 113 which is connected between an internal high voltage Vpp supply node (hereinafter referred to as a Vpp supply node) 101 and an internal node 108a and has its gate connected to an internal node 108b, a p-channel MOS transistor 114 which is connected between the Vpp supply node 101 and the node 108b and has its gate connected to the node 108a, an n-channel MOS transistor 111 which is connected between the node 108a and a ground node and has its gate coupled to receive an internal output data signal RO, an n-channel MOS transistor 112 which is connected between the node 108b and the ground node and has its gate coupled to receive the internal output data signal RO through an inverter 115, and an inverter 116 which inverts the potential on the node 108b.

A first operation source potential of the inverter 116 is the internal high voltage Vpp. An output signal of the inverter 116 is supplied to the gate of the MOS transistor OQ2.

When the internal output data signal /RO is at a low level, the drive circuit ODa outputs a voltage Vcp which is higher than the external source potential Vcc and supplies the same to the gate of the MOS transistor OQ1. At this time, the internal output data signal RO is at a high level, and the output signal of the inverter 115 is at a low level. The MOS transistors 111 and 112 are brought into ON and OFF states respectively, and the potential of the node 108b is charged to the internal high voltage Vpp level by the MOS transistor 114.

The inverter 116 inverts the signal on this node 108b, and hence a signal of the ground potential level is applied to the gate of the MOS transistor OQ2. Therefore, the data output node NDQ is charged to the source potential Vcc through the MOS transistor OQ1. The voltage Vcp is sufficiently higher than the external source potential Vcc, which in turn is transmitted to the data output node NDQ with no loss of the threshold voltage of the MOS transistor OQ1.

When the internal output data signal RO is at a low level, the internal output data signal /RO is brought to a high level. At this time, the output signal of the drive circuit ODa is brought to a low level and the MOS transistor OQ1 is brought into an OFF state. In the level conversion circuit LV, the MOS transistors 111 and 112 are brought into OFF and ON states respectively, and the node 108a is charged to the internal high voltage Vpp level. Due to the potential increase of the node 108a, the MOS transistor 114 is brought into an OFF state, and the node 108b is discharged to the ground potential level. Therefore, a signal of the internal high voltage Vpp level is outputted from the inverter 116 and supplied to the gate of the MOS transistor OQ2. In response to this gate potential, the MOS transistor OQ2 discharges the data output node NDQ to the ground potential level.

When the source potential level of the external device is 5 V, for example, the gate potential of the MOS transistor OQ2 is about 4.5 V. Therefore, the potential difference between the gate and the drain is small, a pinch-off point is present in the vicinity of the drain, a high electric field application region in this MOS transistor OQ2 is small, and generation of hot carriers is suppressed. Thus, a gate insulating film is prevented from deterioration caused by generated hot carriers (holes), and reliability of the MOS transistor OQ2 is improved.

While the structure of an internal circuit of the drive circuit ODa is not shown in detail, this circuit may have a structure similar to that of the level conversion circuit LV or that of a booster circuit described later.

[Modification]

Figure 20:
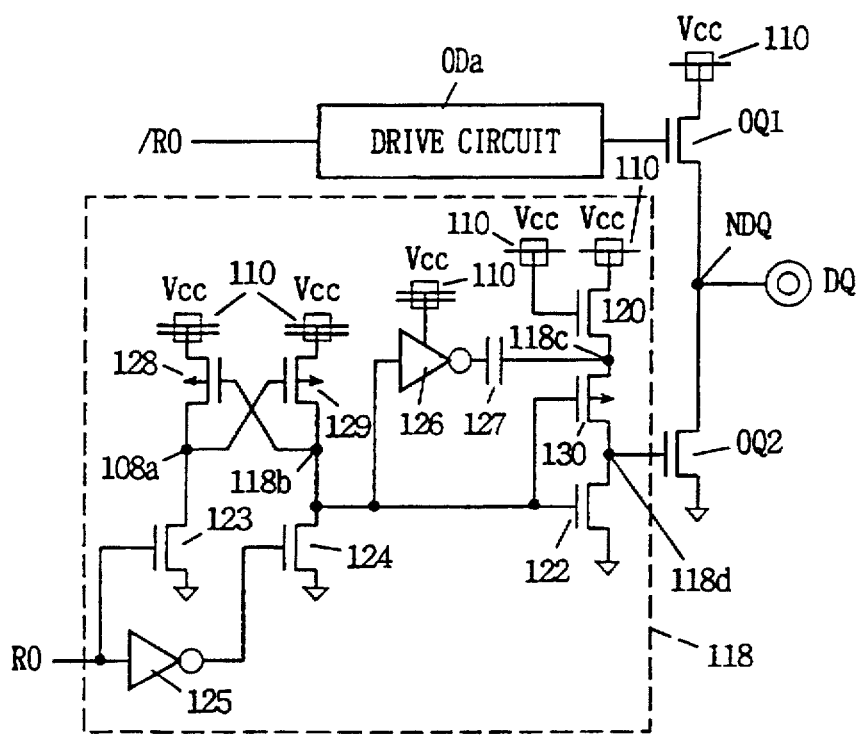
FIG. 20 illustrates a modification of the output buffer according to the embodiment 4 of the present invention.

FIG. 20 illustrates the structure of a modification of the output buffer according to the embodiment 4 of the present invention. Referring to FIG. 20, a boost circuit 118 is employed for converting the level of an internal output data signal RO. A MOS transistor OQ1 for charging a data output node NDQ is driven by a drive circuit ODa which converts the level of an internal output data signal /RO.

The boost circuit 118 includes a p-channel MOS transistor 128 which is connected between an external source node 110 and a node 118a and has its gate connected to a node 118b, a p-channel MOS transistor 129 which is connected between an external source node Vcc and the node 118b and has its gate connected to the node 118a, an n-channel MOS transistor 123 which is connected between the node 118a and a ground node and has its gate connected to receive the internal output data signal RO, an n-channel MOS transistor 124 which is connected between the node 118b and the ground node and has its gate coupled to receive the internal output data signal RO through an inverter 125, an inverter 126 which inverts a signal on the node 118b, a charge pump capacitor 127 which performs a charge pump operation in accordance with an output signal of the inverter 126 and supplies charges to a node 118c, an n-channel MOS transistor 120 which is connected between the external source node 110 and the node 118c and has its gate connected to the external source node 110, a p-channel MOS transistor 118a which is connected between the node 118c and a node 118d and has its gate connected to the node 118b, and an n-channel MOS transistor 122 which is connected between the node 118d and the ground node and has its gate connected to the node 118b.

The node 118d is connected to the gate of a MOS transistor OQ2. The MOS transistor 120, whose gate and drain are coupled to the external source node 110, operates in a source follower mode and transmits a potential of Vcc–Vthn to the node 118c, where Vthn represents the threshold voltage of the MOS transistor 120. The operation of the boost circuit 118 is now described.

When the internal output data signal RO is at a low level, the MOS transistors 123 and 124 are brought into OFF and ON states respectively. The node 118b is discharged to the ground potential level, and the output signal of the inverter 126 rises to the external source potential Vcc level. In response to the rise of the output signal of the inverter 126, the charge pump capacitor 127 performs a charge pump operation, and supplies charges to the node 118c. The node 118c is precharged by the MOS transistor 120, and hence its potential becomes 2·Vcc–Vthn by the charge pump operation of the charge pump capacitor 127. The MOS transistor 130 enters an ON state since the potential of the node 118b is at the ground potential level, and transmits the potential 2·Vcc–Vthn on the node 118c to the node 118d, whereby the MOS transistor OQ2 is brought into an ON state in response.

The gate potential of the MOS transistor OQ2 is 2·Vcc–Vthn, and hence the potential of the node 118d is 5.6 V, which is higher than the source potential 5 V of the external device, when the external source potential Vcc is 3.3 V and Vthn is 1 V. In this state, no pinch-off phenomenon takes place in the MOS transistor OQ2, and hence no high electric field application region is formed and generation of hot carriers is suppressed. In this state, the output node NDQ is discharged to the ground potential level at a high speed (since the conductance of the MOS transistor OQ2 becomes higher than that in application of a internal high voltage Vpp).

When the internal output data signal RO is at a high level, on the other hand, the MOS transistors 123 and 124 are brought into ON and OFF states respectively, and the node 118b is charged to the external source potential Vcc level by the MOS transistor 129. In this state, the output signal of the inverter 126 falls to a low level, and the potential of the node 118c is lowered by a charge pump operation of the charge pump capacitor 127. However, this potential of the node 118c is immediately recovered to the Vcc–Vthn level by a precharge function of the MOS transistor 120.

Since the potential of the node 118b is at a high level, the MOS transistor 130 is brought into an OFF state, the MOS transistor 122 is brought into an ON state, and the gate of the MOS transistor OQ2 is discharged to the ground potential level so that the MOS transistor OQ2 enters an OFF state. In this state, the potential of the output signal of the drive circuit ODa reaches the Vcp level, and the output node NDQ is charged to the external source potential Vcc level through the MOS transistor OQ1.

The drive circuit ODa may have a structure similar to that of the boost circuit 118.

In the output buffer according to the embodiment 4 of the present invention, as hereinabove described, the gate potential of the MOS transistor for discharging the output node is set to be higher than the external source potential, whereby generation of a high electric field application region of the discharging output MOS transistor is suppressed and the gate insulating film can be prevented from deterioration caused by trapping of hot carriers in the gate insulating film, reliability of the element is improved, and hence the semiconductor memory device is improved in reliability.

[Embodiment 5: Address Transition Detection Signal Generation Circuit]

Figure 21A:
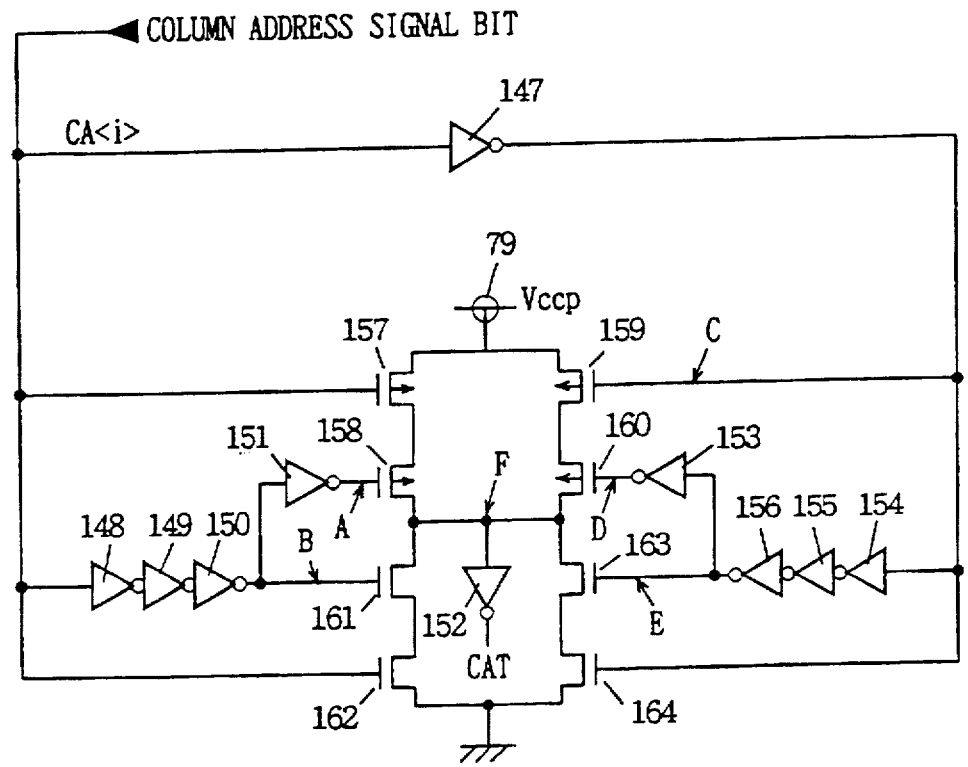
FIG. 21A illustrates the structure of an address transition detection signal generation circuit according to an embodiment 5 of the present invention.

FIG. 21A shows the structure of an address transition detection signal generation circuit. Referring to FIG. 21A, the address transition detection signal generation circuit includes an inverter 147 receiving a column address signal bit CA<i> which is generated from the address buffer 3 shown in FIG. 1 (in response to activation of a column address strobe signal /CAS), three cascade-connected inverters 148, 149 and 150 which receive the column address signal bit CA<i>, an inverter 151 which receives an output signal of the inverter 150, three cascade-connected inverters 154, 155 and 156 which receive an output signal of the inverter 147, an inverter 153 which receives an output signal of the inverter 156, p-channel MOS transistors 157 and 158 which are connected in series between a Vccp supply node 79 and an output node F, n-channel MOS transistors 161 and 162 which are connected in series between the output node F and a ground node, p-channel MOS transistors 159 and 160 which are connected in series between the Vccp supply node 79 and the output node F, and p-channel MOS transistors, 163 and 164 which are connected in series between the output node F and the ground node.

The MOS transistor 157 receives the column address signal bit CA<i> at its gate, the MOS transistor 158 receives an output signal of the inverter 151 at its gate, the MOS transistor 161 receives an output signal of the inverter 150 at its gate, and the MOS transistor 162 receives the column address signal bit CA<i> at its gate. The MOS transistor 159 receives an output signal of the inverter 147 at its gate, the MOS transistor 160 receives an output signal of the inverter 153 at its gate, the MOS transistor 163 receives an output signal of the inverter 156 at its gate, and the MOS transistor 159 receives an output signal of the inverter 147 at its gate.

Figure 21B:
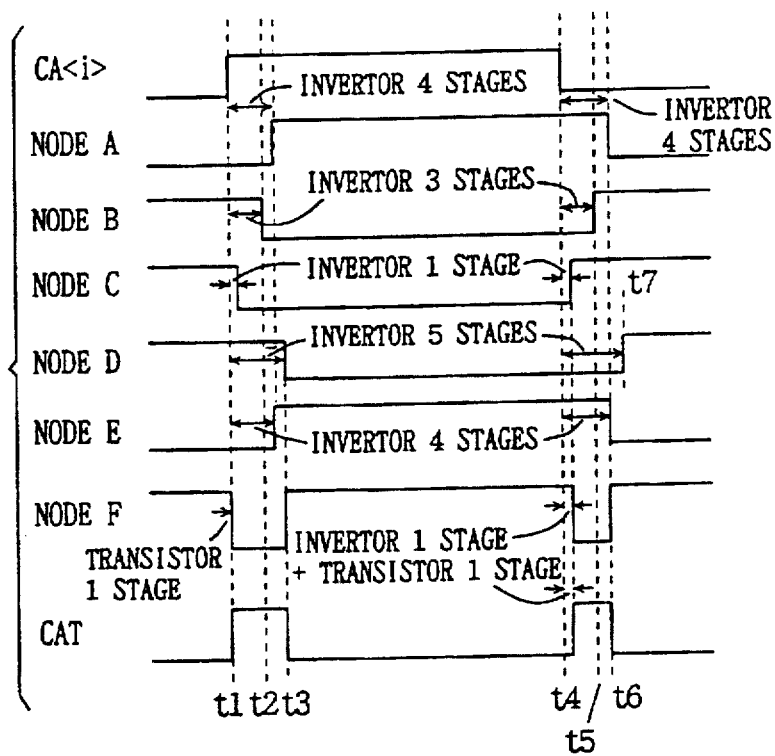
FIG. 21B illustrates its operation waveform.

A signal appearing on the output node F is inverted through the inverter 152, so that a column address transition detection signal CAT is formed. This inverter 152 is employed to attain logical matching with an ATD signal generation circuit described later. The operation of the address transition detection signal generation circuit shown in FIG. 21A is now described with reference to a waveform diagram shown in FIG. 21B.

Before a time t1, the column address signal bit CA<i> is at a low level. In this state, the MOS transistors 157 and 158 are in ON states, and the MOS transistor 162 is in an OFF state. Further, the MOS transistors 159, 160 and 163 are in OFF states. Thus, the node F is precharged at a source potential Vccp level by the MOS transistors 157 and 158.

At the time t1, the column address signal bit CA<i> is incorporated and latched in the address buffer 3 in response to activation of the column address strobe signal /CAS, so that its potential is changed from the low level to a high level. In response to this potential change, the MOS transistor 157 is brought into an OFF state. The potential of a node A rises from a low level to a high level after a lapse of a delay time provided by the inverters 148 to 151. A node B is changed in potential from a high level to a low level after a lapse of the delay time provided by the inverters 148 to 150. Therefore, both of the MOS transistors 161 and 162 are brought into ON states while the node B is at a high level, i.e., between the time t1 and a time t2, whereby the node F is discharged to the ground potential level. Namely, the node F is brought to a low level after a lapse of a delay time provided by the MOS transistor 161.

After a lapse of a delay time provided by the inverter 147 from the time t1, the potential of a node C is changed from a high level to a low level, and the MOS transistor 159 is brought into an ON state. After a lapse of the delay time provided by the inverters 154 to 156 from the fall of the potential of the node C to the low level, the potential of a node E rises to a high level and the MOS transistor 163 is brought into an ON state. In this state, the MOS transistor 164 has already been brought into an OFF state in accordance with the output signal of the inverter 147.

After a lapse of a delay time provided by the inverter 153 from the rise of the potential of the node E to the high level, the potential of a node D falls to a low level and the MOS transistor 160 is brought into an ON state. Thus, the node F is charged through the MOS transistors 159 and 160, and its potential level is increased at a time t3 (more specifically, after a lapse of a delay time provided by the MOS transistor 160). Therefore, the node F falls to a low level after a lapse of the delay time provided by the MOS transistor 162 from the time t1 upon rise of the bit CA<i> and maintains the low level up to a lapse of the delay time provided by the inverters 147 and 153 to 156, so that the potential of the node F rises to a high level at the time t3 after a lapse of the delay time provided in the MOS transistor 160 when the node D falls to a low level.

In response to the fall of the potential of the node F, therefore, the address transition detection signal CAT rises to a high level after a lapse of the delay time provided by the inverter 152, and falls to a low level at the time t3. The delay time of the inverter 152 is ignored here.

The address signal bit CA<i> falls from the high level to a low level at a time t4, whereby the potential of the node A falls to a low level at a time t6 after a lapse of the delay time provided by the inverters 148 to 151, while the potential of the node B rises to a high level at a time t5 after a lapse of the delay time provided by the inverters 148 to 150 from the time t4. The node A is at a high level between the times t4 and t6, whereby the MOS transistor 158 maintains an OFF state. On the other hand, the MOS transistor 162 is brought into an OFF state in response to the fall of the column address signal bit CA<i>.

After a lapse of the delay time provided by the inverter 147 from the time t4, the potential of the node C rises to a high level, the MOS transistor 159 is brought into an OFF state, and the MOS transistor 164 is brought into an ON state. The potential of the node E falls to a low level after a lapse of the delay time provided by the inverters 154 to 156 from the rise of the output signal of the inverter 147 to a high level. Therefore, both of the MOS transistors 163 and 164 are brought into ON states in response to the rise of the output signal of the inverter 147, and the potential of the node F is brought to a low level. After the potential of the node E falls to a low level, the potential of the node D rises to a high level at a time t7 after a lapse of the delay time provided by the inverter 153 from the fall of the potential of the node E to a low level, and the MOS transistor 160 is brought into an OFF state.

At the time t6, the potential of the node A falls to a low level, the MOS transistor 158 is brought into an ON state, and the node F is charged through the MOS transistors 157 and 158 so that its potential level rises to a high level.

When the column address signal bit CA<i> falls, therefore, the potential of the node F falls to a low level after the delay time provided by the inverter 147 and the MOS transistor 164, and the address transition detection signal ATD rises to a high level.

When the delay time provided by the inverters 147, 151 and 153 are sufficiently smaller than those provided by the inverters 148 to 150 and 154 to 156, the time for maintaining the node F at a low level is decided by the delay times of the three stages of inverters.

Due to the structure shown in FIG. 21A, the potential of the node F falls to a low level through a single transistor on the rising edge of the column address signal bit CA<i>, while the potential of the node F falls to a low level on the falling edge of the column address signal bit CA<i> after a lapse of the delay time provided by the inverter 147 and the MOS transistor 164. Thus, the potential of the node F can be changed at a high speed after a transition of the column address signal bit CA<i>, whereby the address transition detection signal CAT can be activated at a high speed after the transition of the column address signal bit CA<i>.

When the inverters 148 to 150 as well as the inverters 154 to 156 are replaced by even stages of inverters, the potential changes of the nodes A, B, D and E are reversed correspondingly, whereby the potential change of the node F is also reversed in response and a such a waveform that the potential of the node F rises to a high level in response to a transition of the address signal bit CA<i> can be obtained.

In the address transition detection signal generation circuit according to the embodiment 4 of the present invention, as hereinabove described, the MOS transistors which are connected in series between the source nodes and the ground nodes are driven through the delay circuits and the inverters, whereby the address transition detection signal CAT can be activated at a high speed after a transition of the column address signal bit. The address transition detection signal CAT decides the activation timings for the equalization signal /IOEQ and the preamplifier enable signal PAE as shown in FIG. 1. Thus, data can be read at a high speed, whereby a high-speed test can be implemented when such ATD circuit is employed with a test circuit.

[Modification: ATD Signal Generation Circuit]

Figure 22A:
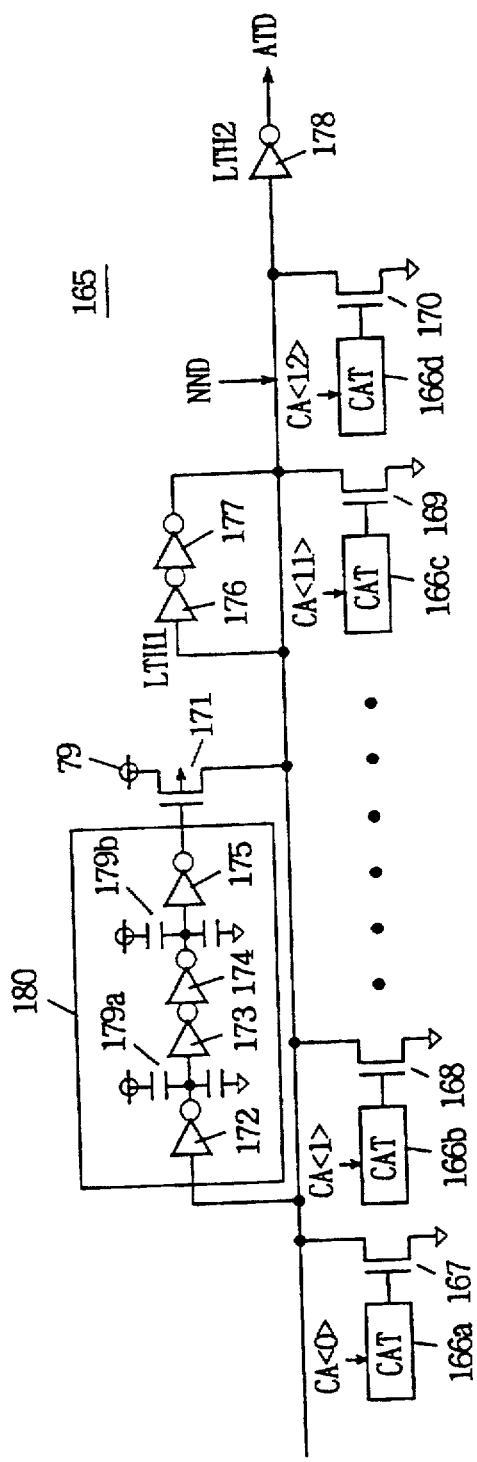
FIG. 22A illustrates a modification of the embodiment 5 of the present invention.

FIG. 22A illustrates the structure of a modification of an ATD signal generation circuit according to the embodiment 5 of the present invention. Referring to FIG. 22A, the ATD signal generation circuit includes n-channel MOS transistors 167 to 170 which are connected in parallel with each other to a node NND (signal line) for receiving address transition detection signals CAT from address transition detection signal generation circuits 166a to 166d at gates thereof respectively. FIG. 22A illustrates the address transition detection signal generation circuits 166a to 166d as detecting transition of column address signal bits CA<0> to CA<12>. The MOS transistors 167 to 170 conduct when the address transition detection signals from the corresponding address transition detection signal generation circuits are brought to high levels, to discharge the node (signal line) NND to the ground potential level.

The ATD signal generation circuit further includes a delay circuit 180 which delays a signal potential change on the node NND, a p-channel MOS transistor 171 which is connected between a source (Vccp supply) node 79 and the node NND for receiving an output signal of the delay circuit 180 at its gate, an inverter 176 which inverts the signal on the node NND, an inverter 177 which inverts and transmits an output signal of the inverter 176 onto the node NND, and an inverter 178 which inverts the signal on the node NND and generates an address transition detection signal ATD. The inverter 176 has an input logic threshold value LTH1, while the inverter 178 has an input logic threshold value LTH2 which is lower than the input logic threshold value LTH1.

The delay circuit 180 includes an inverter 172 which inverts the signal potential of the node NND, a delay capacitor 179a which delays an output signal of the inverter 172, an inverter 173 which inverts the output signal of the inverter 172, an inverter 174 which inverts an output signal of the inverter 173, a delay capacitor 179b which delays an output signal of the inverter 174, and an inverter 175 which inverts the output signal of the inverter 174. An output signal of the inverter 175 is supplied to the gate of the MOS transistor 171. Current driving capability of the MOS transistor 171 is made sufficiently larger than that of the inverter 177. The operation is now described with reference to a waveform diagram shown in FIG. 22B.

Before a time t0, the node NND is precharged at a high level by the MOS transistor 171, and the address transition detection signal ATD from the inverter 178 is at a low level.

At the time t0, the column address signal bit CA<i> is brought to a high level, and the address transition detection signal generation circuit (see FIG. 21A) detects this transition to bring the address transition detection signal CAT to a high level for a prescribed period. At least one of the MOS transistors 167 to 170 conducts, and the potential level of the node NND is lowered. The potential of the node NND is lowered to a low level at a high speed due to acceleration by a latch circuit which is formed by the inverters 176 and 177.

In response to the potential reduction of the node NND, the inverter 178 drives the address transition detection signal ATD to a high level. After a lapse of a delay time provided by the delay circuit 180 from the fall of the potential of the node NND to the low level, the output signal of the delay circuit 180 is brought to a low level, and the MOS transistor 171 conducts to charge the node NND. At this point of time, the address transition detection signal CAT is at a low level and all of the MOS transistors 167 to 170 are in OFF states. Since the current driving capability of the MOS transistor 171 is made sufficiently larger than that of the inverter 177, the potential of the node NND is increased up to the source potential (Vccp) level. In response to the potential increase of the node NND, the inverter 178 drives the address transition detection signal ATD to a low level at a time t2.

After a lapse of the delay time provided by the delay circuit 180 from the rise of the potential of the node NND to the high level, the output signal of the delay circuit 180 also goes high and the MOS transistor 171 is brought into an OFF state, so that the charging operation of the node NND is stopped. The high level of the node NND is latched by the latch formed by the inverters 176 and 177.

At a time t3, the column address signal bit CA<i> falls to a low level, the address signal transition detection signal CAT is driven to a high level for a prescribed period, the address transition detection signal ATD rises to a high level in response, and the address transition detection signal ATD is driven to a low level at a time t4 after a lapse of the delay time provided by the delay circuit 180. The time for bringing the address transition detection signal ATD into an active state of a high level is decided by the delay time provided by the delay circuit 180.

Figure 22C:
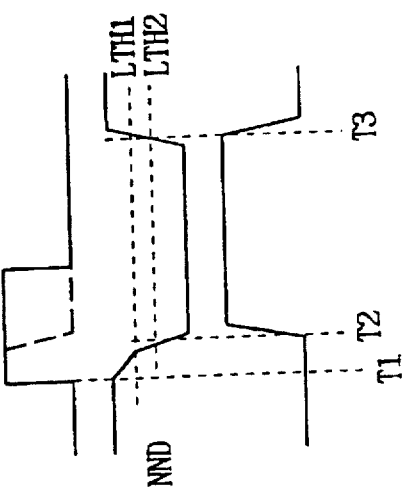
FIGS. 22B and 22C illustrate operation waveforms thereof.
Figure 22B:
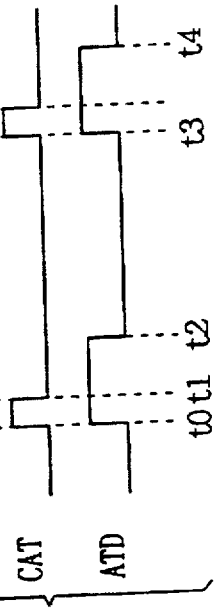

FIG. 22C illustrates the potential change of the node NND at the time of driving the address transition detection signal CAT to a high level of an active state in more detail. At a time T1, the address transition detection signal CAT is driven to a high level, whereby at least one of the MOS transistors 167 to 170 conducts so that the potential of the node NND is lowered. The input logic threshold value LTH1 of the inverter 176 is made sufficiently high. When the potential of the node NND reaches the input logic threshold value LTH1, this potential of the node NND is discharged by the inverters 176 and 177 at a high speed.

When the potential of the node NND is lowered below the input logic threshold value LTH2 of the inverter 178 (time T2), the address transition detection signal ATD from the inverter 178 goes high. After a lapse of the delay time provided by the delay circuit 180, the node NND is charged by the MOS transistor 171, so that its potential is increased. When the potential of the node NND exceeds the input logic threshold value TH2 (time T3), the address transition detection signal ATD is driven to a low level.

Even if the address transition detection signal CAT is generated in a whisker-like shape due to an influence by a noise or the like as shown by a broken line in FIG. 22C, an address transition detection signal ATD having a prescribed time width can be reliably formed with respect to such an incomplete address transition detection signal CAT by setting the input logic threshold value LTH1 of the inverter 176 at a higher level than the input logic threshold value LTH2 of the inverter 178. When an incomplete address transition detection signal CAT having a whisker-like shape is generated (activated), the potential of the node NND is lowered. When the potential of the node NND is lowered below the input logic threshold value LTH1 by the incomplete address transition detection signal CAT, therefore, the potential of the node NND is set at a low level by the inverters 176 and 177.

Following the lowering of the potential level of the node NND, the inverter 178 drives the address transition detection signal ATD to a high level of an active state. Also with respect to such an incomplete address transition detection signal CAT, an address transition detection signal ATD having a prescribed time width can be reliably generated while the potential of the node NND is merely slightly lowered.

This address transition detection signal ATD is employed for defining operation timings of parts related to data input/output such as the I/O line equalization signal /IOEQ and the preamplifier enable signal PAE. Thus, the internal circuits can be reliably driven at prescribed times, and a stably operating semiconductor memory device can be obtained in high reliability.

While the address transition detection signal can be stably generated at a high speed in response to a transition of the column address signal bit through the address transition detection signal generation circuit shown in FIG. 21A, the address transition detection signal generation circuit shown in FIG. 22A may be combined with a conventional flip-flop type address transition detection signal generation circuit. An address transition detection signal ATD having a prescribed time width can be reliably generated with no influence by a noise or the like.

According to the embodiment 5 of the present invention, as hereinabove described, the address transition detection signal can be reliably formed also with respect to an incomplete address transition detection signal by providing a latch circuit for driving the signal potential on node NND and the inverter for address transition detection signal generation with respect to the signal line (node NND) which is driven to a first potential in accordance with address transition detection signal activation while making the output logic threshold values of the latch circuit and the inverter differ from each other.

Further, an address transition detection signal having a prescribed time width can be reliably formed by restoring the potential of the signal line to a second potential after a lapse of a prescribed time through a delay circuit.

[Embodiment 6: Arrangement of ATD Circuit]

Figure 23A:
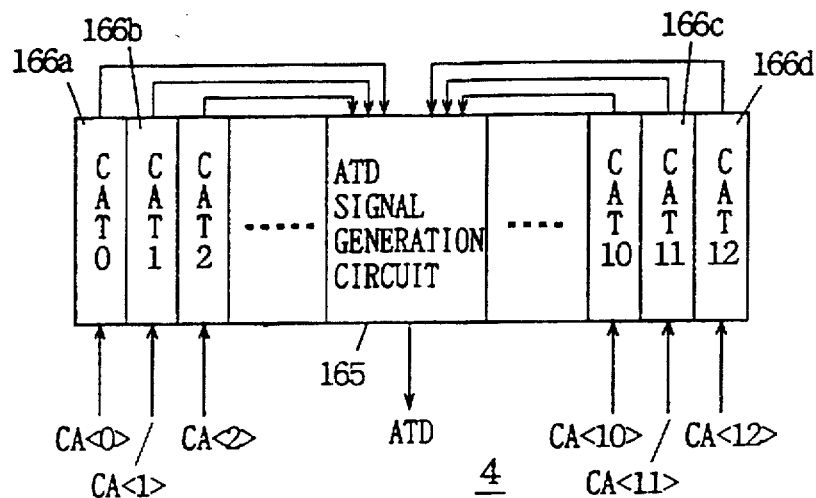
FIG. 23A illustrates the layout of an ATD generation circuit according to an embodiment 6 of the present invention.

23A illustrates the arrangement of an ATD generation circuit 4 according to an embodiment 6 of the present invention. Referring to FIG. 23A, address transition detection signal generation circuits 166a to 166d are symmetrically arranged with respect to an address transition detection signal (ATD signal) generation circuit 165. Namely, the address transition detection signal generation circuits 166a, 166b, ... which receive column address signal bits CA<0>, CA<1>, ... and generate address transition detection signals CAT0, CAT1, ... are arranged on one side of the ATD signal generation circuit 165, while the address transition detection signal generation circuits 166c, 166d, ... which receive the remaining column address signal bits CA<11>, CA<12>, ... are arranged on the other side.

The address transition detection signal generation circuits 166a to 166d and the ATD signal generation circuit 165 are aligned with each other. Further, the address transition detection signal generation circuits 166a to 166d are so arranged that the lengths of interconnection lines between these address transition detection signal generation circuits 166a to 166d and the ATD signal generation circuit 165 are minimized and preferably substantially identical to each other. Even if characteristics of the interconnection lines such as RC delays vary by deviation of manufacturing process parameters, variation with respect to these parameters can be entirely equalized due to the symmetrical arrangement. Therefore, changing rates and widths of edges (rising/falling edges) of the address transition detection signals CAT which are transmitted to the ATD signal generation circuit 165 are equally changed, whereby the address transition detection signals CAT have no dependency on the address signal bits and the address transition detection signal ATD can be ascertained at a high speed.

Figure 23B:
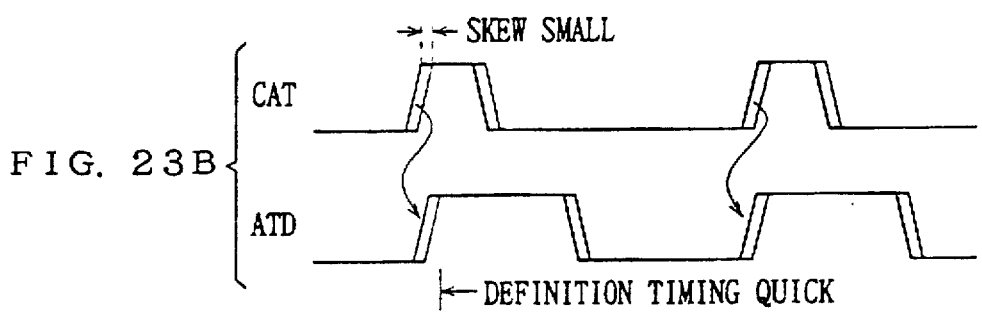
FIG. 23B illustrates its effect.

When an address transition detection signal CAT has address signal bit dependency as shown in FIG. 23B, a skew having a certain time width is present in transitions of the address transition detection signal CAT, and a skew with respect to the transitions is also present in an address transition detection signal ATD, however, this skew is extremely reduced due to elimination (reduction) of the address signal bit dependency of the address transition detection signal ATD, and a definition timing of the address transition detection signal ATD can be quickened accordingly with no necessary for considering a margin for such a skew. Thus, the internal circuits can be driven at a quick timing.

While the ATD signal generation circuit 165 has the structure shown in FIG. 22A, the elements provided in the interior of the ATD signal generation circuit 165 are appropriately arranged such that the interconenction lengths for the address transition detection signals are as equal as possible. Alternatively, the structure of another ATD signal generation circuit may be employed.

[Modification 1]

Figure 24:
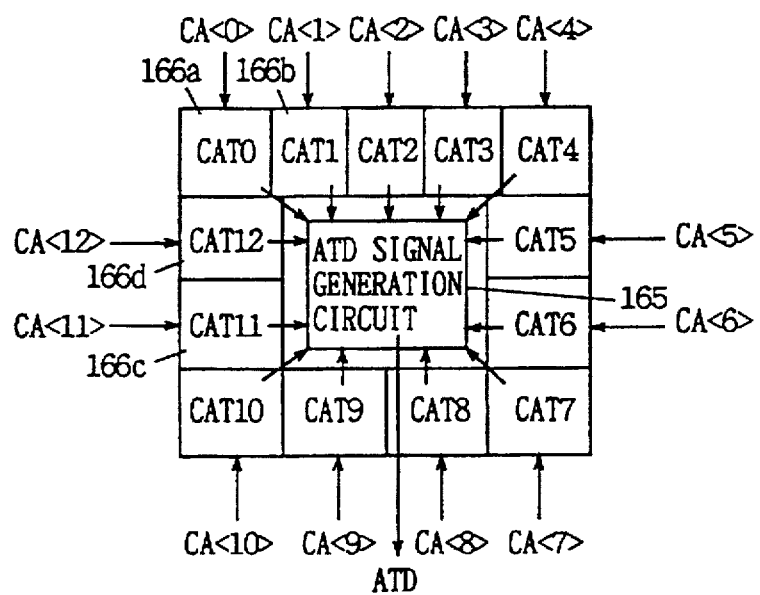
FIG. 24 illustrates a modification 1 of the embodiment 6 of the present invention.

FIG. 24 illustrates a modification of the layout of the ATD generation circuit 4. Referring to FIG. 24, address transition detection signal generation circuits 166a to 166d are (concentrically) arranged to enclose an ATD signal generation circuit 165 along its outer periphery. According to this arrangement, the lengths of interconnection lines for propagating address transition detection signals CAT0 to CAT1 are further shortened and can be entirely identical to each other, whereby an address transition detection signal ATD can be ascertained at a high speed.

[Modification 2]

Figure 25:
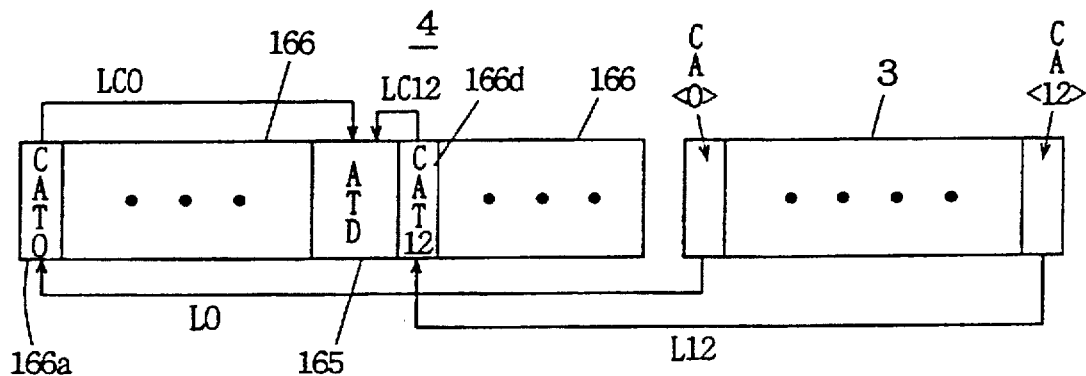
FIG. 25 illustrates a modification 2 of the embodiment 6 of the present invention.

FIG. 25 illustrates a modification 2 of the layout of the ATD generation circuit 4. This figure shows the ATD generation circuit 4 and an address buffer (column address buffer) 3. Address transition detection signal generation circuits 166a to 166d are symmetrically arranged on both sides of an ATD signal generation circuit 165 in an aligned manner. The address buffer 3 generates column address signal bits CA<0> to CA<12>. In a region 166 for arranging the address transition detection signal generation circuits, the sum of lengths of interconnection line transmitting an address signal bit CA<i> and a corresponding address transition detection signal CATi is made constant. Namely, the sum of an interconnection length L0 between a buffer circuit generating the address signal bit CA<0> and the address transition detection signal generation circuit 166a and an interconnection line length LC0 between the address transition detection signal generation circuit 166a and the ATD signal generation circuit 165 is made equal to the sum of an interconnection line length L12 between the column address signal bit CA<12> and the column address transition detection signal generation circuit 166d and an interconenction line length LC12 between the ATD signal generation circuit 165 and the address transition detection signal generation circuit 166d.

The lengths of all interconnection lines propagating the address signal bits and the address transition detection signals are equalized to each other, propagation delay times are also equalized to each other accordingly, address signal bit dependency of the address transition detection signals CAT with respect to the ATD signal generation circuit 165 is remarkably reduced, and an address transition detection signal ATD can be ascertained at a high speed.

In the layout shown in FIG. 25, the address buffer 3 is arranged on one side of the ATD generation circuit 4. However, also when the address buffer 3 is divided into two parts which are arranged on both sides of the ATD generation circuit, the interconnection line lengths for the column address signal bits and the corresponding address transition detection signals can be similarly equalized to each other.

This connection between the column address buffer and the address transition detection signal generation circuit is also applicable to the layout shown in FIG. 24.

[Modification 3]

Figure 26:
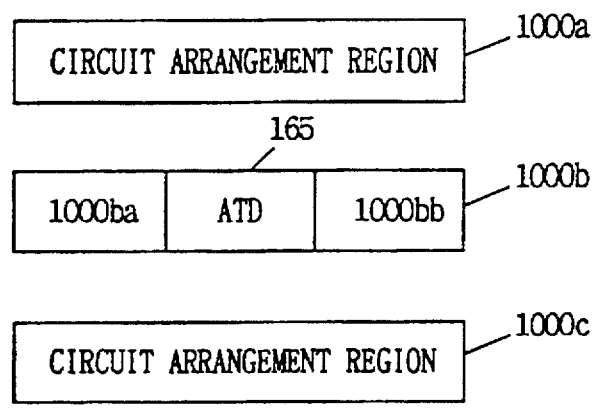
FIG. 26 is adapted to illustrate a circuit arrangement method according to the embodiment 6 of the present invention.

FIG. 26 illustrates a modification 3 of the layout of the ATD generation circuit according to this embodiment. In the layout shown in FIG. 26, circuit arrangement regions 1000a, 1000b and 1000c which are laid out on a cell base, for example, are provided in parallel with each other. An ATD signal generation circuit 165 is arranged on a central region of the circuit arrangement region 1000b. Address transition detection signal generation circuits 166a to 166d are appropriately arranged on subregions 1000ba and 1000bb in the circuit arrangement region 1000b and the circuit arrangement regions 1000a and 1000c. Due to such a circuit cell base layout, the ATD generation circuit having the layout shown in FIG. 24 can be readily formed. When the address transition detection signal generation circuits 166a to 166d are arranged only in the subregions 1000ba and 1000bb, the layout of the ATD generation circuit shown in FIG. 23A can be readily obtained. When the address transition detection signal generation circuits 166a to 166d are arranged in the regions 1000a, 1000c, 1000ba and 1000bb, the arrangement of FIG. 24 can be implemented.

According to the embodiment 6 of the present invention, as hereinabove described, the address transition detection signal generation circuits are symmetrically arranged with respect to the ATD signal generation circuit, whereby delays of address transition detection signal propagation paths are minimized and equalized to each other while influences by variation of process parameters thereof are equalized, the dependency on address signal bits with respect to address transition detection signals is reduced, the address transition detection signal ATD can be ascertained at a high speed, and a semiconductor device which operates at a high speed can be implemented.

|Embodiment 7: Structure of Address Transition Detection Signal Generation Circuit|

Figure 27:
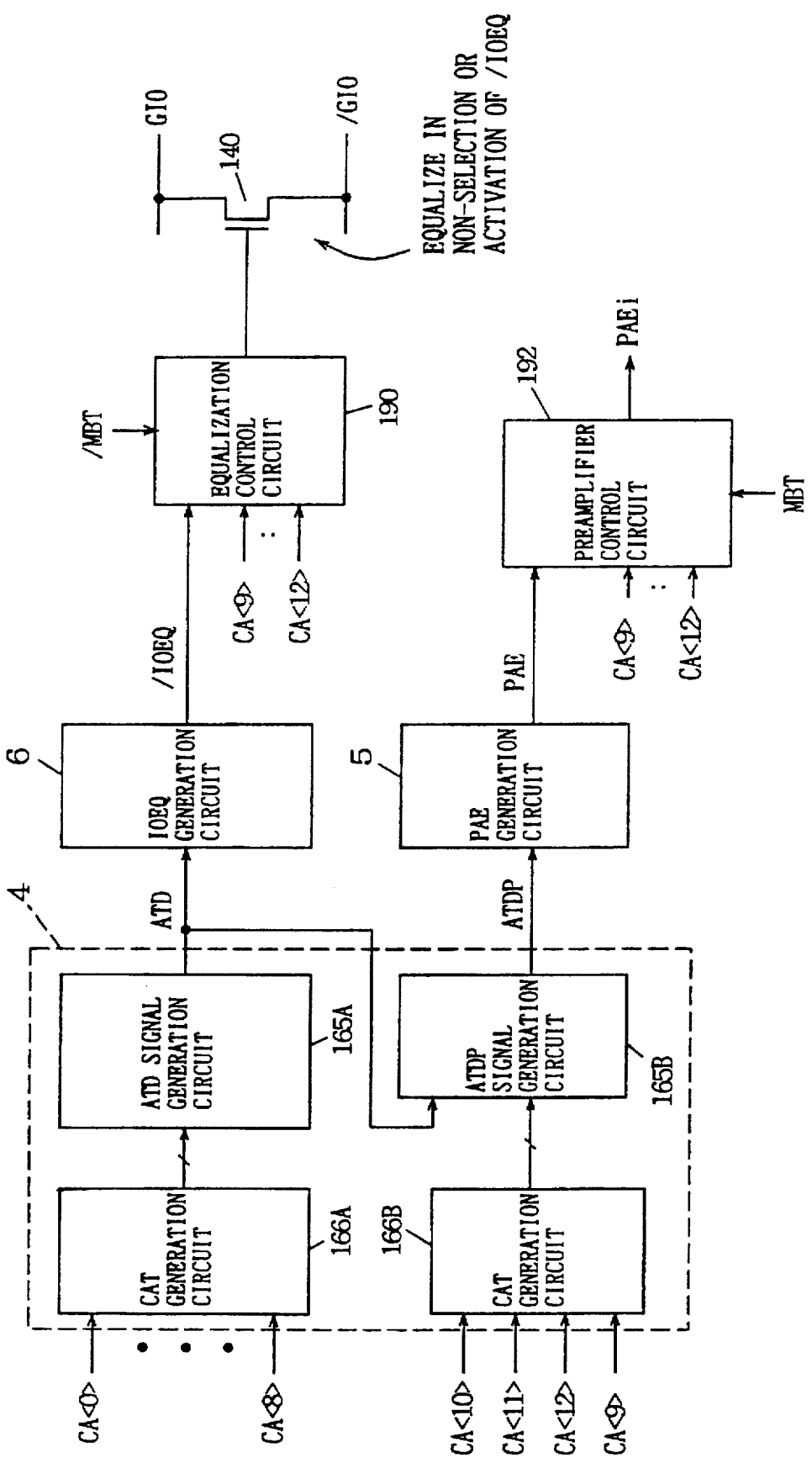
FIG. 27 schematically illustrates the structures of an ATD generation circuit according to an embodiment 7 of the present invention and a part related thereto.

FIG. 27 illustrates the structure of a principal part of a semiconductor memory device according to an embodiment 7 of the present invention. Referring to FIG. 27, an ATD generation circuit 4 includes a CAT generation circuit 166A which receives column address signal bits CA<0> to CA<8> related to bit line selection and detects transitions thereof, a CAT generation circuit 166B which receives column address signal bits CA<9> to CA<12>related to global I/O lines and memory cell array selection and detects transitions thereof, an ATD signal generation circuit 165A which generates an address transitions detection signal ATD in response to an address transition detection signal from the CAT generation circuit 166A, and an ATDP signal generation circuit 165B which generates an address transition detection signal ATDP in response to an address transition detection signal from the CAT generation circuit 166B and the address transition detection signal ATD from the ATD signal generation circuit 165A. Due to provision of the two systems of address transition detection signals, the numbers of input transistors of the address transition detection signal generation circuits 165A and 165B are reduced and the input capacitances thereof are also reduced correspondingly, so that the address transition detection signals ATD and ATDP can be outputted at a high speed.

The address transition detection signal ATD is supplied to an IOEQ generation circuit 6 which generates an equalization signal /IOEQ for equalizing global I/O lines GIO and /GIO (see FIG. 2), while the address transition detection signal ATDP is supplied to a PAE generation circuit 5 which generates a preamplifier enable signal PAE. Equalization of the global I/O lines GIO and /GIO is executed by an equalization control circuit 190 which receives the equalization signal /IOEQ, a test mode indication signal /MBT and the column address signal bits CA<9> to CA<12> and an equalization transistor 140 which conducts in response to an output signal of the equalization control circuit 190. The equalization control circuit 190 corresponds to the column address decoder 131 and the NAND circuit 135 shown in FIG. 2.

The equalization transistor 140 is brought into a conducting state when the column address signal bits CA<9> to CA<12> designate another column group (or another memory cell array) or the equalization signal /IOEQ is in an active state. When the upper column address signal bits CA<9> to CA<12> make a transition and the column address signal bits CA<0> to CA<8> remain unchanged, the address transition detection signal ATD maintains an inactive state. In this state, a non-selected column group is newly selected, and hence the equalization transistor 140 is brought into a conducting state in this current non-selection state and equalization of the global I/O lines GIO and /GIO is performed in accordance with the bits CA<9> to CA<12>. Also when the equalization instruction signal /IOEQ is not activated, the global I/O lines GIO and /GIO are already equalized and no problem arises.

When only the column address signal bit CA<11> or CA<12> makes a transition, the same column group is selected while a different memory cell array is selected. Also in this case, a non-selected memory cell array is newly selected and hence the global I/O lines GIO and /GIO of this non-selected memory cell array are already equalized and no problem arises even if the equalization signal /IOEQ is not activated.

A preamplifier control circuit 192 generates a preamplifier enable signal PAEi for a preamplifier, which is provided for each column group of each memory cell array, in accordance with the preamplifier enable signal PAE, the column address signal bits CA<9> and CA<12> and a test mode indication signal MBT. Due to the preamplifier control circuit 192, the preamplifier can be activated at a prescribed timing also when the same column group is continuously selected, and internal read data can be formed at a high speed.

In a test operation mode, both of the test mode indication signals /MBT and MBT are activated. In the test operation mode, 16-bit memory cells are simultaneously selected and tested. The column address signal bits CA<9> to CA<12> are degenerated. In this state, the ATDP signal generation circuit 165B outputs the address transition detection signal ATDP in accordance with the address transition detection signal ATD from the ATD signal generation circuit 165A. Also in the test operation mode, the preamplifier enable signal PAEi can be correctly generated to bring each preamplifier into an operating state at the same timing. In the test operation mode, the equalization transistor 140 is brought into a conducting state in accordance with the equalization instruction signal /IOEQ as shown in FIG. 2 in detail, whereby the global I/O lines can be equalized in every column group in accordance with the address transition detection signal ATD.

Figure 28:
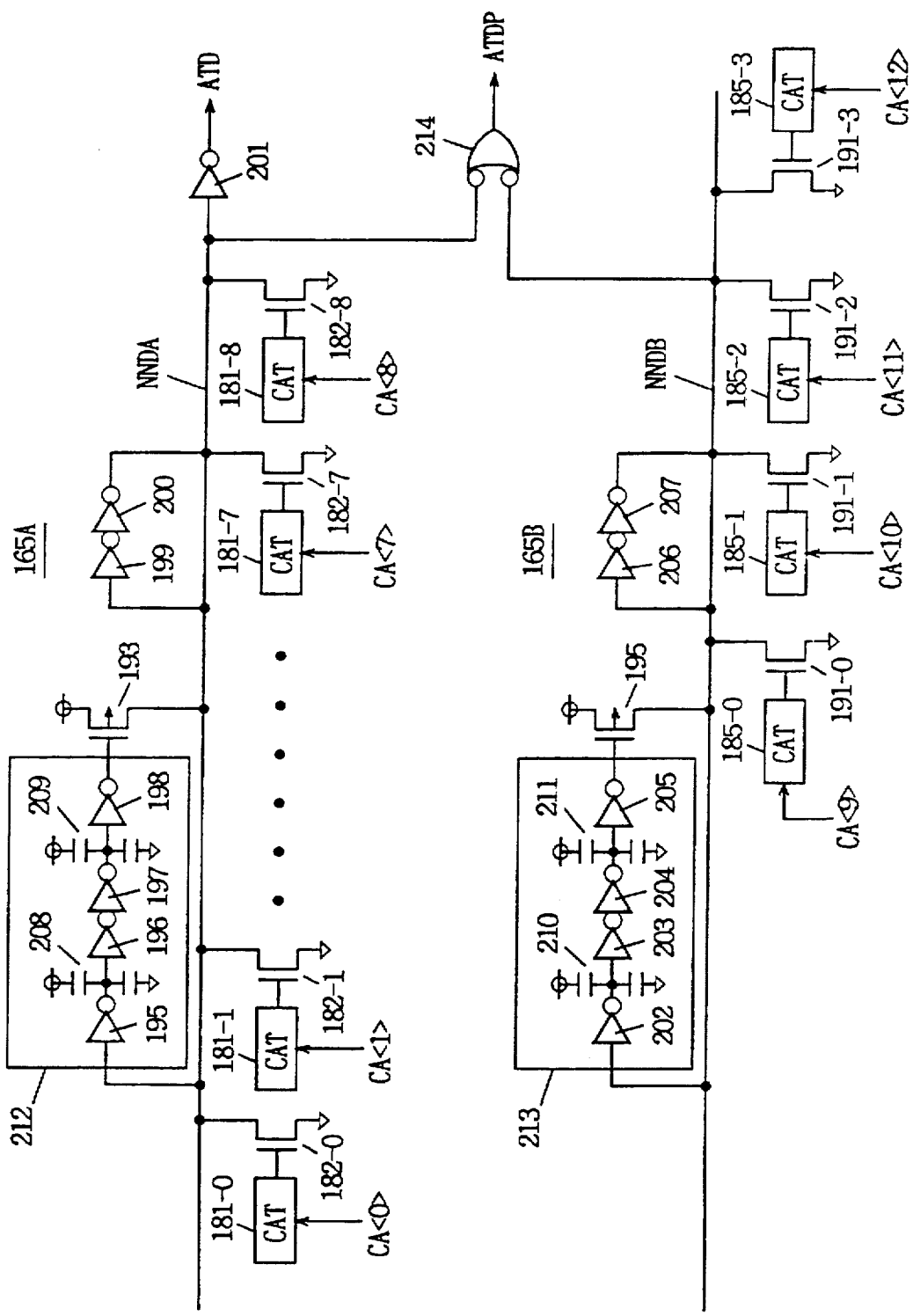
FIG. 28 illustrates specific structures of the ATD signal generation circuit and an ATDP signal generation circuit shown in FIG. 27.

FIG. 28 shows the structures of the ATD signal generation circuit 165A and the ATDP signal generation circuit 165B in detail. Referring to FIG. 28, the ATD signal generation circuit 165A includes n-channel MOS transistors 182-0 to 182-8, which are connected in parallel with each other to a node (signal line) NNDA for receiving address transition detection signals CA<0> to CA<8> from address transition detection signal generation circuits (CAT) 181-0 to 181-8 included in the CAT generation circuit 166A respectively, two stages of inverters 199 and 200 for latching a signal on the node NNDA, an inverter 201 which inverts the signal on the node NNDA and outputs the address transition detection signal ATD, a delay circuit 212 which delays the signal potential change on the node NNDA, and a p-channel MOS transistor 193 which precharges the node NNDA at a source potential Vcc (Vccp) level in response to an output signal of the delay circuit 212.

The delay circuit 212 includes an inverter 195 which inverts the signal on the node NNDA, a delay capacitor 208 which delays an output of the inverter 195, an inverter 196 which receives an output signal of the inverter 195, an inverter 197 which receives an output signal of the inverter 196, a delay capacitor 209 which delays an output signal of the inverter 197, and an inverter 198 which receives an output signal of the inverter 197. The inverter 199 is made to have a higher input logic threshold value than the inverter 201.

This structure of the ATD signal generation circuit 165A is substantially identical to the structure shown in FIG. 22A, except that transitions of the column address signal bits CA<0> to CA<8> are detected. When any of the column address signal bits CA<0> to CA<8> makes a transition, any of the address transition detection signal generation circuits 181-0 to 181-8 outputs a high-level signal. In response to this high level signal, any of the MOS transistors 182-0 to 182-8 conducts so that the potential level of the node NNDA is lowered. Following the potential drop of the node NNDA, the output signals of the inverters 199 and 200 are driven to high and low levels respectively. Further, the address transition detection signal ATD from the inverter 201 is driven to a high level. A period for bringing the signal ATD to a high level of an active state is decided by the delay circuit 212.

The ATDP signal generation circuit 165B includes n-channel MOS transistors 191-0 to 191-3 which are connected between a node NNDB and a ground node in parallel with each other for receiving output signals CA<9> to CA<12> of address transition detection signal generation circuits 185-0 to 185-3 at gates thereof respectively, two stages of inverters 206 and 207 for latching the signal potential of the node NNDB, a delay circuit 213 which delays the signal on the node NNDB, a p-channel MOS transistor 195 which charges the node NNDB to a source potential Vccp level in accordance with an output signal of the delay circuit 213, and a NAND circuit 214 which receives the signals on the nodes NNDA and NNDB. The NAND circuit 214 outputs the address transition detection signal ATDP.

The delay circuit 213 includes an inverter 202 which receives the signal of the node NNDB, a delay capacitor 210 which delays an output signal of the inverter 202, an inverter 203 which receives the output signal of the inverter 202, an inverter 204 which receives an output signal of the inverter 203, a delay capacitor 211 which delays an output signal of the inverter 204, and an inverter 205 which receives the output signal of the inverter 204.

The inverter 205 supplies the gate of the p-channel MOS transistor 195 with a signal. The NAND circuit 214 is made to have a lower input logic threshold value than the inverters 199 and 206. The address transition detection signal generation circuits 185-1 to 185-3 receive the column address signal bits CA<9>, CA<10>, CA<11> and CA<12> respectively. The ATDP signal generation circuit 165B is identical in operation to the ATD signal generation circuit 165A.

When any of the column address signal bits CA<9> to CA<12> makes transition, the potential of the node NNDB is driven to a low level for a prescribed period. When the potential of at least one of the nodes NNDA and NNDB is pulled down to a low level, the NAND circuit 214 drives the address transition detection signal ATDP to a high level. In the ATD signal generation circuit 165A, the number of the MOS transistors 182-0 to 180-8 which are connected to the node NNDA is reduced as compared with the structure of FIG. 22A, and hence the parasitic capacitance of the node NNDA is reduced. Thus, the potential of the node NNDA is changed at a high speed, the address transition detection signal ATD can be activated at a high speed in response to the transition of at least one of the column address signal bits CA<0> to CA<9>, and the equalization instruction signal /IOEQ can be activated at a faster timing accordingly. Thus, the data read timing can be quickened, the access time is shortened, and a semiconductor memory device operating at a high speed can be implemented.

The column address signal bits CA<9> throuth CA<12> which are supplied to the ATDP signal generation circuit 165B are employed for selection of the column group, i.e., the I/O lines (global I/O lines). When the column address signal bits CA<0> to CA<9> do not make a transition, the operation of the circuit part generating the equalization instruction signal /IOEQ can be stopped by bringing the address transition detection signal ATD into an inactive state, thereby reducing power consumption.

The arrangement shown in FIG. 23A or 24 may be applied as the layout of the ATD signal generation circuit 165A and the ATDP signal generation circuit 165B shown in FIG. 28. Skews of the signals ATD and ATDP can be reduced, so that these signals ATD and ATDP can be ascertained at a high speed.

FIG. 29A illustrates the structures of the IOEQ generation circuit 6 and the PAE generation circuit 5 shown in FIG. 27. Referring to FIG. 29A, the IOEQ generation circuit 6 includes an inverter 215 which receives the address transition detection signal ATD. The equalization instruction signal /IOEQ, which is supplied by an inverted signal of the address transition detection signal ATD, is activated at a high speed in response to activation of the address transition detection signal ATD.

The PAE generation circuit 5 includes an inverter 216 which receives the address transition detection signal ATDP, a NAND circuit 220 which receives an output signal of the inverter 216 at its one input, a NAND circuit 222 which receives output signals of the inverter 216 and the NAND circuit 220, two stages of inverters 217 and 218 which receive the output of the NAND circuit 222, a NAND circuit 221 which receives output signals of the inverter 218 and the NAND circuit 220, and an inverter 219 which receives the output signal of the NAND circuit 222. An output signal of the NAND circuit 221 is supplied to another input of the NAND circuit 220. The NAND circuits 220 and 221 form a flip-flop. The operations of the PAE generation circuit 5 and the IOEQ generation circuit 6 shown in FIG. 29A are now described with reference to a waveform diagram shown in FIG. 29B.

First, operations in the case of a transition of a column address signal bit CA<0:8> are described. In this case, the address transition detection signal ATD is driven to a high level, and the equalization instruction signal /IOEQ is driven to a low level in response. After a lapse of a prescribed time (delay time provided by the NAND circuit 214) from the rise of the address transition detection signal ATD to the high level, the address transition detection signal ATDP is driven to a high level. The activation periods of the equalization indication signal /IOEQ and the address instruction detection signal ATDP are identical to that of the address transition detection signal ATD (decided by the delay circuit 212 (see FIG. 28)). When the address transition detection signal ATDP is driven to a high level, the output signal of the inverter 216 goes low, and the output signal of the NAND circuit 222 is driven to a high level. In this state, a preamplifier enable signal PAE is maintained at a low level by the inverter 219. The output signal of the NAND circuit 220 is at a high level, and the NAND circuit 221 outputs a low-level signal (the output signal of the inverter 218 is at a high level in an initial state).

When the address transition detection signal ATDP falls to a low level, the output signal of the inverter 216 as well as both inputs of the NAND circuit 222 go high, whereby the output signal of the NAND circuit 222 is driven to a low level and the preamplifier activation signal PAE is driven to a high level by the inverter 219. After a lapse of delay time provided by the inverters 217 and 218. The output signal of the inverter 218 goes low, the output signal of the NAND circuit 221 goes high, and the output signal of the NAND circuit 220 goes low in response (the signal ATDP already falls to a low level). Responsively, the output signal of the NAND circuit 222 rises to a high level, and the preamplifier activation signal PAE is driven to a low level in response. The activation period of the preamplifier activation signal PAE is decided by the delay time provided by the inverters 217 and 218.

When at least one of column address signal bits CA<9:12> makes a transition, the address transition detection signal ATD maintains a low level, and the equalization instruction signal /IOEQ maintains a high level. The address transition detection signal ATDP is activated for a prescribed period (the delay time provided by the delay circuit 213 of FIG. 28), and the preamplifier activation signal PAE is activated in response to fall of the address transition detection signal ATDP.

While 13-bit column address signals are employed in this embodiment, the number of the employed column address signal bits is properly determined depending on the storage capacity of the semiconductor memory device. Further, the I/O lines for coupling the memory cells with the preamplifiers may alternatively have no hierarchical structure of sub I/O lines/global I/O lines.

In addition, the aforementioned correspondence of the address signal bits and the array structure (the memory cell columns, the column groups and the memory cell array) is only illustrative. Address transition detection circuits may be provided for address signals employed for preamplifier selection (column group selection), i.e., I/O line selection (including both of column group selection and memory cell array selection) and for column address signals employed for memory cell column selection independently of each other.

According to the embodiment 7, as hereinabove described, the address transition detection circuits are provided for the address signal bits employed for column selection of the memory cell array and those employed for I/O line selection independently of each other, whereby the input capacities of the address transition detection circuits and signal line parasitic capacitances can be reduced, I/O line equalization signals and preamplifier enable signals can be generated at a high speed, and high-speed access is implemented.

[Other Applications]

While semiconductor memory devices inputting/outputting×1 bit data are described in the above, the bit number of the inputted/outputted data may be appropriately set at 4, 16, 32 or the like.

While DRAMs are illustrated as semiconductor memory devices, the present invention is also applicable to a SRAM (static random access memory).

According to the present invention, as hereinabove described, it is possible to implement a semiconductor memory device having high reliability which can correctly carry out a test operation at a high speed and stably operates at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array being divided into a plurality of array groups each including a plurality of memory cells;
   an internal data bus provided in correspondence to said memory cell array and in common for said plurality of array groups;
   a plurality of read means arranged in correspondence to respective ones of said plurality of array groups and coupled to said internal data bus in common, each for transmitting data of a selected memory cell of corresponding array group to said internal data bus when selected;

test control means bringing more than one of said plurality of read means into selected states in response to activation of a test mode indication signal; and discrimination means coupled to said internal data bus for discriminating coincidence/incoincidence of logics of data read from the more than one of said plurality of read means brought into selected states on said internal data bus and outputting a signal indicating the result of discrimination.

2. The semiconductor memory device in accordance with claim 1, wherein said data bus includes a pair of data lines, data output parts of said of plurality of read means are wired OR connected to said pair of data lines, and said discrimination means includes means for outputting said signal indicating said result of said discrimination in accordance with a potential on said pair of data lines.

3. The semiconductor memory device in accordance with claim 1, wherein said memory cell array is provided in plurality and the internal data bus is arranged in plurality in correspondence to said plurality of memory cells respectively, said plurality of read means are arranged in correspondence to respective array groups of said memory cell arrays, and said discrimination means includes means for detecting coincidence/incoincidence of logics of signal potentials of said plurality of said internal data buses.

4. The semiconductor memory device according to claim 1, wherein said internal data bus includes first and second data lines, and wherein each of said plurality of read means includes a preamplifier for amplifying data of a memory cell selected in a corresponding array group when selected and activated, and a driver receiving the amplified data from said preamplifier and a bus precharge instruction signal and a test mode instruction signal and responsive to an active state of said bus precharge instruction signal for driving the first data line and the second data line to a first potential level, responsive to an inactive state of said bus precharge instruction signal and an active state of said test mode instruction signal for driving said first data line to a second potential level complementary in logic to said first potential level and said second data line to the first potential level when said amplified data is logic "0", while driving said first data line to the first potential level and said second data line to the second potential level when said amplified data is logic "1", and responsive to the inactive state of said bus precharge instruction signal for driving said first data line to the second potential level when said amplified data is logic "0", while driving said second data line to the second potential level when said amplified data is logic "1".

5. The semiconductor memory device according to claim 1, wherein said internal data bus includes a pair of data lines for transmitting complementary data, and each of said plurality of read means includes means for transmitting complementary data corresponding to the data of the selected memory cell onto said pair of data lines, and wherein said discrimination means includes, determination means coupled to said pair of data lines, for determining coincidence or noncoincidence of logics of the signals on said pair of data lines, detection means coupled to said pair of data lines, for detecting that at least one of the signals on said pair of data lines reaches a predetermined potential level, and output means responsive to said detection means detecting the reach to the predetermined potential for outputting an output of said determination means as the signal indicating the result of discrimination.

6. The semiconductor memory device according to claim 3, wherein the internal data bus arranged in plurality each includes a pair of a first data line and a second data line, and each of said plurality of said read means includes means for transmitting complementary data corresponding to data of a memory cell selected in a corresponding array group onto a corresponding pair of the first and second data lines, and wherein said discrimination means includes first determination means coupled to the first data lines of respective internal data buses for determining whether logics of the signals on the first data lines of respective internal data buses coincide with each other, second determination means coupled to the second data lines of respective internal data buses, for determining whether logics of the signals on the second data lines of respective internal data buses coincide with each other, detection means coupled to respective pairs of the first and second data lines of said plurality of said internal data buses, for detecting that a signal potential of at least one of the first and second data lines reaches a predetermined potential in each respective internal data bus to generate a ready signal, third detection means coupled to the first and second determination means, for determining whether said first and second determination means both detect the coincidence of signal logics, and output means responsive to said ready signal for outputting an output signal of said third detection means as said signal indicating the result of discrimination.

7. A semiconductor memory device according to claim 1, further including;

a data write line for transmitting data to be written in a selected said memory cell of said memory cell array;

array drive means operating with a first level potential as a first operation source potential for driving said memory cell array; and data write means for receiving a supplied write data, forming internal write data and transmitting the same onto said data write line, said data write means comprising amplitude control means limiting an amplitude of said internal write data signal transmitted and onto said data write line below said first level.

8. The semiconductor memory device in accordance with claim 7, further comprising an internal potential generation circuit receiving an externally supplied source potential, generating a potential of said first level and supplying the same to said array drive means while generating a potential of a second level being different from said first level and transmitting the same as said first operation source potential of said data write means, and wherein said amplitude control means comprises power supply means for decreasing said potential of said second level below said first level and supplying the same as said first operation source potential to said data write means.

9. The semiconductor memory device according to claim 7, wherein said memory array includes an insulated gate type field effect transistor having a substrate region receiving said first level potential, and said array drive means includes a sense amplifier for amplifying data read from a selected memory cell in said memory cell array.

10. A semiconductor memory device according to claim 1, wherein each of said plurality of read means includes first amplification means amplifying and outputting data of a selected said memory cell of said memory cell array in response to an activation signal;

delay means for delaying activation of said activation signal; and second amplification means amplifying an output signal of said first amplification means and forming internal read data in response to activation of the delayed activation signal from said delay means.

11. The semiconductor memory device in accordance with claim 10, further comprising internal transmission means transmitting said data read from said selected memory cell in a complementary data form to said first amplification means, wherein said first amplification means comprises a current mirror type differential amplification circuit differentially amplifying the complementary data from said internal transmission means and outputting complementary signals, and said second amplification means comprises:

a precharge element precharging an output node outputting said internal read data to a first potential in inactivation of said activation signal, a first transistor element for holding said output node at a precharge potential in response to one of said complementary signals from said current mirror type differential amplification circuit, a second transistor element for driving said output node to a referential potential different from said first potential in response to the other one of said complementary signals, and a third transistor element being connected between said second transistor element and a source potential supply node for conducting in response to activation of said delayed activation signal.

* * * * *